(12) United States Patent
Streicher et al.

(10) Patent No.: US 8,751,551 B2
(45) Date of Patent: Jun. 10, 2014

(54) MODULAR DIGITAL SIGNAL PROCESSING CIRCUITRY WITH OPTIONALLY USABLE, DEDICATED CONNECTIONS BETWEEN MODULES OF THE CIRCUITRY

(71) Applicant: Altera Corporation, San Jose, CA (US)

(72) Inventors: Keone Streicher, San Ramon, CA (US); Martin Langhammer, Salisbury (GB); Yi-Wen Lin, Glendale, CA (US); Wai-Bor Leung, Milpitas, CA (US); David Lewis, Toronto (CA); Volker Mauer, Princes Risborough (GB); Henry Y. Lui, Millbrae, CA (US); Suleyman Sirri Demirsoy, London (GB); Hyun Yi, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/086,328

(22) Filed: Nov. 21, 2013

(65) Prior Publication Data
US 2014/0082035 A1    Mar. 20, 2014

Related U.S. Application Data

(60) Continuation of application No. 13/961,534, filed on Aug. 7, 2013, now Pat. No. 8,620,977, which is a division of application No. 12/716,878, filed on Mar. 3, 2010, now Pat. No. 8,549,055, which is a continuation-in-part of application No. 12/380,841, filed on Mar. 3, 2009.

(51) Int. Cl.
*G06F 7/52* (2006.01)
*G06F 7/38* (2006.01)

(52) U.S. Cl.
USPC ........... 708/230; 708/200; 708/203; 708/490; 708/503

(58) Field of Classification Search
None
See application file for complete search history.

(56) References Cited

U.S. PATENT DOCUMENTS

| | | | |
|---|---|---|---|
| 3,473,160 | A | 10/1969 | Wahlstrom |
| 4,156,927 | A | 5/1979 | McElroy et al. |
| 4,179,746 | A | 12/1979 | Tubbs |
| 4,212,076 | A | 7/1980 | Conners |

(Continued)

FOREIGN PATENT DOCUMENTS

| | | |
|---|---|---|
| EP | 0 158 430 | 10/1985 |
| EP | 0 380 456 | 8/1990 |

(Continued)

OTHER PUBLICATIONS

Amos, D., "PLD architectures match DSP algorithms," *Electronic Product Design*, vol. 17, No. 7, Jul. 1996, pp. 30, 32.

(Continued)

*Primary Examiner* — Scott Sun
(74) *Attorney, Agent, or Firm* — Ropes & Gray LLP; Jeffrey H. Ingerman

(57) ABSTRACT

Digital signal processing ("DSP") circuit blocks are provided that can more easily work together to perform larger (e.g., more complex and/or more arithmetically precise) DSP operations if desired. These DSP blocks may also include redundancy circuitry that facilitates stitching together multiple such blocks despite an inability to use some block (e.g., because of a circuit defect). Systolic registers may be included at various points in the DSP blocks to facilitate use of the blocks to implement systolic form, finite-impulse-response ("FIR"), digital filters.

10 Claims, 26 Drawing Sheets

(56) References Cited

U.S. PATENT DOCUMENTS

| | | |
|---|---|---|
| 4,215,406 A | 7/1980 | Gomola et al. |
| 4,215,407 A | 7/1980 | Gomola et al. |
| 4,422,155 A | 12/1983 | Amir et al. |
| 4,484,259 A | 11/1984 | Palmer et al. |
| 4,521,907 A | 6/1985 | Amir et al. |
| 4,597,053 A | 6/1986 | Chamberlin |
| 4,623,961 A | 11/1986 | Mackiewicz |
| 4,682,302 A | 7/1987 | Williams |
| 4,718,057 A | 1/1988 | Venkitakrishnan et al. |
| 4,727,508 A | 2/1988 | Williams |
| 4,736,333 A | 4/1988 | Mead et al. |
| 4,791,590 A | 12/1988 | Ku et al. |
| 4,799,004 A | 1/1989 | Mori |
| 4,823,295 A | 4/1989 | Mader |
| 4,839,847 A | 6/1989 | Laprade |
| 4,871,930 A | 10/1989 | Wong et al. |
| 4,912,345 A | 3/1990 | Steele et al. |
| 4,967,160 A | 10/1990 | Quievy et al. |
| 4,972,356 A | 11/1990 | Williams |
| 4,982,354 A | 1/1991 | Takeuchi et al. |
| 4,994,997 A | 2/1991 | Martin et al. |
| 5,122,685 A | 6/1992 | Chan et al. |
| 5,128,559 A | 7/1992 | Steele |
| 5,175,702 A | 12/1992 | Beraud et al. |
| 5,208,491 A | 5/1993 | Ebeling et al. |
| RE34,363 E | 8/1993 | Freeman |
| 5,258,668 A | 11/1993 | Cliff et al. |
| 5,267,187 A | 11/1993 | Hsieh et al. |
| 5,296,759 A | 3/1994 | Sutherland et al. |
| 5,338,983 A | 8/1994 | Agarwala |
| 5,349,250 A | 9/1994 | New |
| 5,357,152 A | 10/1994 | Jennings, III et al. |
| 5,371,422 A | 12/1994 | Patel et al. |
| 5,381,357 A | 1/1995 | Wedgwood et al. |
| 5,404,324 A | 4/1995 | Colon-Bonet |
| 5,424,589 A | 6/1995 | Dobbelaere et al. |
| 5,442,576 A | 8/1995 | Gergen et al. |
| 5,442,799 A | 8/1995 | Murakami et al. |
| 5,446,651 A | 8/1995 | Moyse et al. |
| 5,451,948 A | 9/1995 | Jekel |
| 5,452,231 A | 9/1995 | Butts et al. |
| 5,452,375 A | 9/1995 | Rousseau et al. |
| 5,457,644 A | 10/1995 | McCollum |
| 5,465,226 A | 11/1995 | Goto |
| 5,465,375 A | 11/1995 | Thepaut et al. |
| 5,483,178 A | 1/1996 | Costello et al. |
| 5,497,498 A | 3/1996 | Taylor |
| 5,500,828 A | 3/1996 | Doddington et al. |
| 5,517,436 A | 5/1996 | Andreas et al. |
| 5,523,963 A | 6/1996 | Hsieh et al. |
| 5,528,550 A | 6/1996 | Pawate et al. |
| 5,537,601 A | 7/1996 | Kimura et al. |
| 5,546,018 A | 8/1996 | New et al. |
| 5,550,993 A | 8/1996 | Ehlig et al. |
| 5,559,450 A | 9/1996 | Ngai et al. |
| 5,563,526 A | 10/1996 | Hastings et al. |
| 5,563,819 A | 10/1996 | Nelson |
| 5,570,039 A | 10/1996 | Oswald et al. |
| 5,570,040 A | 10/1996 | Lytle et al. |
| 5,572,148 A | 11/1996 | Lytle et al. |
| 5,581,501 A | 12/1996 | Sansbury et al. |
| 5,590,350 A | 12/1996 | Guttag et al. |
| 5,594,366 A | 1/1997 | Khong et al. |
| 5,594,912 A | 1/1997 | Brueckmann et al. |
| 5,596,763 A | 1/1997 | Guttag et al. |
| 5,606,266 A | 2/1997 | Pedersen |
| 5,617,058 A | 4/1997 | Adrian et al. |
| 5,633,601 A | 5/1997 | Nagaraj |
| 5,636,150 A | 6/1997 | Okamoto |
| 5,636,368 A | 6/1997 | Harrison et al. |
| 5,640,578 A | 6/1997 | Balmer et al. |
| 5,644,522 A | 7/1997 | Moyse et al. |
| 5,646,545 A | 7/1997 | Trimberger et al. |
| 5,648,732 A | 7/1997 | Duncan |
| 5,652,903 A | 7/1997 | Weng et al. |
| 5,655,069 A | 8/1997 | Ogawara et al. |
| 5,664,192 A | 9/1997 | Lloyd et al. |
| 5,689,195 A | 11/1997 | Cliff et al. |
| 5,696,708 A | 12/1997 | Leung |
| 5,729,495 A | 3/1998 | Madurawe |
| 5,740,404 A | 4/1998 | Baji |
| 5,744,980 A | 4/1998 | McGowan et al. |
| 5,744,991 A | 4/1998 | Jefferson et al. |
| 5,751,622 A | 5/1998 | Purcell |
| 5,754,459 A | 5/1998 | Telikepalli |
| 5,761,483 A | 6/1998 | Trimberger |
| 5,764,555 A | 6/1998 | McPherson et al. |
| 5,765,013 A | 6/1998 | Jang et al. |
| 5,768,613 A | 6/1998 | Asghar |
| 5,777,912 A | 7/1998 | Leung et al. |
| 5,784,636 A | 7/1998 | Rupp |
| 5,790,446 A | 8/1998 | Yu et al. |
| 5,794,067 A | 8/1998 | Kadowaki |
| 5,801,546 A | 9/1998 | Pierce et al. |
| 5,805,477 A | 9/1998 | Perner |
| 5,805,913 A | 9/1998 | Guttag et al. |
| 5,812,479 A | 9/1998 | Cliff et al. |
| 5,812,562 A | 9/1998 | Baeg |
| 5,815,422 A | 9/1998 | Dockser |
| 5,821,776 A | 10/1998 | McGowan |
| 5,825,202 A | 10/1998 | Tavana et al. |
| 5,838,165 A | 11/1998 | Chatter |
| 5,841,684 A | 11/1998 | Dockser |
| 5,847,579 A | 12/1998 | Trimberger |
| 5,859,878 A | 1/1999 | Phillips et al. |
| 5,869,979 A | 2/1999 | Bocchino |
| 5,872,380 A | 2/1999 | Rostoker et al. |
| 5,874,834 A | 2/1999 | New |
| 5,878,250 A | 3/1999 | LeBlanc |
| 5,880,981 A | 3/1999 | Kojima et al. |
| 5,883,525 A | 3/1999 | Tavana et al. |
| 5,892,962 A | 4/1999 | Cloutier |
| 5,894,228 A | 4/1999 | Reddy et al. |
| 5,898,602 A | 4/1999 | Rothman et al. |
| 5,914,616 A | 6/1999 | Young et al. |
| 5,931,898 A | 8/1999 | Khoury |
| 5,942,914 A | 8/1999 | Reddy et al. |
| 5,944,774 A | 8/1999 | Dent |
| 5,949,710 A | 9/1999 | Pass et al. |
| 5,951,673 A | 9/1999 | Miyata |
| 5,956,265 A | 9/1999 | Lewis |
| 5,959,871 A | 9/1999 | Pierzchala et al. |
| 5,960,193 A | 9/1999 | Guttag et al. |
| 5,961,635 A | 10/1999 | Guttag et al. |
| 5,963,048 A | 10/1999 | Harrison et al. |
| 5,963,050 A | 10/1999 | Young et al. |
| 5,968,196 A | 10/1999 | Ramamurthy et al. |
| 5,970,254 A | 10/1999 | Cooke et al. |
| 5,978,260 A | 11/1999 | Trimberger et al. |
| 5,982,195 A | 11/1999 | Cliff et al. |
| 5,986,465 A | 11/1999 | Mendel |
| 5,991,788 A | 11/1999 | Mintzer |
| 5,991,898 A | 11/1999 | Rajski et al. |
| 5,995,748 A | 11/1999 | Guttag et al. |
| 5,999,015 A | 12/1999 | Cliff et al. |
| 5,999,990 A | 12/1999 | Sharrit et al. |
| 6,005,806 A | 12/1999 | Madurawe et al. |
| 6,006,321 A | 12/1999 | Abbott |
| 6,009,451 A | 12/1999 | Burns |
| 6,020,759 A | 2/2000 | Heile |
| 6,021,423 A | 2/2000 | Nag et al. |
| 6,029,187 A | 2/2000 | Verbauwhede |
| 6,031,763 A | 2/2000 | Sansbury |
| 6,041,340 A | 3/2000 | Mintzer |
| 6,052,327 A | 4/2000 | Reddy et al. |
| 6,052,755 A | 4/2000 | Terrill et al. |
| 6,064,614 A | 5/2000 | Khoury |
| 6,065,131 A | 5/2000 | Andrews et al. |
| 6,066,960 A | 5/2000 | Pedersen |
| 6,069,487 A | 5/2000 | Lane et al. |
| 6,072,994 A | 6/2000 | Phillips et al. |
| 6,073,154 A | 6/2000 | Dick |

(56) References Cited

U.S. PATENT DOCUMENTS

| | | |
|---|---|---|
| 6,075,381 A | 6/2000 | LaBerge |
| 6,084,429 A | 7/2000 | Trimberger |
| 6,085,317 A | 7/2000 | Smith |
| 6,091,261 A | 7/2000 | DeLange |
| 6,091,765 A | 7/2000 | Pietzold, III et al. |
| 6,094,726 A | 7/2000 | Gonion et al. |
| 6,097,988 A | 8/2000 | Tobias |
| 6,098,163 A | 8/2000 | Guttag et al. |
| 6,107,820 A | 8/2000 | Jefferson et al. |
| 6,107,821 A | 8/2000 | Kelem et al. |
| 6,107,824 A | 8/2000 | Reddy et al. |
| 6,130,554 A | 10/2000 | Kolze et al. |
| 6,140,839 A | 10/2000 | Kaviani et al. |
| 6,154,049 A | 11/2000 | New |
| 6,157,210 A | 12/2000 | Zaveri et al. |
| 6,163,788 A | 12/2000 | Chen et al. |
| 6,167,415 A | 12/2000 | Fischer et al. |
| 6,175,849 B1 | 1/2001 | Smith |
| 6,215,326 B1 | 4/2001 | Jefferson et al. |
| 6,226,735 B1 | 5/2001 | Mirsky |
| 6,242,947 B1 | 6/2001 | Trimberger |
| 6,243,729 B1 | 6/2001 | Staszewski |
| 6,246,258 B1 | 6/2001 | Lesea |
| 6,278,291 B1 | 8/2001 | McClintock et al. |
| 6,279,021 B1 | 8/2001 | Takano et al. |
| 6,286,024 B1 | 9/2001 | Yano et al. |
| 6,298,366 B1 | 10/2001 | Gatherer et al. |
| 6,314,442 B1 | 11/2001 | Suzuki |
| 6,314,551 B1 | 11/2001 | Borland |
| 6,321,246 B1 | 11/2001 | Page et al. |
| 6,323,680 B1 | 11/2001 | Pedersen et al. |
| 6,344,755 B1 | 2/2002 | Reddy et al. |
| 6,351,142 B1 | 2/2002 | Abbott |
| 6,359,468 B1 | 3/2002 | Park et al. |
| 6,362,650 B1 | 3/2002 | New et al. |
| 6,366,944 B1 | 4/2002 | Hossain et al. |
| 6,367,003 B1 | 4/2002 | Davis |
| 6,407,576 B1 | 6/2002 | Ngai et al. |
| 6,407,694 B1 | 6/2002 | Cox et al. |
| 6,438,570 B1 | 8/2002 | Miller |
| 6,448,808 B2 | 9/2002 | Young et al. |
| 6,453,382 B1 | 9/2002 | Heile |
| 6,467,017 B1 | 10/2002 | Ngai et al. |
| 6,480,980 B2 | 11/2002 | Koe |
| 6,483,343 B1 | 11/2002 | Faith et al. |
| 6,531,888 B2 | 3/2003 | Abbott |
| 6,538,470 B1 | 3/2003 | Langhammer et al. |
| 6,542,000 B1 | 4/2003 | Black et al. |
| 6,556,044 B2 | 4/2003 | Langhammer et al. |
| 6,557,092 B1 | 4/2003 | Callen |
| 6,571,268 B1 | 5/2003 | Giacalone et al. |
| 6,573,749 B2 | 6/2003 | New et al. |
| 6,574,762 B1 | 6/2003 | Karimi et al. |
| 6,591,283 B1 | 7/2003 | Conway et al. |
| 6,591,357 B2 | 7/2003 | Mirsky |
| 6,600,788 B1 | 7/2003 | Dick et al. |
| 6,628,140 B2 | 9/2003 | Langhammer et al. |
| 6,700,581 B2 | 3/2004 | Baldwin et al. |
| 6,725,441 B1 | 4/2004 | Keller et al. |
| 6,728,901 B1 | 4/2004 | Rajski et al. |
| 6,731,133 B1 | 5/2004 | Feng et al. |
| 6,744,278 B1 | 6/2004 | Liu et al. |
| 6,745,254 B2 | 6/2004 | Boggs et al. |
| 6,774,669 B1 | 8/2004 | Liu et al. |
| 6,781,408 B1 | 8/2004 | Langhammer |
| 6,781,410 B2 | 8/2004 | Pani et al. |
| 6,788,104 B2 | 9/2004 | Singh et al. |
| 6,836,839 B2 | 12/2004 | Master et al. |
| 6,874,079 B2 | 3/2005 | Hogenauer |
| 6,904,471 B2 | 6/2005 | Boggs et al. |
| 6,924,663 B2 | 8/2005 | Masui et al. |
| 6,971,083 B1 | 11/2005 | Farrugia et al. |
| 7,047,271 B2 | 5/2006 | Aldrich et al. |
| 7,061,268 B1 | 6/2006 | Lee et al. |
| 7,119,576 B1 | 10/2006 | Langhammer et al. |
| 7,180,324 B2 | 2/2007 | Chan et al. |
| 7,230,451 B1 | 6/2007 | Langhammer |
| 7,269,617 B1 | 9/2007 | Esposito et al. |
| 7,287,051 B1 | 10/2007 | Langhammer |
| 7,346,644 B1 | 3/2008 | Langhammer |
| 7,368,942 B1 | 5/2008 | Hutton et al. |
| 7,471,643 B2 | 12/2008 | Stansfield |
| 7,698,358 B1 | 4/2010 | Langhammer et al. |
| 7,746,112 B1 | 6/2010 | Gaide et al. |
| 7,836,117 B1 | 11/2010 | Langhammer et al. |
| 8,458,243 B1 | 6/2013 | Demirsoy et al. |
| 2001/0029515 A1 | 10/2001 | Mirsky |
| 2002/0089348 A1 | 7/2002 | Langhammer |
| 2003/0041082 A1* | 2/2003 | Dibrino ................ 708/501 |
| 2003/0072185 A1 | 4/2003 | Lane et al. |
| 2003/0088757 A1 | 5/2003 | Lindner et al. |
| 2004/0064770 A1 | 4/2004 | Xin |
| 2004/0083412 A1 | 4/2004 | Corbin et al. |
| 2004/0178818 A1 | 9/2004 | Crotty et al. |
| 2004/0193981 A1 | 9/2004 | Clark et al. |
| 2005/0144215 A1 | 6/2005 | Simkins et al. |
| 2005/0166038 A1 | 7/2005 | Wang et al. |
| 2005/0187999 A1 | 8/2005 | Zheng et al. |
| 2006/0075012 A1 | 4/2006 | Minz et al. |
| 2006/0158219 A1 | 7/2006 | Sunkavalli et al. |
| 2007/0143577 A1 | 6/2007 | Smith |
| 2007/0185951 A1 | 8/2007 | Lee et al. |
| 2007/0185952 A1 | 8/2007 | Langhammer et al. |
| 2008/0133627 A1 | 6/2008 | Langhammer et al. |
| 2009/0228538 A1* | 9/2009 | Nagano et al. ............ 708/209 |
| 2009/0259824 A1 | 10/2009 | Smith et al. |
| 2010/0097099 A1 | 4/2010 | Minz et al. |
| 2010/0228806 A1 | 9/2010 | Streicher et al. |
| 2010/0306292 A1* | 12/2010 | Catherwood et al. ......... 708/209 |
| 2012/0290819 A1 | 11/2012 | Langhammer |
| 2013/0135008 A1 | 5/2013 | Zhang et al. |

FOREIGN PATENT DOCUMENTS

| | | |
|---|---|---|
| EP | 0 411 491 | 2/1991 |
| EP | 0 461 798 | 12/1991 |
| EP | 0 498 066 | 8/1992 |
| EP | 0 555 092 | 8/1993 |
| EP | 0 606 653 | 7/1994 |
| EP | 0 657 803 | 6/1995 |
| EP | 0 660 227 | 6/1995 |
| EP | 0 668 659 | 8/1995 |
| EP | 0 905 906 | 3/1999 |
| EP | 0 909 028 | 4/1999 |
| EP | 0 927 393 | 7/1999 |
| EP | 0 992 885 | 4/2000 |
| EP | 1 031 934 | 8/2000 |
| EP | 1 058 185 | 12/2000 |
| EP | 1 220 108 | 7/2002 |
| EP | 1 603 241 | 12/2005 |
| GB | 2 283 602 | 5/1995 |
| GB | 2 286 737 | 8/1995 |
| GB | 2 318 198 | 4/1998 |
| JP | 61-237133 | 10/1986 |
| JP | 7-135447 | 5/1995 |
| JP | 11-296345 | 10/1999 |
| JP | 2000-347834 | 12/2000 |
| WO | WO92/00561 | 1/1992 |
| WO | WO95/27243 | 10/1995 |
| WO | WO96/28774 | 9/1996 |
| WO | WO97/08606 | 3/1997 |
| WO | WO98/12629 | 3/1998 |
| WO | WO98/32071 | 7/1998 |
| WO | WO98/38741 | 9/1998 |
| WO | WO99/22292 | 5/1999 |
| WO | WO99/31574 | 6/1999 |
| WO | WO99/56394 | 11/1999 |
| WO | WO00/51239 | 8/2000 |
| WO | WO00/52824 | 9/2000 |
| WO | WO01/13562 | 2/2001 |

(56) References Cited

FOREIGN PATENT DOCUMENTS

| | | |
|---|---|---|
| WO | WO2005/066832 | 7/2005 |
| WO | WO2005/101190 | 10/2005 |
| WO | WO2006/076276 | 7/2006 |

OTHER PUBLICATIONS

Analog Devices, Inc., The Applications Engineering Staff of Analog Devices, DSP Division, *Digital Signal Processing Applications Using the ADSP-2100 Family* (edited by Amy Mar), 1990, pp. 141-192).
Andrejas, J., et al., "Reusable DSP functions in FPGAs," *Field-Programmable Logic and Applications. Roadmap to Reconfigurable Computing. 10th International Conference, FPL 2000. Proceedings (Lecture Notes in Computer Science vol. 1896)*, Aug. 27-30, 2000, pp. 456-461.
Aoki, T., "Signed-weight arithmetic and its application to a field-programmable digital filter architecture," *IEICE Transactions on Electronics*, 1999, vol. E82C, No. 9, Sep. 1999, pp. 1687-1698.
Ashour, M.A., et al., "An FPGA implementation guide for some different types of serial-parallel multipier-structures," *Microelectronics Journal*, vol. 31, No. 3, 2000, pp. 161-168.
Berg. B.L., et al."Designing Power and Area Efficient Multistage FIR Decimators with Economical Low Order Filters," *ChipCenter Technical Note*, Dec. 2001.
Bursky, D., "Programmable Logic Challenges Traditional ASIC SoC Designs", *Electronic Design*, Apr. 15, 2002.
Chhabra, A. et al., Texas Instruments Inc., "A Block Floating Point Implementation on the TMS320C54x DSP", Application Report SPRA610, Dec. 1999, pp. 1-10.
Colet, p., "When DSPs and FPGAs meet: Optimizing image processing architectures," *Advanced Imaging*, vol. 12, No. 9, Sep. 1997, pp. 14, 16, 18.
Crookes, D., et al., "Design and implementation of a high level programming environment for FPGA-based image processing," *IEE Proceedings-Vision, Image and Signal Processing*, vol. 147, No. 4, Aug. 2000, pp. 377-384.
Debowski, L., et al., "A new flexible architecture of digital control systems based on DSP and complex CPLD technology for power conversion applications," *PCIM 2000: Europe Official Proceedings of the Thiry-Seventh International Intelligent Motion Conference*, Jun. 6-8, 2000, pp. 281-286.
Dick, C., et al., "Configurable logic for digital communications: some signal processing perspectives," *IEEE Communications Magazine*, vol. 37, No. 8, Aug. 1999, pp. 107-111.
Do, T.-T., et al., "A flexible implementation of high-performance FIR filters on Xilinx FPGAs," *Field-Programmable Logic and Applications: From FPGAs to Computing Paradigm. 8th International Workshop, FPL '98. Proceedings*, Hartenstein, R.W., et al., eds., Aug. 31-Sep. 3, 1998, pp. 441-445.
"DSP Blocks in Arria GX Devices," Arria GX Device Handbook, vol. 2, pp. 10-1 through 10-32, Altera Corporation, San Jose, CA, May 2008.
"DSP Blocks in Stratix & Stratix GX Devices," Stratix Device Handbook, vol. 2, pp. 6-1 through 6-28, Altera Corporation, San Jose, CA, Jul. 2005.
"DSP Blocks in Stratix II and Stratix II GX Devices," Stratix II Device Handbook, vol. 2, pp. 6-1 through 6-34, Altera Corporation, San Jose, CA, Jan. 2008.
"DSP Blocks in Stratix III Devices," Stratix III Device Handbook, vol. 1, pp. 5-1 through 5-50, Altera Corporation, San Jose, CA, Oct. 2007.
"DSP Blocks in Stratix III Devices," Stratix III Device Handbook, vol. 1, pp. 5-1 through 5-40, Altera Corporation, San Jose, CA, May 2009.
"DSP Blocks in Stratix IV Devices," Stratix IV Device Handbook, vol. 1, pp. 4-1 through 4-44, Altera Corporation, San Jose, CA, May 2008.
"DSP Blocks in Stratix IV Devices," Stratix IV Device Handbook, vol. 1, pp. 4-1 through 4-34, Altera Corporation, San Jose, CA, Nov. 2008.
"DSP Blocks in Stratix IV Devices," Stratix IV Device Handbook, vol. 1, pp. 4-1 through 4-36, Altera Corporation, San Jose, CA, Nov. 2009.
"Embedded Multipliers in Cyclone III Devices," Cyclone III Device Handbook, vol. 1, pp. 5-1 through 5-8, Altera Corporation, San Jose, CA, Jul. 2007.
"Embedded Multipliers in Cyclone III Devices," Cyclone III Device Handbook, vol. 1, pp. 4-1 through 4-8, Altera Corporation, San Jose, CA, Jul. 2009.
Gaffer, A.A., et al., "Floating-Point Bitwidth Analysis via Automatic Differentiation," *IEEE Conference on Field Programmable Technology*, Hong Kong, Dec. 2002.
Guccione, S.A., "Run-time Reconfiguration at Xilinx," *Parallel and distributed processing: 16 IPDPS 2000 workshops*, Rolim, J., ed., May 1-5, 2000, p. 873.
Hauck, S., "The Future of Reconfigurable Systems," *Keynote Address, 5th Canadian Conference on Field Programmable Devices*, Jun. 1998, http:--www.ee.washington.edu-people-faculty-hauck-publications-ReconfigFuture.PDF.
Heysters, P.M., et al., "Mapping of DSP algorithms on field programmable function arrays," *Field-Programmable Logic and Applications. Roadmap to Reconfigurable Computing. 10th International Conference, FPL 2000. Proceedings (Lecture Notes in Computer Science vol. 1896)*, Aug. 27-30, 2000, pp. 400-411.
Huang, J., et al., "Simulated Performance of 1000BASE-T Receiver with Different Analog Front End Designs," *Proceedings of the 35th Asilomar Conference on Signals, Systems, and Computers*, Nov. 4-7, 2001.
Lattice Semiconductor Corp, *ORCA® FPGA Express™ Interface Manual: ispLEVER® Version 3.0*, 2002.
Lucent Technologies, Microelectronics Group,"Implementing and Optimizing Multipliers in ORCA™ FPGAs,", Application Note. AP97-008FGPA, Feb. 1997.
"Implementing Multipliers in FLEX 10K EABs", *Altera*, Mar. 1996.
"Implementing Logic with the Embedded Array in FLEX 10K Devices", *Altera*, May 2001, ver. 2.1.
Jinghua Li, "Design a pocket multi-bit multiplier in FPGA,"*1996 2nd International Conference on ASIC Proceedings* (IEEE Cat. No. 96TH8140), Oct. 21-24, 1996, pp. 275-279.
Jones, G., "Field-programmable digital signal conditioning " *Electronic Product Design*, vol. 21, No. 6, Jun. 2000, pp. C36-C38.
Kiefer, R., et al., "Performance comparison of software-FPGA hardware partitions for a DSP application," *14th Australian Microelectronics Conference. Microelectronics: Technology Today for the Future, MICRO '97 Proceedings*, Sep. 28-Oct. 1, 1997, pp. 88-93.
Kramberger, I., "DSP acceleration using a reconfigurable FPGA," *ISIE 'Proceedings of the IEEE International Symposium on Industrial Electronics* (Cat. No. 99TH8465), vol. 3, Jul. 12-16, 1999, pp. 1522-1525.
Langhammer, M., "How to implement DSP in programmable logic," *Elettronica Oggi*, No. 266, Dec. 1998, pp. 113-115.
Langhammer, M., "Implementing a DSP in Programmable Logic," *Online EE Times*, May 1998, http:--www.eetimes.com-editorial-1998-coverstory9805.html.
Lazaravich, B.V., "Function block oriented field programmable logic arrays," *Motorola, Inc. Technical Developments*, vol. 18, Mar. 1993, pp. 10-11.
Lund, D., et al., "A new development system for reconfigurable digital signal processing," First International Conference on 3G Mobile Communication Technologies (Conf. Publ. No. 471), Mar. 27-29, 2000, pp. 306-310.
Miller, N.L., et al., "Reconfigurable integrated circuit for high performance computer arithmetic," *Proceedings of the 1998 IEE Colloquium on Evolvable Hardware Systems (Digest)*, No. 233, 1998, pp. 2-1-2-4.
Mintzer, L., "Xilinx FPGA as an FFT processor," *Electronic Engineering*, vol. 69, No. 845, May 1997, pp. 81, 82, 84.

(56) References Cited

OTHER PUBLICATIONS

Faura et al., "A Novel Mixed Signal Programmable Device With On-Chip Microprocessor," Custom Integrated Circuits Conference, 1997. Proceedings of the IEEE 1997 Santa Clara, CA, USA, May 5, 1997, pp. 103-106.

Nozal, L., et al., "A new vision system: programmable logic devices and digital signal processor architecture (PLD+DSP)," *Proceedings IECON '91. 1991 International Conference on Industrial Electronics, Control and Instrumentation* (Cat. No. 91CH2976-9), vol. 3, Oct. 28-Nov. 1, 1991, pp. 2014-2018.

Papenfuss, J.R, et al., "Implementation of a real-time, frequency selective, RF channel simulator using a hybrid DSP-FPGA architecture," *RAWCON 2000: 2000 IEEE Radio and Wireless Conference* (Cat. No. 00EX404), Sep. 10-13, 2000, pp. 135-138.

Parhami, B., "Configurable arithmetic arrays with data-driven control," *34th Asilomar Conference on Signals, Systems and Computers*, vol. 1, 2000, pp. 88-93.

"The QuickDSP Design Guide", Quicklogic, Aug. 2001, revision B.

"QuickDSP™ Family Data Sheet", *Quicklogic*, Aug. 7, 2001, revision B.

Rangasayee, K., "Complex PLDs let you produce efficient arithmetic designs," *EDN (European Edition)*, vol. 41, No. 13, Jun. 20, 1996, pp. 109, 110, 112, 114, 116.

Rosado, A., et al., "A high-speed multiplier coprocessor unit based on FPGA," *Journal of Electrical Engineering*, vol. 48, No. 11-12, 1997, pp. 298-302.

Santillan-Q., G.F., et al., "Real-time integer convolution implemented using systolic arrays and a digit-serial architecture in complex programmable logic devices," *Proceedings of the Third International Workshop on Design of Mixed-Mode Integrated Circuits and Applications* (Cat. No. 99EX303), Jul. 26-28, 1999, pp. 147-150.

Stratix III Device Handbook, vol. 1, pp. 5-22 through 5-23, Altera Corporation, San Jose, CA, Nov. 2006.

Texas Instruments Inc., "TMS320C54x DSP Reference Set, vol. 1: CPU and Peripherals", Literature No. SPRU131F, Apr. 1999, pp. 2-1 through 2-16 and 4-1 through 4-29.

Tisserand, A., et al., "An on-line arithmetic based FPGA for low power custom computing," *Field Programmable Logic and Applications, 9th International Workshop, FPL'99, Proceedings (Lectures Notes in Computer Science* vol. 1673), Lysaght, P., et al., eds., Aug. 30-Sep. 1, 1999, pp. 264-273.

Tralka, C., "Symbiosis of DSP and PLD," *Elektronik*, vol. 49, No. 14, Jul. 11, 2000, pp. 84-96.

Valls, J., et al., "A Study About FPGA-Based Digital Filters," *Signal Processing Systems*, 1998, SIPS 98, 1998 IEEE Workshop, Oct. 10, 1998, pp. 192-201.

"Virtex-II 1.5V Field-Programmable Gate Arrays", *Xilinx*, Jan. 25, 2001, module 2 of 4.

"Virtex-II 1.5V Field-Programmable Gate Arrays", *Xilinx*, Apr. 2, 2001, module 1 of 4.

"Virtex-II 1.5V Field-Programmable Gate Arrays", *Xilinx*, Apr. 2, 2001, module 2 of 4.

"Virtex-5 XtremeDSP Design Considerations," User Guide, UG193 (v1.3), pp. 71-72, Xilinx Corporation, Jul. 28, 2006.

Walters, A.L., "A Scaleable FIR Filter Implementation Using 32-bit Floating-Point Complex Arithmetic on, a FPGA Based Custom Computing Platform," Allison L. Walters, Thesis Submitted to the Faculty of Virginia Polytechnic Institute and State University, Jan. 30, 1998.

Weisstein, E.W., "Karatsuba Multiplication " *MathWorld—A Wolfram Web Resource* (Dec. 9, 2007), accessed Dec. 11, 2007 at http:--mathworld.wolfram.com-KaratsubaMultiplication.html.

Wenzel, L., "Field programmable gate arrays (FPGAs) to replace digital signal processor integrated circuits," *Elektronik*, vol. 49, No. 5, Mar. 7, 2000, pp. 78-86.

"Xilinx Unveils New FPGA Architecture to Enable High-Performance, 10 Million System Gate Designs", *Xilinx*, Jun. 22, 2000.

"Xilinx Announces DSP Algorithms, Tools and Features for Virtex-II Architecture", *Xilinx*, Nov. 21, 2000.

Xilinx Inc., "Virtex-II 1.5V Field-Programmable Gate Arrays", Advance Product Specification, DS031-2 (v1.9), Nov. 29, 2001, Module 2 of 4, pp. 1-39.

Xilinx Inc., "Using Embedded Multipliers", Virtex-II Platform FPGA Handbook, UG002 (v1.3), Dec. 3, 2001, pp. 251-257.

Xilinx, Inc., "A 1D Systolic FIR," copyright 1994-2002, downloaded from http:--www.iro.umontreal.ca-~aboulham-F6221-Xilinx%20A%201D%20systolic%20FIR.htm.

Xilinx, Inc., "The Future of FPGA's," White Paper, available Nov. 14, 2005 for download from http:--www.xilinx.com-prs_rls,5yrwhite.htm.

"XtremeDSP for Spartan-3A DSP," User Guide, UG431 (v1.0), pp. 29-30, Xilinx Corporation, Apr. 2, 2007.

"XtremeDSP for Virtex-4 FPGAs," User Guide, UG073 (v2.4), pp. 35-36, Xilinx Corporation, Jan. 8, 2007.

\* cited by examiner

LINE 1: 27 | NULL | X2 | X1

LINE 2: 18 | y2 | y1

LINE 3: 36 | (NULL, X2, X1) * y1

LINE 4: 27 | (X2, X1) * y2

LINE 5: 36 | RESULT [35:0]

NOTE THAT "NULL" MAY BE SIGN-EXTENSION DATA.

FIG. 20

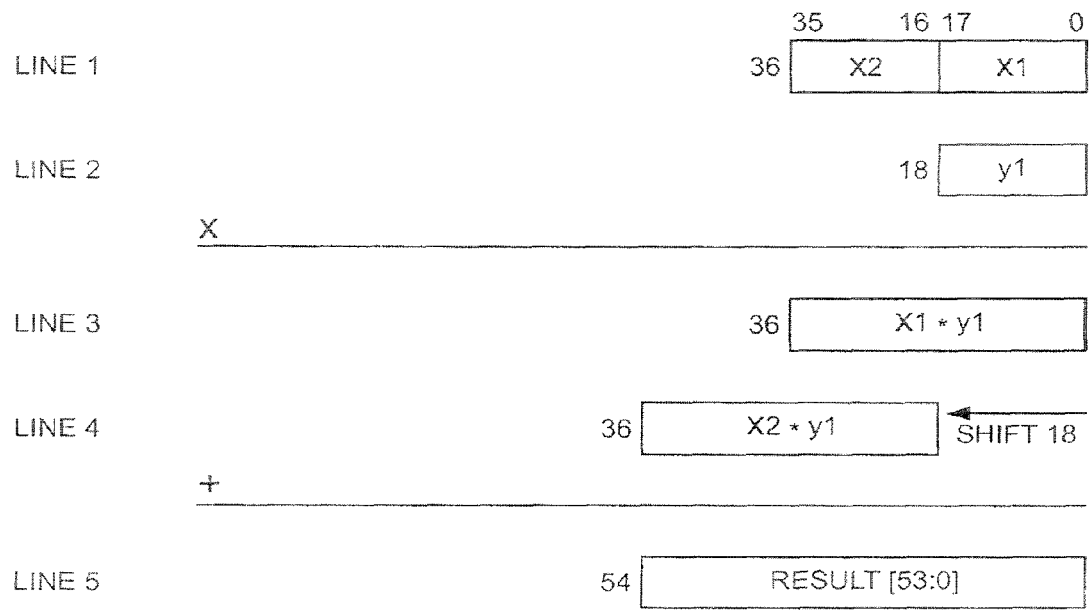
FIG. 22
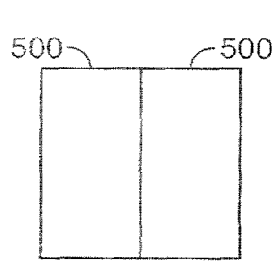
FIG. 23
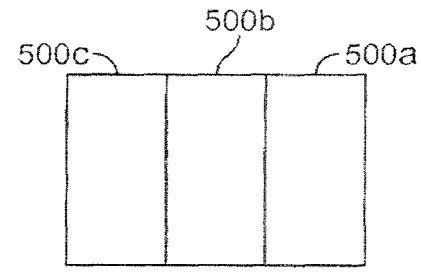
FIG. 24
$$y[n] = \sum_{i=1}^{k} c[i] \, x[n-i-1]$$
FIG. 25
(Prior Art)

MODULAR DIGITAL SIGNAL PROCESSING CIRCUITRY WITH OPTIONALLY USABLE, DEDICATED CONNECTIONS BETWEEN MODULES OF THE CIRCUITRY

CROSS REFERENCE TO RELATED APPLICATIONS

This is a continuation of commonly-assigned U.S. patent application Ser. No. 13/961,534, filed Aug. 7, 2013, now U.S. Pat. No. 8,620,977, which is division of commonly-assigned U.S. patent application Ser. No. 12/716,878, now U.S. Pat. No. 8,549,055, which is a continuation-in-part of commonly-assigned U.S. patent application Ser. No. 12/380,841, filed Mar. 3, 2009, each of which is hereby incorporated by reference herein in its respective entirety.

BACKGROUND OF THE INVENTION

This invention relates to digital signal processing ("DSP") circuitry, and more particularly to arrays of DSP circuit modules or blocks that can optionally work together to perform DSP operations of greater complexity and/or greater mathematical or arithmetic precision, and that when thus needed to work together, can accommodate the possibility that a circuit defect may make a DSP block unusable.

Various circumstances may call for an integrated circuit to be fabricated with multiple instances of blocks or modules of DSP circuitry. An example of such an integrated circuit is a programmable logic device ("PLD") or a field-programmable gate array ("FPGA"). Such a device may have a plurality of rows of various kinds of circuitry, such as relatively general-purpose programmable logic. Each such row may also include a block of DSP circuitry (i.e., circuitry that is hard-wired to at least some degree to perform a particular DSP function or a particular set of DSP functions). It can be desirable in such a situation to size the DSP blocks so that they fit within the (row) boundaries of the other circuitry in the row. This may mean that a DSP block is too small, by itself, to perform some DSP functions that it may be desired for the integrated circuit to perform. In such cases it would be desirable to facilitate optional "stitching together" of multiple DSP blocks in various ways so that larger DSP functions can be efficiently performed in two or more DSP blocks. However, a countervailing concern may be that if any portion of the circuitry associated with DSP blocks that need to be stitched together is not usable (e.g., because of a manufacturing defect in the integrated circuit), that can make it much more difficult or impossible to stitch together those DSP blocks. This may greatly increase the chances that a partly defective integrated circuit cannot be used at all.

SUMMARY OF THE INVENTION

In accordance with certain possible aspects of the present invention, DSP circuit blocks are provided that can more easily work together to perform larger (e.g., more complex and/or more arithmetically precise) DSP operations if desired. For example, such DSP blocks may include routing circuitry for optionally or selectively routing signals to other DSP blocks on either side of each block.

In accordance with other possible aspects of the invention, the inter-DSP-block routing circuitry may also include redundancy capability that enables an outbound signal to go to either of two other DSP blocks to one side of each DSP block, and that enables an inbound signal to come from either of two DSP blocks to one side of each DSP block. If some DSP block that it is desired to stitch to another DSP block cannot be used (e.g., because of a circuit defect), this redundancy capability allows the stitching together of DSP blocks to take place by effectively skipping over the defective DSP block.

In accordance with still other possible features of the disclosure, a DSP circuit block may include two multiplier circuits ("multipliers"). These multipliers may operate independently or at least partly independently of one another in various ways. Alternatively, these multipliers may operate together in various ways. One of these multipliers may have some optionally usable extended capabilities that can facilitate using the two multipliers together to perform one multiplication that is significantly larger than the base multiplication performable by either multiplier alone.

In accordance with yet other possible features of the disclosure, a DSP block may include systolic registers at various points in the circuitry to help the DSP block perform functions of a systolic form, finite-impulse-response ("FIR"), digital filter.

Further features of the invention, its nature and various advantages, will be more apparent from the accompanying drawings and the following detailed description.

BRIEF DESCRIPTION OF THE DRAWINGS

FIG. 17 shows configuration of the circuitry to perform a DSP operation like that shown in FIG. 18.

FIG. 19 shows configuration of the circuitry to perform a DSP operation like that shown in FIG. 20.

FIG. 20 is a simplified diagram showing certain aspects of performance of another DSP operation in accordance with certain possible aspects of the disclosure.

FIG. 22 is a simplified diagram illustrating certain aspects of yet another DSP operation in accordance with certain possible aspects of the disclosure.

FIG. 23 is a simplified block diagram of an illustrative embodiment of two instances of circuitry like that shown in FIG. 11 on an integrated circuit in accordance with certain possible aspects of the disclosure.

FIG. 24 is similar to FIG. 23, but for three instances of FIG. 11 type circuitry on an integrated circuit in accordance with the disclosure.

FIG. 25 shows a known equation for a known type of digital filter function.

DETAILED DESCRIPTION

Figure 1:
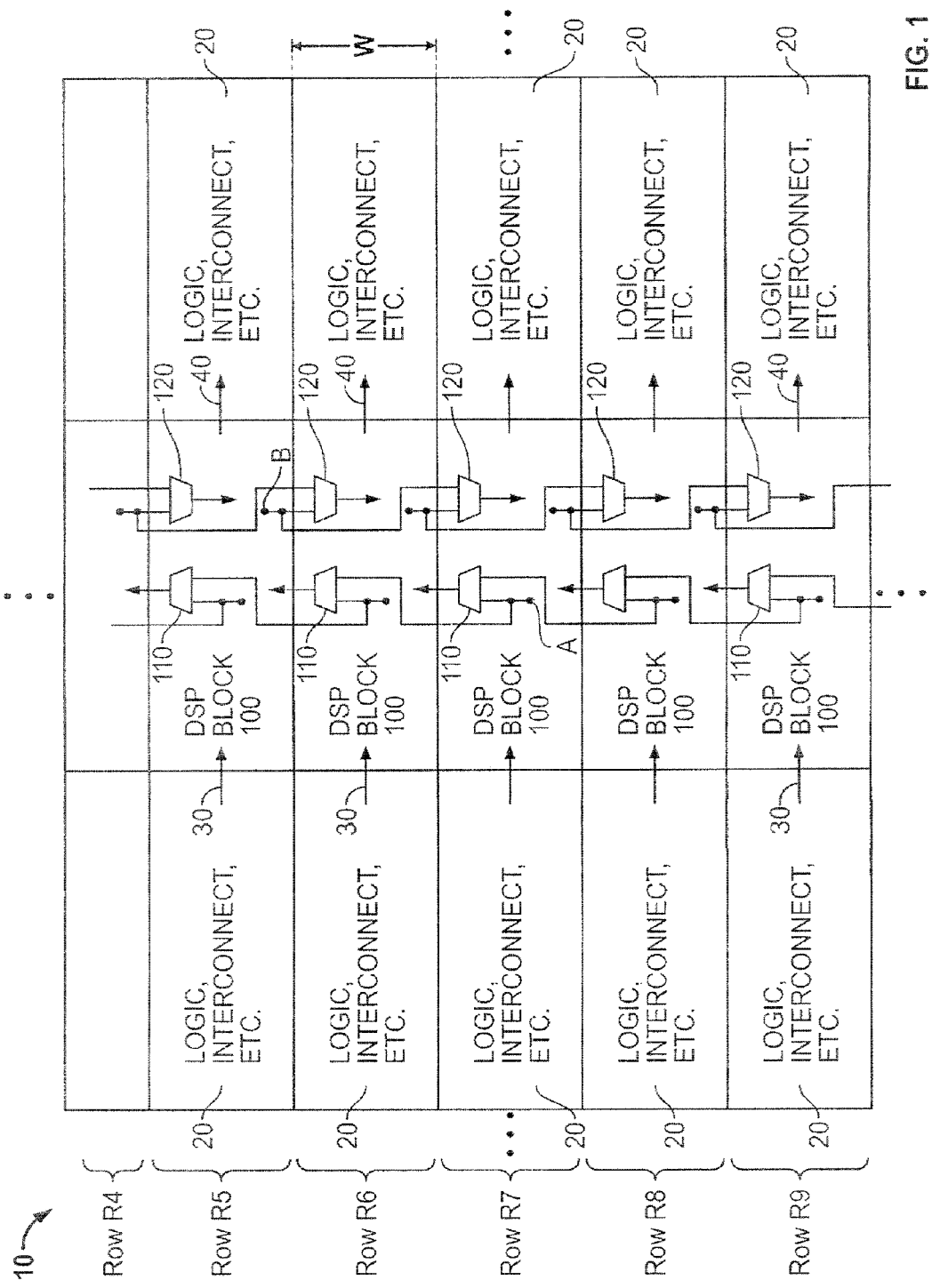
FIG. 1 is a simplified schematic block diagram of an illustrative embodiment of representative circuitry in accordance with the invention.

A representative portion of an illustrative embodiment of an integrated circuit ("IC" or "device") 10 in accordance with the invention is shown in FIG. 1. The circuitry shown in FIG. 1 includes representative portions of several representative rows R4 through R9 of circuitry. Any one of these rows may be referred to generally as row RN.

Each row RN includes a block of digital signal processing or DSP circuitry 100. Each row RN also includes areas of other circuitry 20 to the left and right of the DSP block in that row. That other circuitry 20 may include such components as logic circuitry and interconnection conductors for conveying signals to and from that row's DSP block, and also to, from, and between that row's logic and other circuitry, as well as between the rows. Various aspects of some or all of this circuitry may be programmable, e.g., to enable a generic device 10 to be put to any of several different uses. For example, although the circuitry of DSP blocks 100 is typically hard-wired to some extent to perform certain DSP functions, that circuitry may also be programmable to some extent so that certain aspects of the DSP operations performed can be varied by different users of the device to meet each user's particular needs and requirements. Such programming may be the result of storing control data in memory cells on the integrated circuit, blowing fuses on the integrated circuit, mask programming the integrated circuit, or any other suitable programming technique or technology.

Device 10 may be constructed so that the rows are redundant. This means, for example, that each row RN is identical or substantially identical to all other rows. In addition, device 10 may be constructed so that if any row RN is defective, the row immediately above or below that row can effectively take the place of the defective row. In addition, all other rows above or below the row that is effectively taking the place of the defective row effectively replace other adjacent rows. In this way, many devices 10 that are inadvertently manufactured with some defective circuitry can still be used, which significantly increases the yield of the manufacturing process. FIG. 1 shows representative circuitry for achieving this redundancy in the DSP block areas 100. Additional redundancy circuitry is provided for other portions of each row RN but is not shown in FIG. 1 to avoid over-complicating the drawings (and because those other portions of the rows are not the primary focus of this invention). The DSP block redundancy circuitry will be described in general terms in the next several paragraphs.

In accordance with the present invention, a DSP block 100 can extend its functionality by sending certain signals to and/or receiving certain signals from an adjacent DSP block or blocks. These are relatively direct connections between adjacent DSP blocks 100. These inter-DSP-block connections do not rely on other, more general, interconnection resources of device 10 such as the interconnection resources that form part of circuitry 20. Rather, these inter-DSP-block connections go directly from one DSP block 100 to another adjacent DSP block 100, subject only to the possibility that the redundancy circuitry that will now be described may be employed to allow these inter-DSP-block signals to effectively "jump over" a row that has been taken out of service due to one or more defects in that row.

Considering representative row R7 as an example, a signal that needs to go (in accordance with this invention) from the DSP block 100 in row R7 to another DSP block may originate at node A in the row R7 DSP block. This signal is applied to one selectable input terminal of the multiplexer circuitry ("mux") 110 in that DSP block, and also to one selectable input terminal of the similar mux 110 in the DSP block 100 in the row R6 above row R7. The output signal of mux 110 in row R7 goes to a destination in the DSP block 100 in row R6. The output of mux 110 in row R6 goes to a destination in the DSP block 100 in row R5. If row R6 is not defective and is therefore in use, the mux 110 in row R7 is controlled to select the signal from node A for application to row R6. But if row R6 is defective and is therefore effectively cut out of the circuitry of device 10, then mux 110 in row R6 is controlled to select the signal from node A for application to row R5. This example shows how redundancy muxes 110 can be used to apply a signal from the DSP block 100 in any row to the DSP block 100 in the row immediately above or to the DSP block 100 two rows above the source row.

Redundancy muxes 120 can be used similarly to route a signal from any DSP block 100 to either the DSP block 100 immediately below or the DSP block 100 two rows below. For example, a signal that originates at node B in the DSP block 100 in row R5 is applied to one selectable input of the muxes 120 in each of rows R6 and R7. If row R6 is in use, the mux 120 in row R6 is controlled to apply the signal from node B to the destination in row R6. On the other hand, if row R6 is not in use, then the mux 120 in row R7 is controlled to apply the signal from node B to the destination in row R7.

Figure 2:
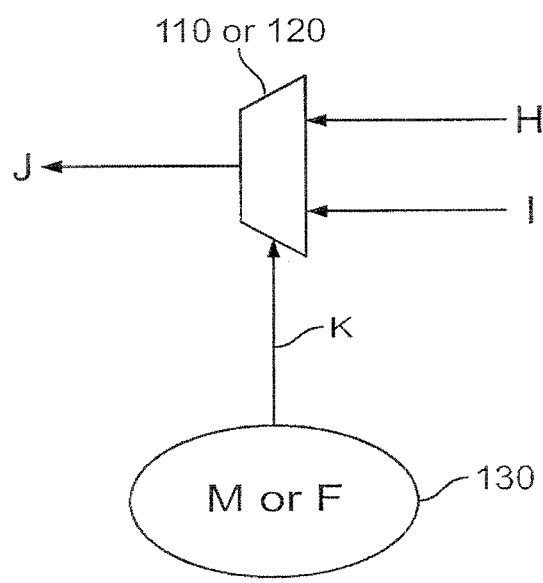
FIG. 2 is a simplified schematic block diagram of an illustrative embodiment of circuitry that can be used in FIG. 1 type circuitry in accordance with the invention.

FIG. 2 shows illustrative embodiments of how a representative redundancy mux 110 or 120 may be controlled. Mux 110/120 can select either of its primary or selectable inputs H or I to be its output signal J based on the logical state of its selection control input signal K. For example, if K is zero, J may be H; and if K is one, J may be I. K may come from a fuse (F) 130 on device 10, memory cell (M) 130 on the device, or any other programmable feature 130 on the device. Such a fuse, memory cell, or the like 130 may be programmed to the appropriate state for each such element 130 after it has been determined which (if any) row RN is defective and must therefore be effectively cut out of device 10 for purposes of normal use of the device.

A point to be made in connection with FIG. 1 is that the width W of each row (between adjacent rows) is approximately the same for (1) the DSP block 100 in that row and (2) the other circuitry 20 in that row. This facilities efficient use of the area on device 10 in a context, like the present one, in which each row is substantially identical to the other rows and in which any row may be completely taken out of service (if defective) and seamlessly replaced by another row. When a row is thus taken out of service and replaced by another row, all functions of the original row are preferably automatically reassigned to the replacement row. The user of the device does not need to be concerned with, or even know, which rows are being used and which row is not being used.

A possible consequence of making the height of each DSP block 100 the same as the height of other circuitry 20 in a row is that it tends to force the size or functional capacity of each DSP block to be commensurate with the size and capacity of the adjacent other circuitry 20 in the row that includes that DSP block. For example, a DSP block 100 may only be able to get a certain number of input signals from the adjacent circuitry 20 in the row that includes that DSP block. This may limit the number and/or size of the DSP operations (e.g., multiplications) the DSP block can perform. However, some users of device 10 may want to perform larger multiplications than can be performed in one such limited DSP block. The present invention therefore provides for extending the multiplication and other capacities of one DSP block 100 by, for example, allowing some portions or aspects of a large multiplication and/or other DSP operation to be performed in another adjacent DSP block 100. In accordance with the present invention, this is done by sending signals substantially directly between adjacent DSP blocks via redundancy circuitry like that shown in general at 110 and 120 in FIG. 1. Substantially direct inter-DSP-block connections are used in this way to avoid the delay and possible other resource exhaustion that might result from instead attempting to use the more general-purpose interconnection resources of other circuitry 20. Redundancy like 110 and 120 is used in these inter-DSP-block interconnections so that if a row must be taken out of service, the signals that need to go from one DSP block 100 to another can bypass the non-functioning DSP block 100 in the row that has been taken out of service.

Figure 3:
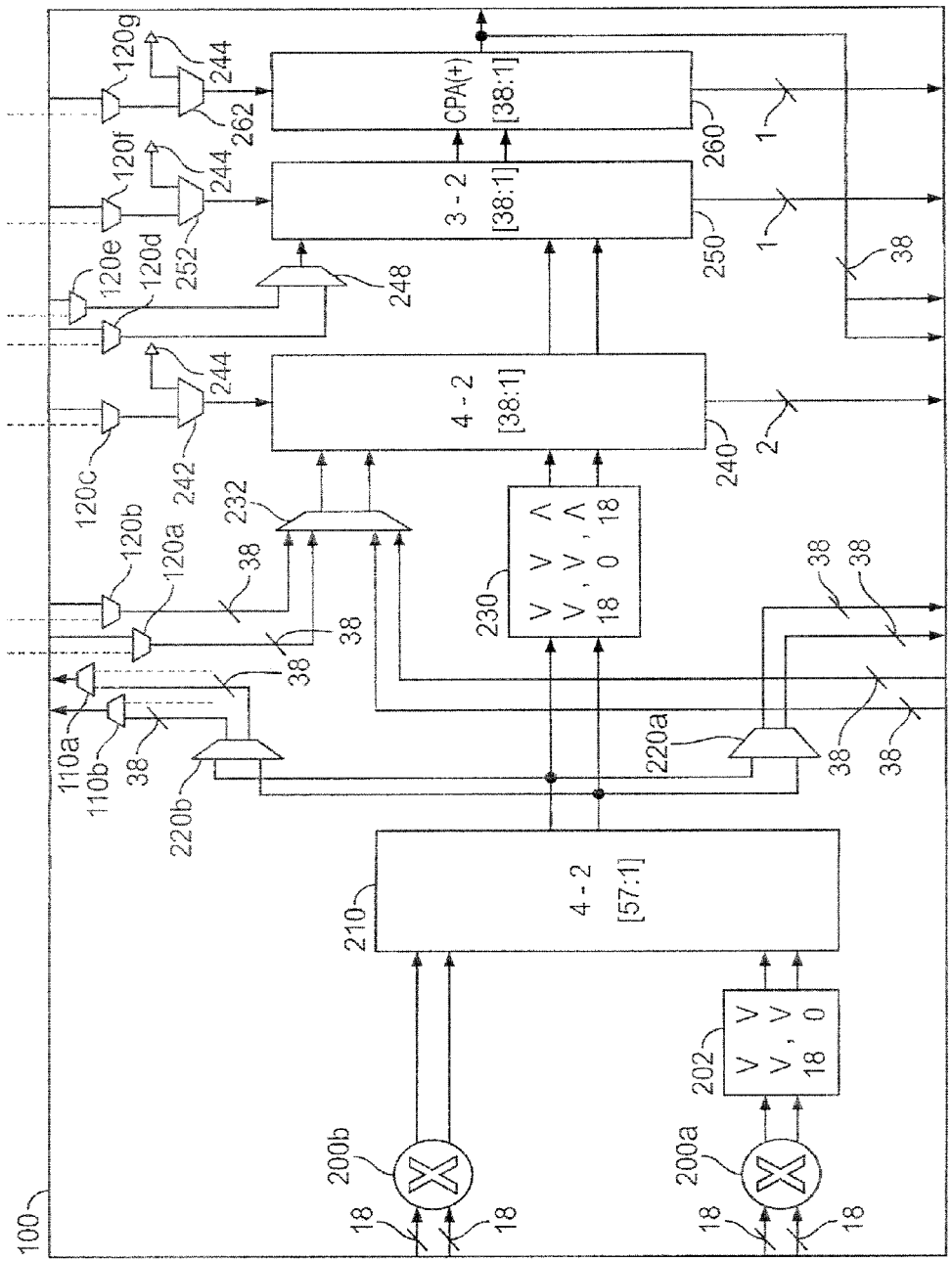
FIG. 3 is a more detailed, but still simplified, schematic block diagram of an illustrative embodiment of a representative portion of circuitry of the type shown in FIG. 1 in accordance with the invention.
Figure 4:
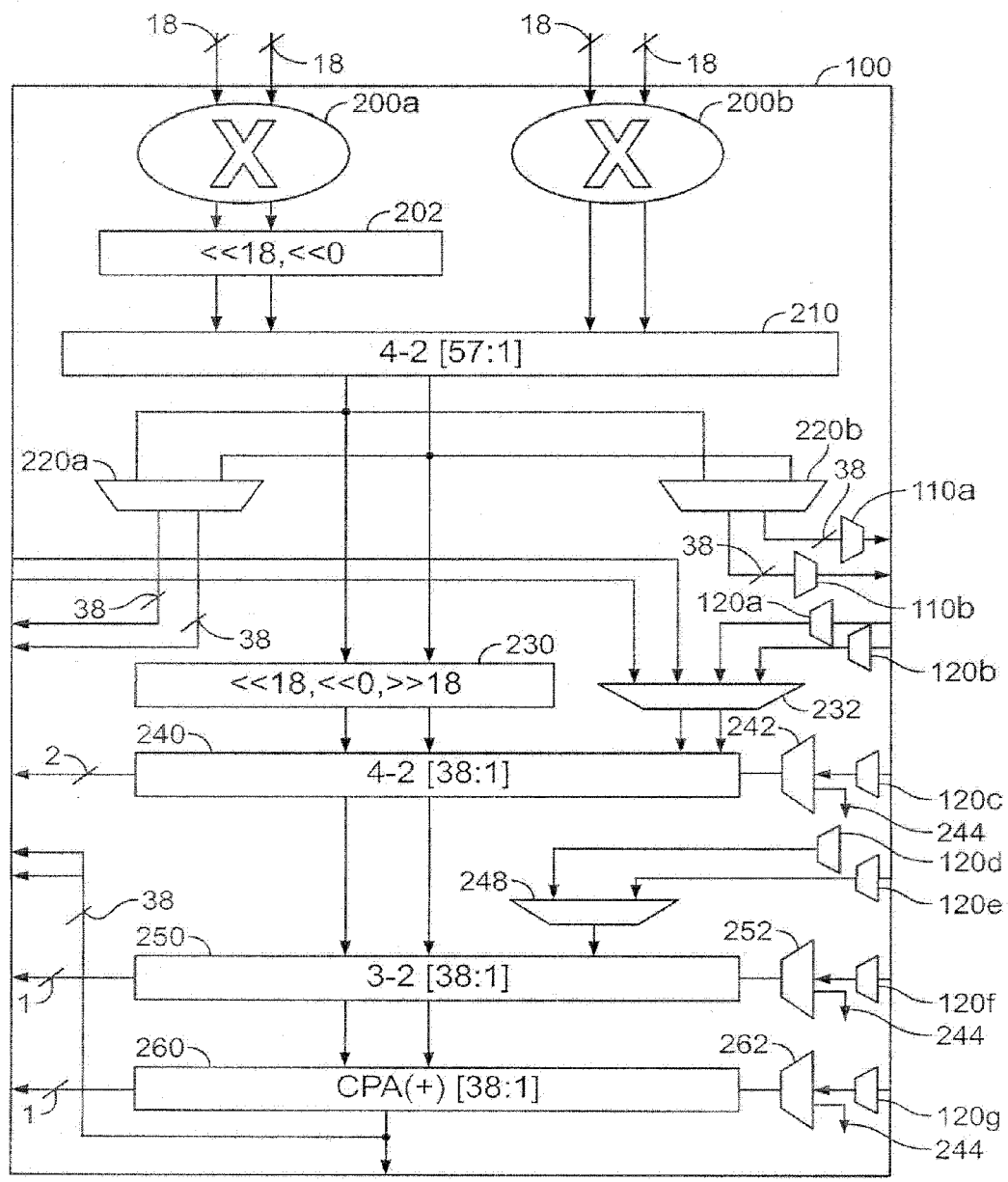
FIG. 4 shows the FIG. 3 circuitry rotated clockwise 90° to facilitate some aspects of discussion of that circuitry.

FIG. 3 shows an illustrative embodiment of a DSP block 100 in accordance with the invention. The various elements of DSP block 100 will be identified early in what follows. More details regarding how these elements can be used will be provided later. FIG. 3 shows representative DSP block 100 in the same orientation as is shown in FIG. 1. However, because this orientation can be difficult to talk about when it comes to explaining arithmetic operations performed by various components of the DSP block, the substance of FIG. 3 is exactly reproduced in a different orientation in FIG. 4. In particular, FIG. 4 is rotated clockwise 90° relative to FIG. 3. Thus "left" or the like in FIG. 4 is the same as "bottom," "down," "below," or the like in FIG. 3; "right" or the like in FIG. 4 is the same as "top," "up," "above," or the like in FIG. 3, etc. FIGS. 1 and 3 make it clear that the above-mentioned substantially direct connections between adjacent DSP blocks 100 go from row to row in device 10. Although FIGS. like FIG. 4 depict a representative DSP block 100 rotated 90°, the following discussion of FIGS. like FIG. 4 will still refer to such inter-DSP-block signals going from one "row" to another "row", even though FIGS. of this kind may make it appear that signals traveling left or right are going into another column of circuitry rather than into another row of circuitry.

Turning now to the basic structure of representative DSP block 100 as shown in either FIG. 3 or FIG. 4, block 100 includes two 18 by 18 ("18×18") multiplier circuits 200a and 200b. Each of multipliers 200 can multiply together two 18-bit data words (represented by electrical data signals from the other circuitry 20 in the row that includes the DSP block 100 under consideration) and produce two product vectors (again represented by electrical signals) in redundant format (e.g., one 36-bit sum vector and one 36-bit carry vector (because the multiplier does not include a final carry-propagate adder ("CPA") for producing a normal final product value)). Controllable shifter circuit 202 is controllable to shift the sum and carry signal vectors output by multiplier 200a either (1) 18 bit positions to the left (increased numerical or arithmetic significance), or (2) not at all (i.e., no shift to the left and therefore no change in numerical or arithmetic significance). Another possible output condition for element 202 may be outputting data signals that are all zeros. As in the case of FIG. 2, one or more fuses or memory cells like 130 may be programmed to control element 202 with respect to whether or not to shift the outputs of multiplier 200a to the left as described above (or, as a third possibility, to output 0 data as mentioned above). As another possible alternative, element 202 may be mask programmable with respect to the function that it performs. In all cases throughout this specification, "shifting" typically means routing signals to a different set of electrical leads going to the next downstream circuit element than the set of electrical leads that would otherwise be used to convey those signals (if not shifted) to the next downstream circuit element. The "arithmetic significance," "bit position," "order," or the like of a bit signal is typically the result of which of several electrical leads that signal is on.

The next element in representative DSP block 100 is four-to-two ("4-2") compressor circuit 210. Compressor 210 can combine the two sum and carry signal vectors it receives from each of shifter 202 and multiplier 200b (i.e., a total of four such signal vectors) down to two such signal vectors. Because the vectors from shifter 202 may be increased in numerical significance by 18 bit positions, the "width" of compressor 210 needs to be increased to 57 bits. Hence compressor 210 is shown having 57 bit positions (i.e., [57:1]).

The sum and carry vectors output by compressor 210 (each vector possibly including as many as 57 bits) are applied to muxes 220a and 220b, and also to controllable shifter circuit 230. Mux circuitry 220a can select any one of various 38-bit subsets of the 57-bit signal vectors output by compressor 210 for application to an adjacent DSP block to the left as viewed in FIG. 4. (Throughout this discussion, the bits in all such 38-bit data values or subsets are of consecutive numerical significance. For example, they may be relatively low-order bits from the 57-bit source; or they may be relatively high-order bits from that source. But in either case, they all have successive bit significance. Selecting such a subset is typically the result of which one of several groups of electrical leads is selected as the source of the signals in the selected subset.) Similarly, mux circuitry 220b can select any one of various 38-bit subsets of the 57-bit vectors output by compressor 210 for application to an adjacent DSP block to the right as viewed in FIG. 4. Muxes 220a and 220b may also have the ability to output data that is all zeros, if desired. This is a capability that any of the muxes (e.g., 220, 232, 242, 248, etc.) and any of the controllable shifters (e.g., 202, 230, etc.) shown and described throughout this disclosure may have. Some muxes (e.g., 242, 252, and 262) are depicted with this capability explicitly shown (e.g., the connection to ground 244 of one set of the selectable inputs to these muxes). This circuitry is not repeated for the depiction of all other elements (e.g., 202, 220, 230, 232, 248, etc.) that may include it (to avoid over-complicating the drawings), nor is this capability expressly mentioned again in the discussion of all of these other elements, but it will be understood that all elements of these general kinds may have this capability.

Controllable shifter 230 can shift bits applied to it by 18 bits to the left (thereby increasing the numerical significance of those bits), or by 18 bits to the right (thereby decreasing the numerical significance of those bits). As a third alternative, shifter 230 may apply no shift to the data applied to it. All of elements 220 and 230 may be controlled by programmable fuse or memory circuit elements like 130 in FIG. 2 (or may be mask programmable) to select which of their various possible functions to perform.

Note that in order to exit the representative DSP block 100 shown in FIGS. 3 and 4, the outputs of muxes 220b must be selected by redundancy muxes 110a and 110b (which are specific instances of redundancy muxes 110 shown more generally or generically in FIGS. 1 and 2). The alternative inputs to muxes 110a and 110b are shown by dotted lines and only in part in FIG. 3 and not at all in FIG. 4 (to avoid over-complicating FIGS. 3 and 4). But it will be apparent from FIG. 1 that these dotted line inputs come from the muxes 220b in the DSP block 100 below the FIG. 3 DSP block (or to the left of the FIG. 4 DSP block).

Muxes 232 receive 38-bit sum and carry vectors from redundancy muxes 120a and 120b. Again, redundancy muxes 120a and 120b are specific instances of the type of redundancy muxes that are shown more generally or generically at 120 in FIG. 1. The solid line inputs to muxes 120a and 120b come from the muxes 220a in the DSP block 100 immediately above the FIG. 3 DSP block (or immediately to the right of the FIG. 4 DSP block). The alternative dotted line inputs to muxes 120a and 120b (shown only in part in FIG. 3 and not at all in FIG. 4 to avoid over-complicating FIGS. 3 and 4) come from the muxes 220a in the DSP block 100 two above the FIG. 3 DSP block (or two to the right of the FIG. 4 DSP block). Muxes 232 also receive 38-bit sum and carry signal vectors from leads that come from the redundancy muxes 110a and 110b in the DSP block 100 immediately below the FIG. 3 DSP block (or immediately to the left of the FIG. 4 DSP block). Muxes 232 can select either the vectors from muxes 120a and 120b or the other vectors that muxes 232 receive. Control of muxes 232 can be similar to control of other variable elements like muxes 220.

The next element in the representative DSP block 100 shown in FIGS. 3 and 4 is 4-2 compressor circuit 240. Although different in size, compressor 240 can be similar to compressor 210. In other words, compressor 240 can combine the four 38-bit sum and carry signal vectors it receives into two, further, 38-bit sum and carry signal vectors. In the event that larger multiplications are being performed, compressor 240 may need to operate in chain-like conjunction with the similar compressor 240 in another adjacent DSP block 100. Accordingly, compressor 240 can additionally receive lower-order (i.e., lower-numerical-significance) signal bits from muxes 242. Muxes 242 can select these lower-order bits from a source of ground potential 244 in the event that there is no chaining-in from a real lower-order source. Alternatively, if there is such chaining-in, then muxes 242 get their outputs from redundancy muxes 120c. Muxes 120c are another instance of muxes like 120a and 120b. The solid line inputs to muxes 120c are the two outputs from compressor 240 in the DSP block 100 immediately above the FIG. 3 block (or immediately to the right of the FIG. 4 block). The dotted line inputs to muxes 120c (shown only in part in FIG. 3 and omitted entirely from FIG. 4 to avoid over-complication of the depictions) are the two outputs from the compressor 240 in the DSP block 100 two above the FIG. 3 block (or two to the right of the FIG. 4 block). The two outputs that come off the bottom (FIG. 3) or left (FIG. 4) of compressor 240 are the most significant, highest order, or overflow output signal bits that result from the operations performed by compressor 240. Again, these overflow bits can be chained to the lowest order inputs of an adjacent DSP block's compressor 240 via muxes 120c and 242 in that adjacent block if larger multiplications are being performed. Muxes 232 are controlled to output 0 data signals in the event that there is no chaining of the DSP blocks.

The 38-bit sum and carry vectors output by compressor 240 are applied to three-to-two ("3-2") compressor circuit 250. The final product output by an adjacent DSP block 100 can also be applied to 3-2 compressor 250 via redundancy muxes 120d and 120e and muxes 248. Again, this inter-DSP-block routing feature can be used when certain more complex DSP operations are to be performed. The arrangement and use of muxes 120d and 120e are similar to the arrangement and use of other such muxes like 120a and 120b. Thus the solid line inputs to muxes 120d and 120e come from the primary outputs of the carry-propagate adder (CPA) circuit 260 in the DSP block 100 above (FIG. 3) or to the right (FIG. 4) of the block shown in FIGS. 3 and 4. The alternative dotted line inputs to redundancy muxes 120d and 120e (again shown only in part in only FIG. 3) come from the primary outputs of the CPA 260 in the DSP block 100 two above (FIG. 3) or two to the right (FIG. 4) of the FIGS. 3 and 4 block. (Muxes 248 are controlled to output 0 data signals in the event that there is no chaining of the DSP blocks.) 3-2 compressor 250 can combine the sum and carry signal vectors from compressor 240 with the data output by muxes 248 to produce further sum and carry signal vectors that are applied to final carry-propagate adder ("CPA") 260. In the event that the representative DSP block 100 is involved in a longer-than-38-bit arithmetic operation, lower-order signal bits can be applied to compressor 250 and CPA 260 from an adjacent DSP block 100 via muxes 120f and 252 in the case of compressor 250 and via muxes 120g and 262 in the case of CPA 260. Similarly, higher-order signal bits can be output from elements 250 and 260 to the elements 120f/252/250 and 120g/262/260 in an adjacent DSP block 100 if needed for chaining multiple elements 250 and multiple elements 260 for longer arithmetic operations. The arrangement and use of elements 120f, 252, and 244 can be similar to the above-described arrangement and use of elements 120c, 242, and 244. The same is true for elements 120g, 262, and 244. Accordingly, further explanation of elements 120f/252/244 and 120g/262/244 should not be needed.

In addition to being substantially directly routable back to muxes 248 in another adjacent DSP block 100, the final, up-to-38-bit signal product output by CPA 260 is typically applied to the other circuitry 20 in the row RN that includes representative DSP block 100 as shown in FIG. 1.

We turn now to considering examples of the various operating modes that one or more DSP blocks 100 can support.

A. 18×18 and 18×18 Complex

Relatively simple modes like 18×18 multiplication and 18×18 complex multiplication (e.g., (a+bi)×(c+di)) can be done within one DSP block 100. For example, either multiplier 200 can be used to form sum and carry signal vectors from an 18×18 multiplication, and those vectors can be passed down through subsequent components to CPA 260, which forms the final product of the multiplication.

B. Sum of Four 18×18

The sum of the products of four 18×18 multiplications can be formed using two adjacent DSP blocks. ("Adjacent" means immediately adjacent if there is no intervening row that has been taken out of service by operation of the redundancy circuitry; or, alternatively, adjacent but for such an intervening out-of-service row.) In discussions such as the following, each letter such as A, B, C, etc., denotes or represents an 18-bit input, and each letter pair like AB, CD, etc., is the multiplication result for a multiplication of the two 18-bit inputs identified by the letters in that pair. Such a letter pair may represent either intermediate sum and carry vectors for such a multiplication result, or the final multiplication product. Thus AB+CD+EF+GH is the sum of four products of eight, paired, 18-bit inputs.

Multiplier 200a in a first DSP block 100 may be used to form AB. Multiplier 200b in that DSP block may be used to form CD. Compressor 210 in the first DSP block forms AB+CD. Muxes 220b can be used to route AB+CD to muxes 232 and compressor 240 in the adjacent DSP block 100. Multiplier 200a in the adjacent DSP block can be used to form EF. Multiplier 200b in that adjacent block can be used to form GH. Compressor 210 in that adjacent block forms EF+GH. Compressor 240 in that adjacent block forms AB+CD+EF+GH, which CPA 260 in that same block outputs in final product form. Note that the block forming AB+CD can be a block to either side of the block forming EF+GH and AB+CD+EF+GH.

C. Sum of Two 36×18

In discussions such as the following, letters like A, B, C, etc., have the same meaning as before; letter pairs like AC, BC, etc., have the same meaning as before; letter pairs like (A,B) denote 36-bit data words in which the letter on the left refers to the 18 more significant bits, and the letter on the right refers to the 18 less significant bits; and letter combinations like (A,B)*C denote the multiplication result for a multiplication of a 36-bit data word (e.g., (A,B)) multiplied by an 18-bit data word (e.g., C). Thus the objective of the mode being discussed here is to produce (A,B)*C+(D,E)*F.

Figure 5:
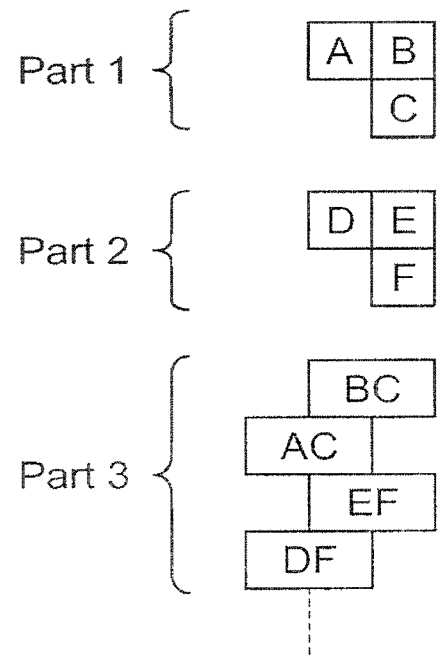
FIG. 5 is a simplified diagram illustrating certain aspects of performance of a particular DSP operation in accordance with the invention.

FIG. 5 shows (arithmetically) how the above-mentioned result is built up. Part 1 of FIG. 5 shows one of the 36×18 multiplications to be performed (i.e., (A,B)*C). Part 2 shows the other of the 36×18 multiplications to be performed (i.e., (D,E)*F). Part 3 shows how various partial products are produced and then aligned vertically for addition to produce (A,B)*C+(D,E)*F. In particular, two partial products of (A,B)*C are produced as AC and BC, with AC being shifted to the left 18 bit positions relative to BC. Similarly, two partial products of (D,E)*F are produced as DF and EF, with DF being shifted 18 bit positions to the left relative to EF. All of BC, AC, EF, and DF are then added as shown in Part 3 of FIG. 5.

Figure 6:
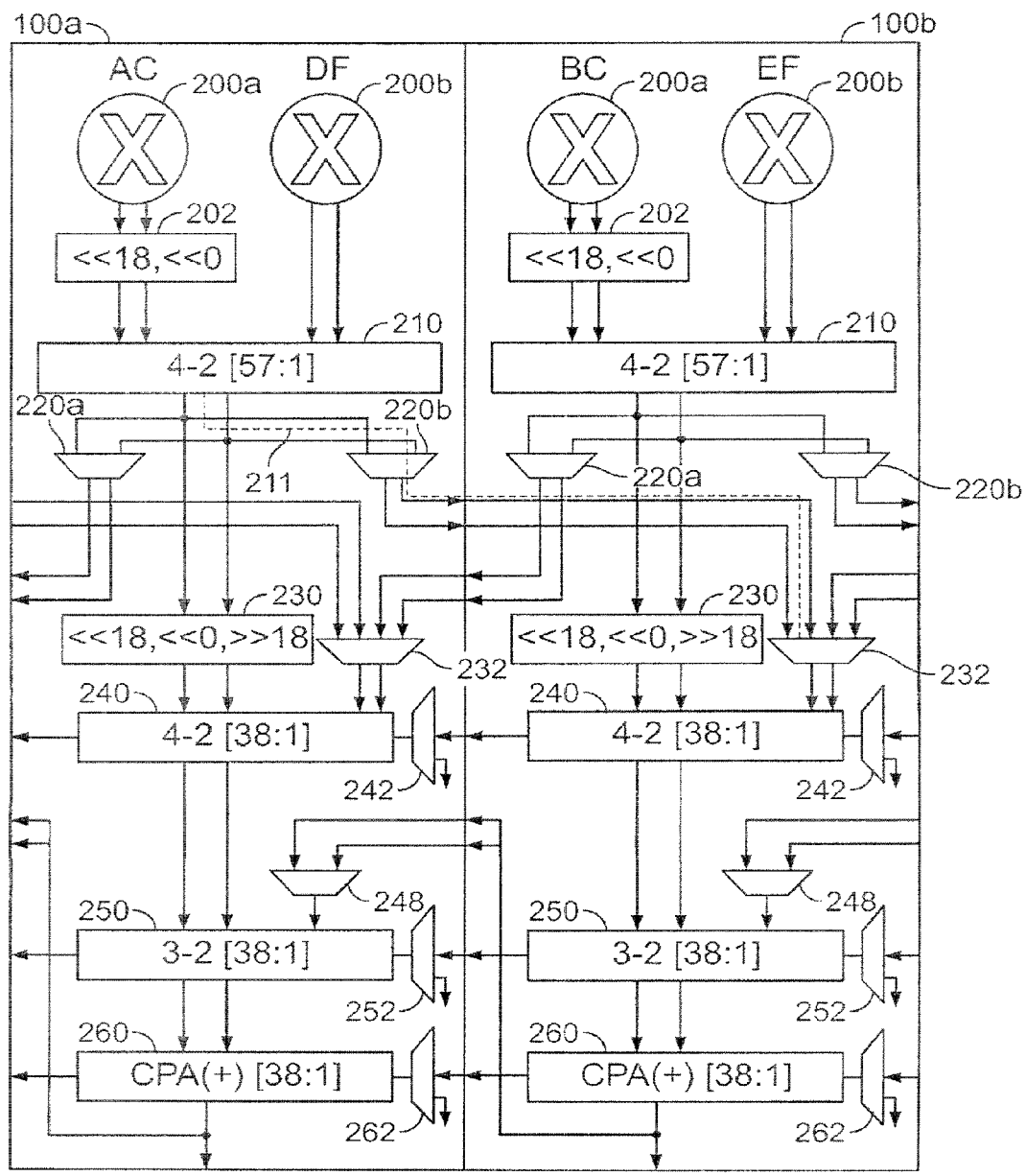
FIG. 6 is a simplified schematic block diagram showing an illustrative embodiment of DSP circuitry for performing the FIG. 5 operation in accordance with the invention.

FIG. 6 shows how two adjacent DSP blocks 100 can be configured to perform the above operations. FIG. 6 is simplified by omitting depiction of the redundancy circuitry and by assuming that two immediately adjacent DSP blocks 100a and 100b are used. (It will be understood that all of the previously depicted and described redundancy circuitry is in fact present in the FIG. 6 circuitry, and that this redundancy circuitry can be used to effectively put together two DSP blocks that are separated from one another by an intervening DSP block that cannot be used.) As shown in FIG. 6, multiplier 200a in DSP block 100a forms AC, multiplier 200b in DSP block 100a forms DF, multiplier 200a in DSP block 100b forms BC, and multiplier 200b in DSP block 100b forms EF. Compressor 210 in block 100a compresses (adds) AC and DF. Compressor 210 in block 100b compresses (adds) BC and EF. The less significant 18 bits of the output of compressor 210 in block 100a are routed via elements 220b (block 100a) and 232 (block 100b) to the compressor 240 in block 100b. (The path of this routing is highlighted by dotted line 211 in FIG. 6.) This enables block 100b to form the portion of the final sum to the right of the dotted line in Part 3 of FIG. 5. The data to the left of the dotted line in Part 3 of FIG. 5 remains in block 100a and is output by that block as that part of the final sum.

More particularly, in block 100a, shifter 230 is used to shift the outputs of compressor 210 18 bit positions to the right so that the more significant outputs of compressor 210 that are not transferred to block 100b are shifted to the less significant portion of compressor 240 in block 100a. In block 100b shifter 230 shifts the data from compressor 210 18 bit positions to the left, and the data passing through mux circuitry 232 in block 100b is applied to the more significant inputs to compressor 240 that are associated with that mux circuitry 232. The compressor 240 in block 100b is thus able to begin finishing the addition shown to the right of the dotted line in Part 3 of FIG. 5. Any carry out or overflow from the most significant end of compressor 240 in block 100b is applied by muxes 242 in block 100a to the least significant end of compressor 240 in block 100a. This enables both compressors 240 to effectively operate together as one much longer compressor.

The data output by each of compressors 240 flows through the respectively associated compressor 250 to the respectively associated carry-propagate adder ("CPA") 260, where the final sum-out data for (A,B)*C+(D,E)*F is produced. Again, any carry overflow from the most significant end of CPA 260 in block 100b is applied (as a carry in) to the least significant end of CPA 260 in block 100a via mux 262 in block 100a. This again enables both of CPAs 260 to effectively operate together as one much longer CPA. Thus block 100a outputs the 18 more significant bits of final product (A,B)*C+(D,E)*F, while block 100b outputs the 36 less significant bits of that final product.

D. 36×36 Mode Using Two DSP Blocks

In discussions such as the following, letter pairs like (A,B) again denote a 36-bit data word in which the letter on the left refers to the 18 more significant bits, and the letter on the right refers to the 18 less significant bits. Letter pairs like BD also have basically the same meaning as before (although now such a letter pair typically refers to the product of two 18-bit portions of two different 36-bit data words). Thus the objective of the work being discussed in this section is to produce the product of (A,B) and (C,D), or (A,B)*(C,D).

Figure 7:
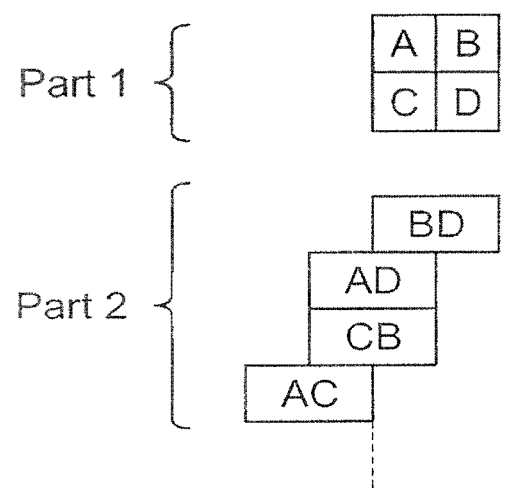
FIG. 7 is a simplified diagram illustrating certain aspects of performance of another DSP operation in accordance with the invention.

FIG. 7 shows arithmetically how the above-mentioned result is built up. Part 1 of FIG. 7 shows the multiplication to be performed. Part 2 shows four partial products that are formed, and how these four partial products are positioned, left to right, relative to one another to adjust their relative arithmetic significances so that they can be added vertically. In particular, the topmost partial product BD is the product of the 18 less significant bits in each of multiplicand (A,B) and multiplier (C,D). The next partial product AD is the product of the 18 more significant bits in the multiplicand (A,B) and the 18 less significant bits in the multiplier (C,D). Partial product CB is the product of the 18 less significant bits in multiplicand (A,B) and the 18 more significant bits in multiplier (C,D). Partial product AC is the product of the 18 more significant bits in each of the multiplicand and the multiplier. As has already been mentioned, Part 2 of FIG. 7 also shows how partial products AD and CB are shifted 18 bit positions to the left relative to partial product BD, as well as how partial product AC is shifted 18 more bit positions to the left relative to partial products AD and CB. After such shifting, the four partial products shown in Part 2 of FIG. 7 can be added vertically to produce the desired final product of (A,B) and (C,D), i.e., (A,B)*(C,D).

Figure 8:
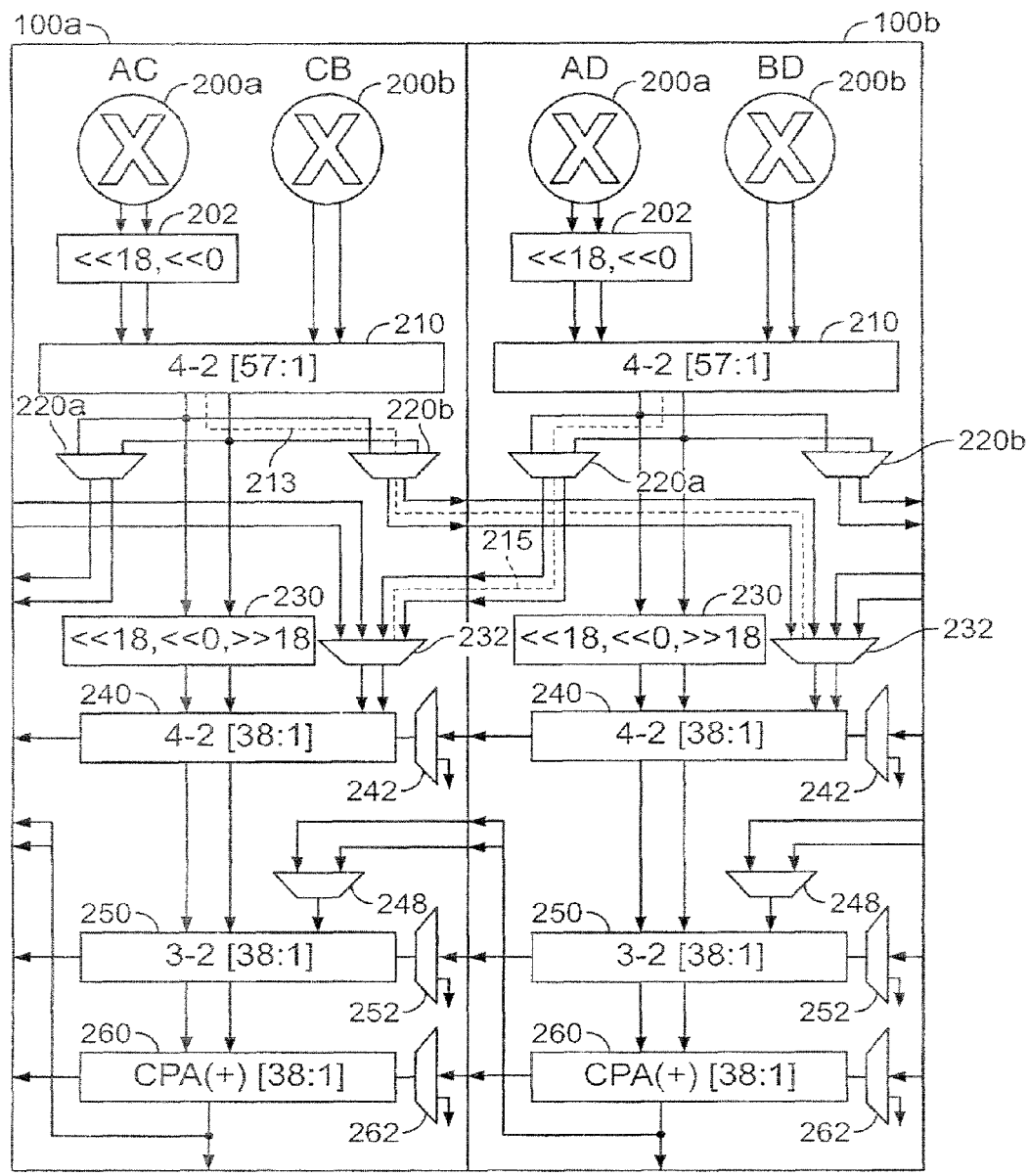
FIG. 8 is a simplified schematic block diagram showing an illustrative embodiment of DSP circuitry for performing the FIG. 7 operation in accordance with the invention.

Two adjacent DSP blocks 100 can be used to perform the arithmetic functions illustrated by FIG. 7. (Again "adjacent" means either immediately adjacent if no intervening row has been taken out of service, or adjacent on opposite sides of an intervening row that has been taken out of service.) FIG. 8 shows how this can be done using two adjacent DSP blocks 100a and 100b (and again omitting depiction of the redundancy multiplexers and other redundancy connections to avoid unduly complicating the FIG.).

As shown in FIG. 8, multiplier 200a in DSP block 100a forms partial product AC. Multiplier 200b in DSP block 100a forms partial product CB. Multipliers 200a and 200b in DSP block 100b form partial products AD and BD, respectively. Shifter 202 in DSP block 100a shifts partial product AC 18 bit positions to the left relative to partial product CB, and compressor 210 in that DSP block adds those two partial products as thus shifted relative to one another. Shifter 202 in DSP block 100b shifts partial product AD 18 bit positions to the left relative to partial product BD, and compressor 210 in that DSP blocks adds those two partial products as thus shifted relative to one another.

The 18 least significant bits output by the compressor 210 in DSP block 100a are routed via elements 220b in block 100a and 232 in block 100b to compressor 240 in block 100b, where these bits are routed to the more significant end of the associated compressor 240 inputs. (Dotted line 213 highlights this routing.) The 18 most significant bits output by compressor 210 in DSP block 100b are routed via elements 220a in block 100b and 232 in block 100a to compressor 240 in block 100a, where these bits are routed to the less significant end of the associated compressor inputs. (Dotted line 215 highlights this routing.) Shifter 230 in DSP block 100a shifts the data output by compressor 210 in that block 18 bits to the right to prevent the less significant bits that have been transferred from block 100a to block 100b from also being applied to compressor 240 in block 100a. Shifter 230 in DSP block 100b shifts the data output by compressor 210 in that block 18 bits to the left in order to prevent the more significant bits that have been transferred from block 100b to block 100a from also being applied to compressor 240 in block 100b.

Compressors 240 in DSP blocks 100a and 100b work together to add the partial product information applied to them (with element 242 in block 100a applying any overflow from the highest-order (most-significant) bit position in compressor 240 in block 100b to the lowest-order (least-significant) bit position in compressor 240 in block 100a). Compressor 240 in block 100a is thus beginning to form the result of addition of data to the left of the vertical dotted line in Part 2 of FIG. 7, while compressor 240 in block 100b is performing similarly for the data to the right of that dotted line.

The data output by each of compressors 240 flows through the respective compressor 250 to the respective carry-propagate adder ("CPA") 260. Again, element 262 in block 100a applies any carry out from the most significant end of CPA 260 in block 100b to the least significant end of CPA 260 in block 100a. The final outputs of these two CPAs 260 collectively comprise the final product (A,B)*(C,D), with the outputs of CPA 260 in block 100a constituting the more significant bits of that final product, and with the outputs of CPA 260 in block 100b constituting the less significant bits of that final product.

E. 54×54 Mode Using Four DSP Blocks

Figure 9:
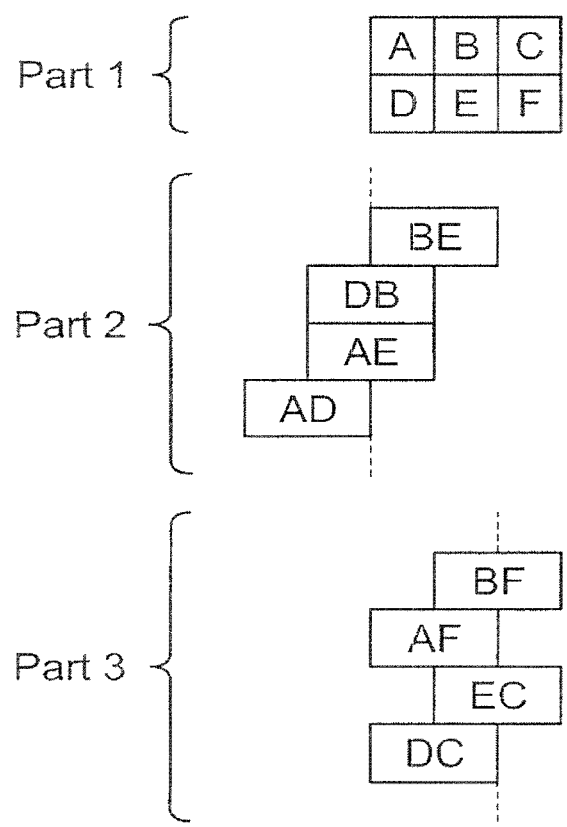
FIG. 9 is a simplified diagram illustrating certain aspects of performance of yet another DSP operation in accordance with the invention.
Figure 10:
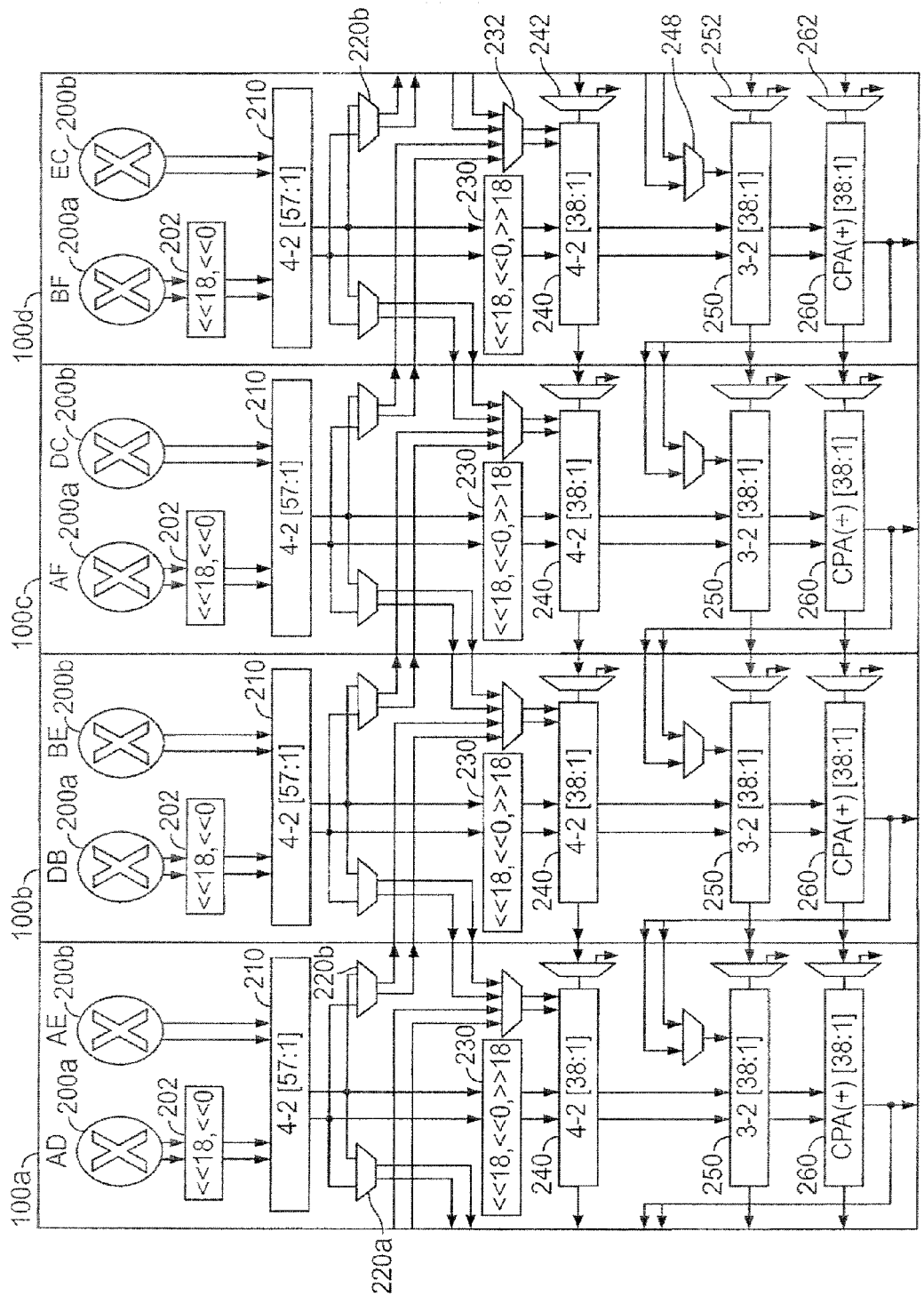
FIG. 10 is a simplified schematic block diagram showing an illustrative embodiment of DSP circuitry for performing the FIG. 9 operation in accordance with the invention.

Another example of how DSP blocks 100 in accordance with this invention can be used is illustrated by FIGS. 9 and 10. In this discussion letter triplets like (A,B,C) refer to 54-bit data words in which letter A denotes the 18 most-significant bits, letter B denotes the 18 bits of intermediate arithmetic significance, and letter C denotes the 18 least-significant bits. Letter pairs like AF refer to a partial product of 18 bits A from one 54-bit data word times 18 bits F from another 54-bit data word. The objective of the mode being discussed in this section is to produce the product of two 54-bit data words, i.e., the product of (A,B,C) times (D,E,F), or (A,B,C)*(D,E,F). It is assumed, however, that exact precision for 108 bits is not required for the product. Accordingly, the least significant partial product CF is not computed or used to produce the final (approximate) product.

FIG. 9 shows arithmetically how the above-mentioned product is built up from multiple partial products. FIG. 10 shows four DSP blocks 100a-100d that can be used to build up the product as shown in FIG. 9. (Again, for simplicity, FIG. 10 assumes that four immediately adjacent DSP blocks 100 can be used because no DSP block in this range is out of service. Thus FIG. 10 omits depiction of the redundancy circuitry shown and described elsewhere in this specification. But that redundancy circuitry is preferably present and can be used to enable another adjacent DSP block 100 to be used to help perform the functions described in connection with FIG. 10 if one of blocks 100a-d must be taken out of service.) Part 1 of FIG. 9 shows the multiplication to be performed. Part 2 of FIG. 9 shows the partial products that are formed and appropriately combined in the two left-hand DSP blocks 100a and 100b. Part 3 of FIG. 9 shows the partial products that are formed and appropriately combined in the two right-hand DSP blocks 100c and 100d. The 36 more significant bits from Part 3 of FIG. 9 (i.e., the bits to the left of the dotted line in Part 3) are added to the 36 less significant bits from Part 2 of FIG.

9 (i.e., the bits to the right of the dotted line in Part 2), primarily in the final stages of DSP block 100b. Thus the 72 more significant bits of the product are output by DSP blocks 100a and 100b. An additional 18 less significant bits of the product are available from DSP block 100d. As mentioned earlier, still less significant bits of the product are not computed and are not available. Thus the "product" in this case is only approximate, although it is approximate to a very high degree of precision. In particular, this is due to the fact that the least significant partial product CF is not computed or used anywhere in FIGS. 9 and 10.

Considering FIGS. 9 and 10 now in more detail, it will be noted that the work done in DSP blocks 100a and 100b (as shown in Part 2 of FIG. 9) is initially the same as what is shown in FIGS. 7 and 8 and described above in connection with those FIGS. In particular, this work is use of two DSP blocks 100a and 100b to form the product of two 36-bit data words (in this case the product (A,B)*(D,E)). Because this aspect of the functionality of two DSP blocks has already been fully described in connection with FIGS. 7 and 8, it will not be necessary to describe it in detail again in connection with Part 2 of FIG. 9 or DSP blocks 100a and 100b in FIG. 10.

Turning now to Part 3 of FIG. 9 and DSP blocks 100c and 100d in FIG. 10, it will be noted that the work done in these two DSP blocks is initially somewhat similar to what is shown in FIGS. 5 and 6 and described above in connection with those FIGS. However, the dotted line in Part 3 of FIG. 9 is in a different location than the dotted line in Part 3 of FIG. 5, so the way in which DSP blocks 100c and 100d in FIG. 10 do this work is somewhat different than the flow described above for FIG. 6. The somewhat different flow used in FIG. 10 will be described in the next paragraph.

Multipliers 200a and 200b in DSP block 100c form partial products AF and DC, respectively. Compressor 210 in block 100c adds these two partial products together. Multipliers 200a and 200b in DSP block 100d form partial products BF and EC, and the compressor 210 in that block adds these two partial products together. Routing 220a in block 100d and 232 in block 100c applies the 18 more significant bits output by compressor 210 in block 100d to the less significant end of compressor 240 in block 100c. Shifter 230 in block 100d shifts the outputs of the compressor 210 in that block 18 bit positions to the left. Compressor 240 in block 100c compresses the four vectors applied to it down to two vectors, which flow down through the compressor 250 in that block to the CPA 260 in that block. (This is basically the final addition work required to the left of the dotted line in Part 3 of FIG. 9.) The outputs of compressor 240 in block 100d similarly flow down through the compressor 250 in that block to the CPA 260 in that block. (This corresponds to what is to the right of the dotted line in Part 3 of FIG. 9.) The CPAs 260 in blocks 100c and 100d work together to produce the final sum of the work shown in Part 3 of FIG. 9. Elements 248 in block 100b are used to route the 38 more significant bits of that result (output by the CPA 260 in block 100c) into block 100b for addition to the work being done in blocks 100a and 100b (as shown in Part 2 of FIG. 9). Thus the final result is (1) the 72 more significant bits of (A,B,C)*(D,E,F) being output by the CPAs 260 in blocks 100a and 100b, and (2) the 18 more (less significant) bits of that (approximate) product being output by the CPA 260 in block 100d.

Recapitulating some aspects of the foregoing, and also in some respects extending what has been said, a digital signal processing ("DSP") block (e.g., 100) may include first and second N-bit (e.g., 18-bit) multiplier circuits (e.g., 200a and 200b). The DSP block may further include first shifter circuitry (e.g., 202) for shifting outputs of the first multiplier circuit by a selectable one of (1) zero bit positions and (2) N bit positions toward greater arithmetic significance. The DSP block may still further include first compressor circuitry (e.g., 210) for additively combining outputs of the first shifter circuitry and the second multiplier circuit. The DSP block may yet further include circuitry (e.g., 220a and 220b) for selectively routing outputs of the first compressor circuitry to first and second other DSP circuit blocks that are on respective opposite sides of the DSP circuit block. The DSP block may still further include second shifter circuitry (e.g., 230) for shifting outputs of the first compressor circuitry by a selectable one of (1) zero bit positions, (2) N bit positions toward greater arithmetic significance, and (3) N bit positions toward lesser arithmetic significance. The DSP block may yet further include second compressor circuitry (e.g., 240) for additively combining any outputs received from the first compressor circuitry in either of the first and second other DSP circuit blocks.

In a DSP circuit block as described above, the routing circuitry (e.g., 220a and/or 220b) may be controllable to select for routing any one of a plurality of subsets of the outputs of the first compressor circuitry (e.g., 210). These selectable subsets may include (1) a subset including a most significant output bit position of the first compressor circuitry, and (2) a subset including a least significant output bit position of the first compressor circuitry.

In a DSP circuit block as described above the second compressor circuitry (e.g., 240) may include overflow output circuitry (e.g., output leads from most significant end of compressor 240 to adjacent DSP block) for applying overflow output signals of the second compressor circuitry to the first other DSP circuit block, and overflow input circuitry (e.g., 242) for selectively receiving overflow output signals of the second compressor circuitry in the second other DSP circuit block.

A DSP circuit block as described above may further include third compressor circuitry (e.g., 250) for additively combining outputs of the second compressor circuitry and any further outputs received from the second other DSP circuit block, and further routing circuitry (e.g., 248) for selectively routing outputs of the third compressor circuitry, as further outputs, to the first other DSP circuit block. In such a DSP circuit block, the third compressor circuitry (e.g., 250) may comprise overflow output circuitry (e.g., output leads from most significant end of compressor 250 to adjacent DSP block) for applying overflow output signals of the third compressor circuitry to the first other DSP circuit block, and overflow input circuitry (e.g., 252) for selectively receiving overflow output signals of the third compressor circuitry in the second other DSP circuit block.

In a DSP circuit that includes the above-mentioned further routing circuitry (e.g., 248), that further routing circuitry may include carry-propagate adder ("CPA") circuitry (e.g., 260) for operating on the outputs of the third compressor circuitry (e.g., 250) to produce the further outputs. The CPA circuitry may include carry-out circuitry (e.g., output lead from most significant end of CPA 260 to adjacent DSP block) for applying a carry out signal of the CPA circuitry to the first other DSP circuit block, and carry-in circuitry (e.g., 262) for selectively receiving a carry out signal of the CPA circuitry in the second other DSP circuit block.

A DSP circuit block as described above may further include redundancy circuitry (e.g., 110 and/or 120) for allowing the first other DSP circuit block to be a selectable one of (1) another DSP circuit block that is immediately adjacent to the DSP circuit block, and (2) yet another DSP circuit block that is not immediately adjacent to the DSP circuit block. For example, if the DSP circuit block is in row R7 in FIG. 1, the first other DSP block can be either (1) in row R8 or (2) in row R9. In such an arrangement the yet another DSP circuit block (e.g., the one in row R9) is immediately adjacent to the another DSP circuit block (e.g., the one in row R8).

A DSP circuit block as described above may also include further redundancy circuitry (e.g., 110 and/or 120) for allowing the second other DSP circuit block to be a selectable one of (1) still another DSP circuit block that is immediately adjacent to the DSP circuit block, and (2) still a further other DSP circuit block that is not immediately adjacent to the DSP circuit block. For example, if the DSP circuit block is in row R7 in FIG. 1, the second other DSP block can be either (1) in row R6 or (2) in row R5. In such an arrangement the still a further other DSP circuit block (e.g., the one in row R5) is immediately adjacent to the still another DSP circuit block (e.g., the one in row R6).

In accordance with other possible aspects of the invention, DSP circuitry (e.g., 10) may comprise a plurality of DSP circuit blocks (e.g., 100), each of which is capable of performing DSP operations (e.g., 200, 202, 210, 230, 240, etc.) on signals applied to that circuit block (e.g., A, B, C, etc.), each of the DSP circuit blocks may include circuitry (e.g., 220, 232, 242, etc.) for selectively routing outputs of at least some of the DSP operations to first and second other ones of the DSP circuit blocks that are on respective opposite sides of the DSP circuit block. In such cases, the circuitry for selectively routing may include redundancy circuitry (e.g., 110 and/or 120) for allowing the first other DSP circuit block for a DSP circuit block to be a selectable one of (1) another DSP circuit block that is immediately adjacent to that DSP circuit block, and (2) yet another DSP circuit block that is not immediately adjacent to that DSP circuit block. For example, if the DSP circuit block is in row R7 in FIG. 1, the first other DSP block can be either (1) in row R8 or (2) in row R9. In such an arrangement the yet another DSP circuit block (e.g., the one in row R9) is immediately adjacent to the another DSP circuit block (e.g., the one in row R8).

The circuitry for selectively routing in DSP circuitry as described above may further include further redundancy circuitry (e.g., 110 and/or 120) for allowing the second other DSP circuit block for a DSP circuit block to be a selectable one of (1) still another DSP circuit block that is immediately adjacent to that DSP circuit block, and (2) still a further other DSP circuit block that is not immediately adjacent to that DSP circuit block. For example, if the DSP circuit block is in row R7 in FIG. 1, the second other DSP block can be either (1) in row R6 or (2) in row R5. In such an arrangement the still further other DSP circuit block (e.g., the one in row R5) is immediately adjacent to the still another DSP circuit block (e.g., the one in row R6).

In DSP circuitry as described above, the circuitry for selectively routing of each of the DSP circuit blocks may selectively route the outputs to inputs of the first and second other ones of the DSP circuit blocks that are downstream from some but not all DSP operations that the first and second other ones of the DSP circuit blocks are capable of performing. For example, selective routing circuitry 220 can route outputs of compressor 210 in one DSP block to inputs of a compressor 240 in another DSP block, and compressor 240 is downstream from some (but not all) other DSP operations in the other DSP block (e.g., it is downstream from operations 200, 202, 210, and 230, but it is upstream from operations 250 and 260).

In accordance with still other possible aspects of the invention, DSP circuitry (e.g., 10) may include a plurality of DSP circuit blocks (e.g., 100), each of which is capable of performing a plurality of DSP operations (e.g., 200, 202, 210, 230, 240, etc.) one after another in succession. Each of the DSP circuit blocks may further include circuitry (e.g., 220) for selectively routing outputs of at least one of the DSP operations (e.g., 210) of that DSP circuit block to first and second other ones of the DSP circuit block that are on respective opposite sides of that DSP circuit block. The circuitry for selectively routing in each DSP circuit block may selectively route at least some of the outputs to inputs to DSP operations in the first and second other DSP circuit blocks that are intermediate in the succession of DSP operations in those other DSP circuit blocks. For example, routing circuitry 220 can route outputs of a DSP block to inputs of compressor 240 in another DSP block, and compressor 240 is intermediate in the succession of DSP operations (i.e., it is preceded by DSP operations like 200 and 202, and it is followed by DSP operations like 250 and 260).

In DSP circuitry as described above, at least some of the inputs may be inputs to DSP operations at a different point in the succession in the DSP blocks than the point in the succession in the DSP circuit block from which the circuitry for selectively routing received the outputs selectively routed to those at least some inputs. For example, compressor 210, from which routing elements 220 get outputs to apply to compressor 240 in another DSP block, is at a different point in the succession of DSP operations in the first-mentioned DSP block than the point at which compressor 240 is in the succession of DSP operations in the second-mentioned DSP block.

In DSP circuitry as described above, each DSP circuit block may further include second circuitry (e.g., the lead from the most significant end of compressor 240 to an adjacent DSP block) for selectively routing a second output of a DSP operation in that DSP circuit block to an input of a same DSP operation in the first other DSP circuit block. For example, the immediately above-mentioned lead and element 242 allows overflow signals to go from the compressor 240 in one DSP block to the compressor 240 in another DSP block.

In DSP circuitry as described above, each DSP circuit block may further include third circuitry (e.g., 248) for selectively routing outputs of a final DSP operation (e.g., 260) in that DSP circuit block to inputs to a DSP operation (e.g., 250) in the first other DSP circuit that is at an intermediate point in the succession in that other DSP circuit block.

DSP circuitry as described above may further include redundancy circuitry (e.g., 110 and/or 120) for allowing the first other DSP circuit block of each of the DSP circuit blocks to be a selectable one of (1) another of the DSP circuit blocks that is immediately adjacent to the DSP circuit block, and (2) yet another of the DSP circuit blocks that is not immediately adjacent to the DSP circuit block. For example, if a DSP block 100 is in row R7 in FIG. 1, the another DSP block may be in row R8 and the yet another DSP block may be in row R9. In addition, the yet another DSP block (e.g., the one in row R9) may be immediately adjacent to the another DSP block (e.g., the one in row R8).

DSP circuitry as described above may also include further redundancy circuitry (e.g., 110 and/or 120) for allowing the second other DSP circuit block of each of the DSP circuit blocks to be a selectable one of (1) still another of the DSP circuit blocks that is immediately adjacent to the DSP circuit block, and (2) still a further another one of the DSP circuit blocks that is not immediately adjacent to the DSP circuit block. For example, if the DSP circuit block is in row R7 in FIG. 1, the still another DSP block may be in row R6, and the still a further another DSP block may be in row R5. The still a further another one of the DSP circuit blocks (e.g., the one in row R5) may be immediately adjacent to the still another of the DSP circuit blocks (e.g., the one in row R6).

The circuitry of this invention allows summations to be performed by bidirectional shifting between DSP circuit blocks. For example, a value can be shifted from a first DSP block to a second DSP block to the right of the first block and combined (e.g., compressed) with another signal in the second block. The result of this combination can then be shifted back to the left (i.e., to the first block) and combined with other signals in the first block. This shifting back can occur (for example) through (1) the carry vectors from compressor to compressor (compressors 240 or compressors 250), (2) the carry bit of the CPA 260, or (3) the output of the CPA 260 to the 3-2 compressor 250.

Any of the multiplexers employed in the DSP circuitry of this invention can be of the type that can selectively (i.e., controllably) output zero (0) data. This also includes any of the controllable shifters employed herein.

Figure 11:
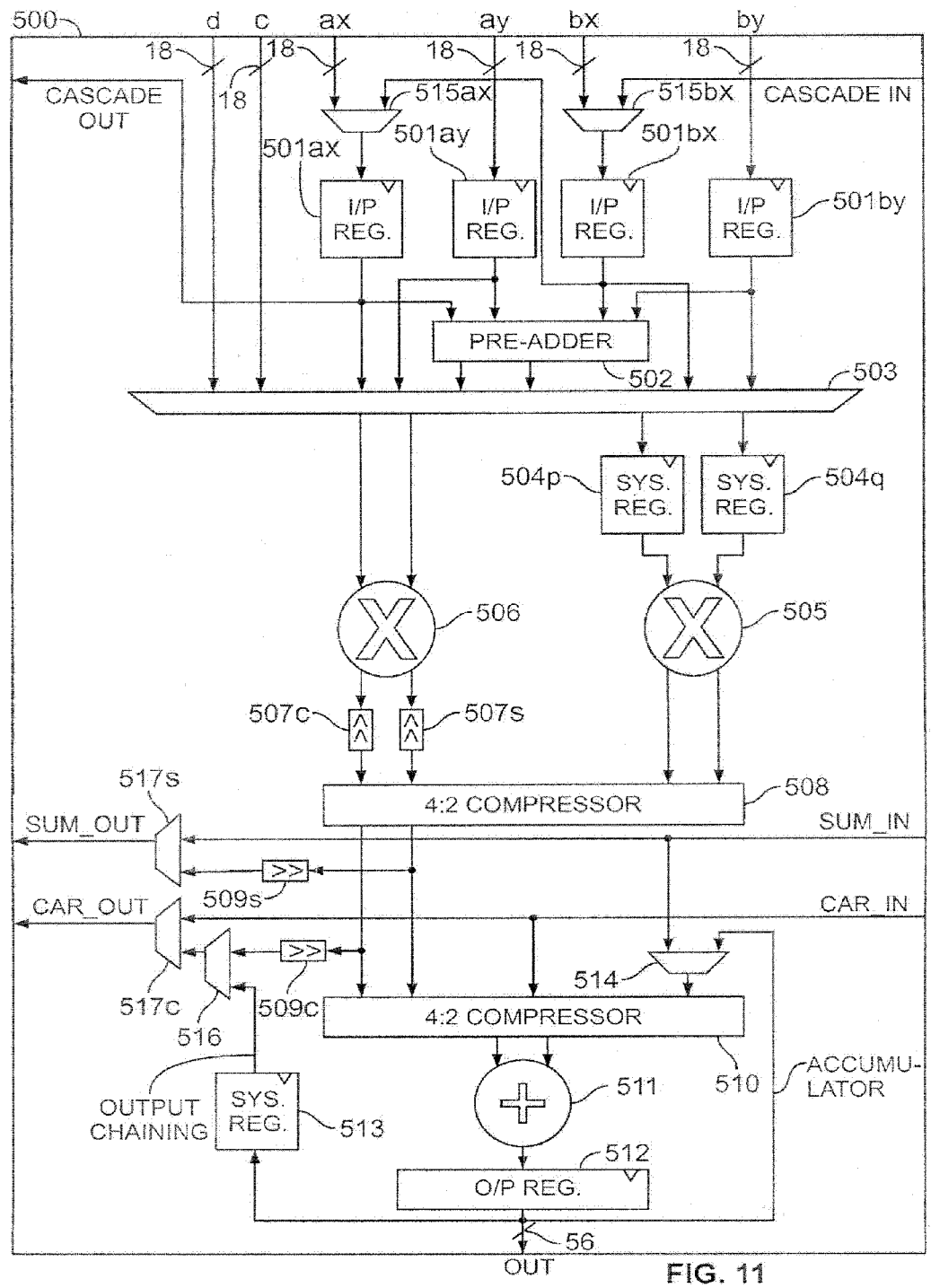
FIG. 11 is a simplified schematic block diagram of another illustrative embodiment of DSP block circuitry in accordance with certain further possible aspects of the disclosure.

Another illustrative embodiment of a DSP circuit block 500 in accordance with certain possible aspects of this disclosure is shown in FIG. 11. The inputs to DSP block 500 can be dynamic (e.g., electrical signals representing digital (binary) numerical values that are time-varying during normal (user mode) operation of the integrated circuit (e.g., 10) that includes the DSP block). Alternatively, some of the inputs to DSP block 500 can be static (e.g., electrical signals representing digital (binary) numerical values that are constant or relatively constant over time during normal operation of the integrated circuit). For example, inputs ax, ay, bx, and by may be dynamic inputs; inputs c and d may be static inputs. Static inputs may come from memory (e.g., so-called configuration random access memory or CRAM) on the IC that is programmed during an initial set-up (configuration or initialization) phase of operation of the IC (prior to subsequent normal or user mode operation of the IC). (An illustration of a static signal source is element 130 in FIG. 2. Another illustration of such a source is element 602 in FIG. 12.)

In the illustrative embodiment shown in FIG. 11, each of inputs ax, bx, ay, by, c, and d comprises a set (plurality) of 18 signals supplied (applied) in parallel. Although 18 is presently thought to be a highly desirable number, it will be understood that this number can be larger or smaller, if desired. This basic input bus width will be sometimes referred to as N in subsequent discussion herein. Thus N is 18 in the embodiment shown in FIG. 11 and similarly sized embodiments. But it will be understood that N can be larger or smaller than 18 in other embodiments in accordance with this disclosure.

Figure 12:
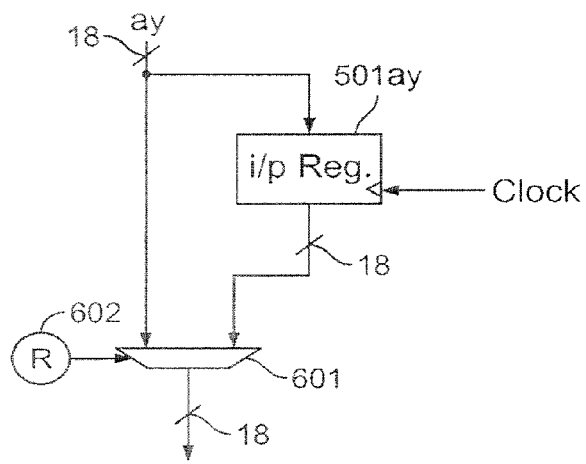
FIG. 12 is a simplified schematic block diagram of an illustrative embodiment of a representative portion of circuitry like that shown in FIG. 11 in accordance with certain possible aspects of the disclosure.

In the illustrative embodiment shown in FIG. 11, dynamic inputs have the option to be registered by input registers 501 (e.g., flip-flop circuits clocked by a clock signal). See also FIG. 12, which shows how typical inputs ay can be applied to typical registers 501ay, and also to one selectable set of inputs to multiplexer ("mux") circuitry 601. Registers 501ay register the ay signals applied to them in response to and in synchronism with an applied clock signal. After thus being registered, the registered ay signals are applied to a second selectable set of inputs to mux 601. Mux 601 can select either of its selectable sets of inputs to be its output signals, depending on the logical state (e.g., binary 1 or binary 0) of the selection control input signal applied to it from circuit element 602. For example, element 602 may be a CRAM element (similar, e.g., to elements like element 130 in FIG. 2). FIG. 12 thus shows how the outputs of mux 601 can be either registered or unregistered signals ay. FIG. 12 is illustrative of how all of registers 501 may be augmented with circuitry that allows the registers to be either used or bypassed.

Figure 13:
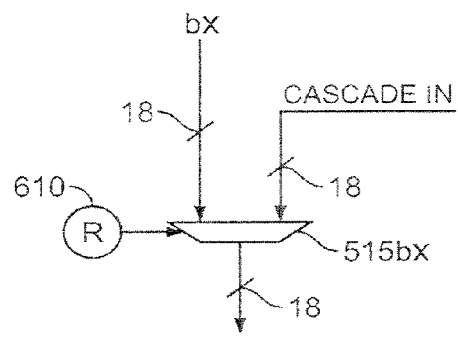
FIG. 13 is a simplified schematic block diagram of an illustrative embodiment of another representative portion of circuitry like that shown in FIG. 11 in accordance with certain possible aspects of the disclosure.

Certain inputs can be routed via an input cascade chain, if desired. For example, one set of inputs can be cascaded in from a similar DSP block 500 to the right of the depicted DSP block. Such cascade in inputs go to one selectable set of inputs to mux 515bx (see also FIG. 13). Depicted inputs bx are applied to the other selectable set of inputs to mux 515bx. Mux 515bx is controlled by a selection control input signal (e.g., from CRAM 610) to select either of its selectable input sets to be its outputs (depending on the logical state of the selection control input signal). This cascade chain continues through (selectively bypassable) registers 501bx, mux 515ax, (selectively bypassable) registers 501ax, to the cascade out leads, which go the next adjacent DSP block 500 to the left of the depicted DSP block. The depicted cascade out leads become the cascade in leads in the DSP block to the left. Thus all of the x inputs (i.e., ax and bx) from each module or block 500 form a cascade chain.

Figure 26:
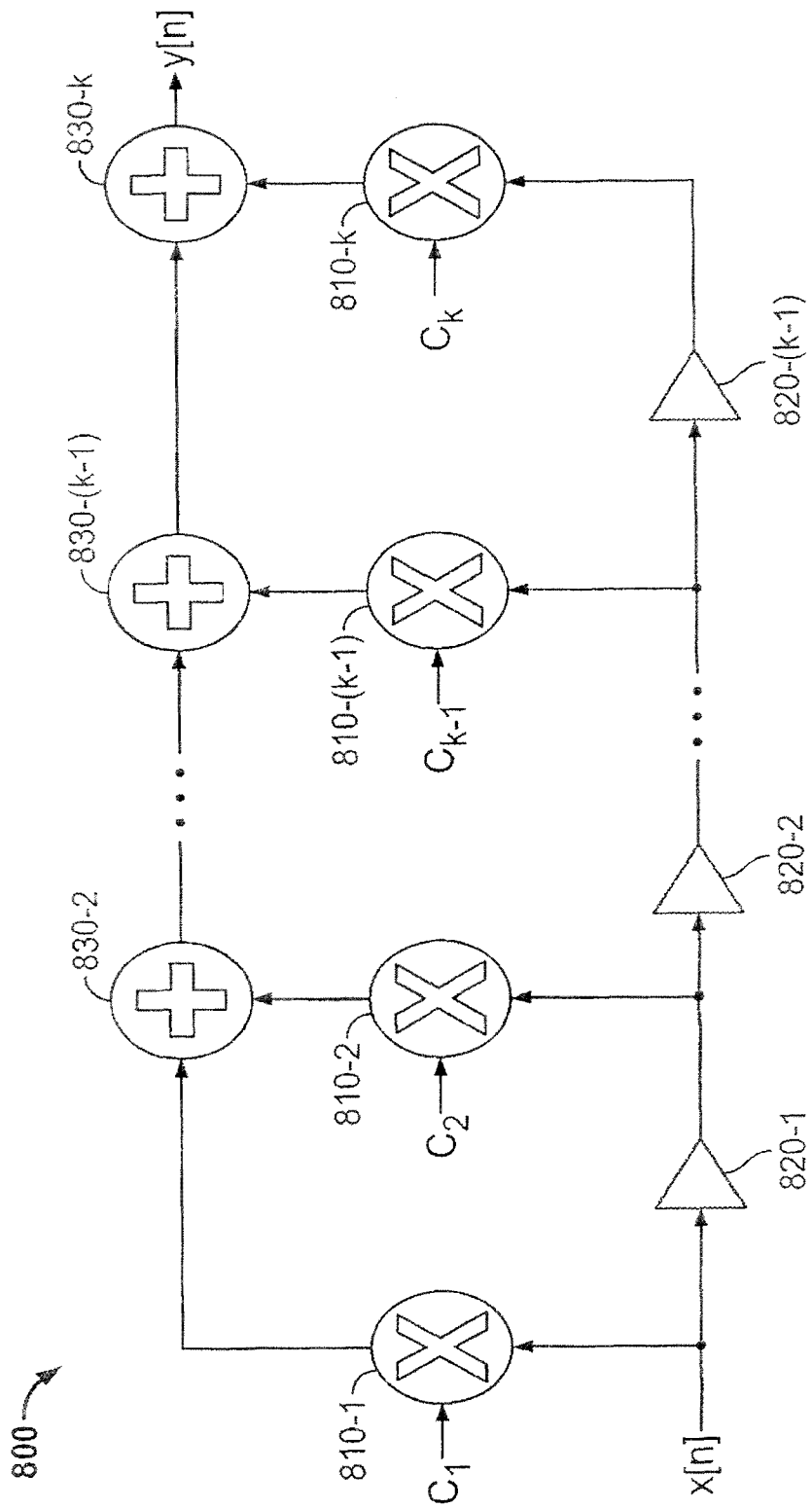
FIG. 26 shows known circuitry for implementing the FIG. 25 filter function.

An example of an application of the circuitry in which the immediately above-described cascade chain may be used is implementation of a finite-impulse-response ("FIR") digital filter. Such filters are discussed in more detail later is this specification. Here, however, it will be sufficient to note that FIG. 26 shows one form of such a filter in which successive samples x[n] of an input signal are successively delayed by one sample time period in each of successive sample delay elements 820-1, 820-2, etc. In each sample time period, each sample or delayed sample is multiplied by a respective filter coefficient c1, c2, etc., in a respective one of multipliers 810-1, 810-2, etc. The immediately above-described cascade chain can be used to provide the input sample delay chain shown along the bottom line in FIG. 26. Multipliers 505 and 506 in one or more DSP blocks 500 can provide the multiplications (by coefficients c1, c2, etc.) of the variously delayed input samples as shown across the middle of FIG. 26. Circuitry downstream from the multipliers 505 and 506 in these DSP blocks can provide some or all of the addition of multiplication products shown along the top line in FIG. 26. Again, additional discussion of FIR filters will be found later in this specification.

Circuitry 502 is pre-adder circuitry. It can add two of the dynamic inputs (e.g., ax and ay, or bx and by) together. The results of the pre-adder then go to controllable routing circuitry 503 to become two of several sets of possible inputs to the downstream multipliers (described later). Pre-adder 502 may provide a more cost-efficient and faster alternative to having the above-described addition done outside of DSP block 500. The eight possible sets of inputs to routing circuitry 503 are ax, bx, ay, by, c, d, (ax+ay), and (bx+by).

Figure 14:
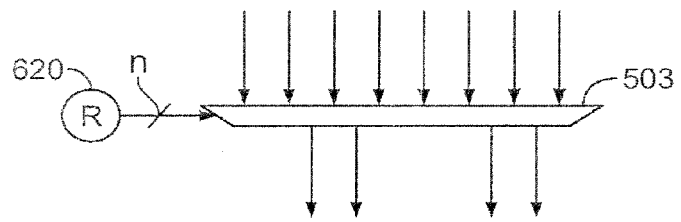
FIG. 14 is a simplified schematic block diagram of an illustrative embodiment of still another portion of circuitry like that shown in FIG. 11 in accordance with certain possible aspects of the disclosure.

Routing circuitry 503 (see also FIG. 14) is controllable (e.g., by signals from CRAM bits 620) to route signals from any of its sets of inputs to various ones of its output signal groups. In particular, the input-to-output routing performed by circuitry 503 is selected (chosen, controlled) by the logical states of the control signals that are applied to circuitry 503 (e.g., from CRAM bits 620). As just one example of such possible signal routings, circuitry 503 may route its c inputs to one of the groups of its outputs that ultimately go to multiplier circuitry 505, and its by inputs (which may have been registered by registers 501by) to the other of the groups of its outputs that ultimately go to multiplier circuitry 505. At the same time as the above routing is being provided, circuitry 503 may route its d inputs to one of its groups of outputs that go to multiplier circuitry 506, while routing its ay inputs (which may have been registered by register 501ay) to the other of its groups of outputs that go to multiplier 506. Again, the foregoing is only one example of many possible input-to-output signal routing patterns that circuitry 503 may provide.

Other possible routings will be apparent from the various ways in which multipliers 505 and 506 are described as being constructed and used in subsequent paragraphs in this disclosure. In particular, routing circuitry 503 can route any input signal to any multiplier input that needs to receive that input signal in order to accomplish any multiplication function that is described below. For example, to enable multiplier 505 to perform its part of the below-described 27×27 multiplication of 27 "x" bits by 27 "y" bits, circuitry 503 can route 27 bits from the 36 ax and bx inputs and 27 bits from the 36 ay and by inputs to multiplier 505. At the same time, to enable multiplier 506 to perform its part of this 27×27 multiplication, circuitry 503 can route the 18 more significant bits of the above-mentioned 27 "x" bits and the 18 more significant bits of the above-mentioned "y" bits to multiplier 506.

Figure 15:
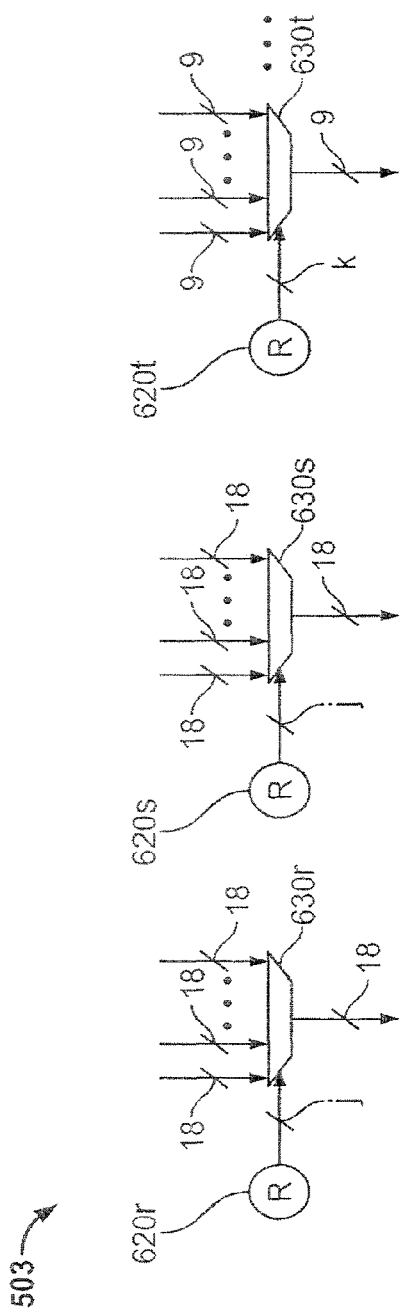
FIG. 15 is a more detailed, but still simplified, schematic block diagram of an illustrative embodiment of circuitry like that shown in FIG. 14 in accordance with certain possible aspects of the disclosure.

Although depicted like a single multiplexer ("mux") in FIG. 11, circuitry 503 may actually be an array or network of several multiplexers ("muxes"). For example, FIG. 15 shows that circuitry 503 may include a separate mux 630r, 630s, 630t, etc., for each group of outputs that it is desired to be able to select independently or at least partly independently. Each such mux has as its selectable inputs all the various input signal groups (or subgroups) from which that mux may need to select the signals to be output. Each mux 630 is controlled (e.g., by an associated subset of CRAM bits 620 (such as subset 620r controlling mux 630r)) to select the desired group of its inputs to be its outputs. If some group of inputs will never be needed as a particular group of outputs from circuitry 503, that input group can be omitted from the input groups available to the mux 630 that selects and provides that group of output. Similarly, some output groups shown in FIG. 11 may actually be composites of signals from two input groups (see, for example, the 27-bit output groups mentioned in the immediately preceding paragraph). Such composite output groups may be most conveniently provided by using two muxes 630 (e.g., one mux 630 providing the 18-bit portion of such a composite output group, and another mux 630 providing the 9-bit part of such a composite output group). Muxes 630 that need to handle only subsets of basic N-bit groups (e.g., the 9-bit groups that were just mentioned) have input bit and output bit group sizes that are smaller than N (e.g., 9-bit or 0.5N input and output groups). Moreover, each of these smaller input bit groups may come from predetermined portions of larger (N-bit) input groups. For example, such a predetermined portion may be the 9 less-significant bits of 18-bit input group ay, or the 9 more-significant bits of 18-bit input group ay. Thus, whereas FIG. 15 shows representative muxes 630r and 630s each receiving and outputting groups of 18 signals, FIG. 15 shows representative mux 630t receiving and outputting smaller groups of 9 signals.

From the foregoing it will be seen that circuitry 503 is preferably highly flexible routing circuitry that can connect any of its various, selectable, input signal groups (or subsets of such groups) to the various ones of its output signal groups that may need those inputs to support any of the multiplier functions that will be described later in this disclosure.

Figure 16:
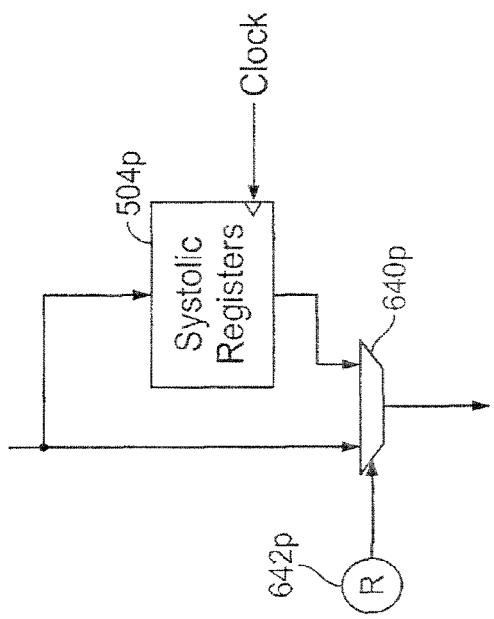
FIG. 16 is a simplified schematic block diagram of an illustrative embodiment of still another representative portion of circuitry like that shown in FIG. 11 in accordance with certain possible aspects of the disclosure.

Returning to FIG. 11, the output signal groups from circuitry 503 that go to multiplier circuitry 506 are shown as going directly to that multiplier. However, the output signal groups from circuitry 503 that go to multiplier circuitry 505 are shown as optionally passing through systolic delay registers 504. As shown in more detail in FIG. 16, the inputs to representative systolic delay registers 504p are also applied to one selectable set of inputs to multiplexer ("mux") circuitry 640p. The outputs of systolic registers 504p are applied to the other selectable set of inputs to mux 640p. A selection control input signal (e.g., from CRAM 642p) controls which set of its selectable inputs mux 640p outputs. Systolic registers 504p are clocked by an applied clock signal so that any signals passing through the systolic registers are delayed by one clock cycle. Representative mux 640p allows the signals applied to representative systolic registers 504p to either pass through those registers (thereby delaying those signals by one clock cycle) or to bypass those registers (thereby not delaying those signals). The purposes for which systolic registers 504 may be used will be described later in this specification.

The default condition of multipliers 505 and 506 is as two 18×18 multipliers. In general (i.e., in all modes of operation), each of multipliers 505 and 506 produces two product vectors in redundant form (e.g., one sum vector and one carry vector as described in more detail earlier for other embodiments). Thus in 18×18 mode, each multiplier 505 and 506 produces a 36-bit sum vector and a 36-bit carry vector. Circuitry downstream from multipliers 505 and 506 can be used to further process (e.g., additively combine) these vectors in various ways to produce one or more final products (or a final sum of products) as will be fully described later in this specification. Preliminarily, however, more will first be said about multiplier 505.

Figure 17:
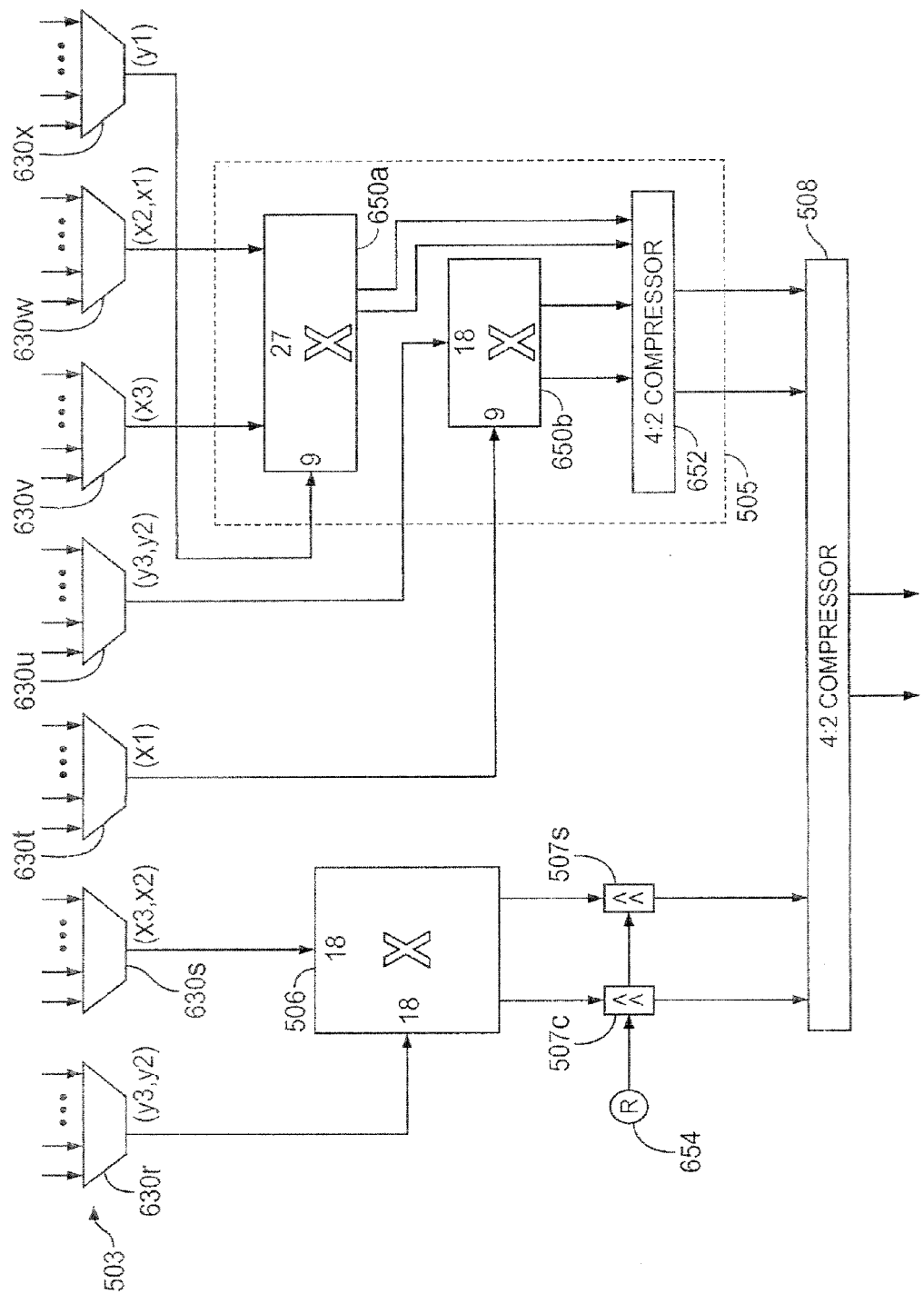
FIG. 17 is a simplified schematic block diagram of an illustrative embodiment of a further portion of circuitry like that shown in FIG. 11 in accordance with certain possible aspects of the disclosure.
Figure 18:
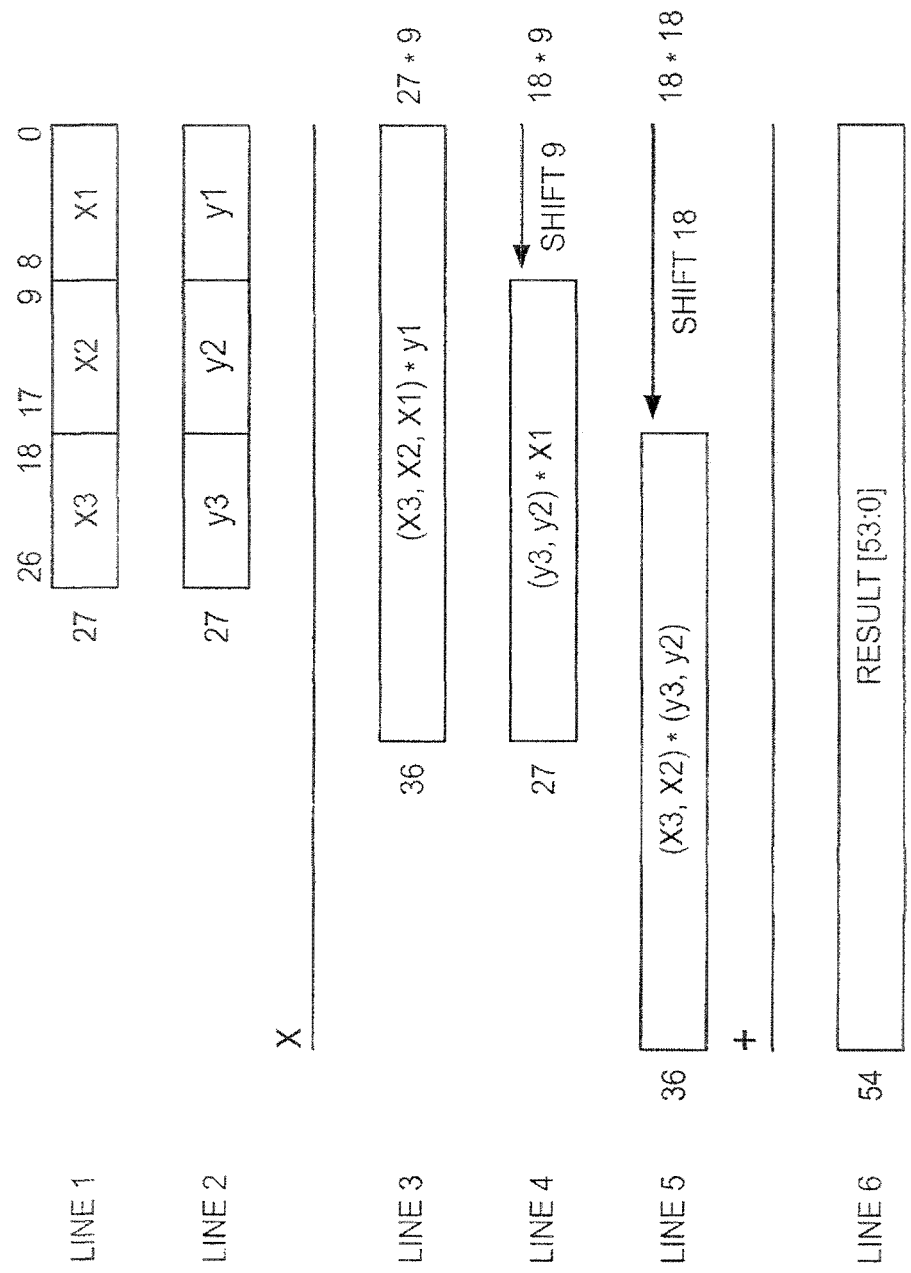
FIG. 18 is a simplified diagram illustrating certain aspects of performance of a DSP operation in accordance with certain possible aspects of the disclosure.

Multiplier 505 is modified (e.g., as compared to multiplier 506) so that, together, multipliers 505 and 506 can perform a 27×27 multiplication. FIGS. 17 and 18 show an illustrative embodiment for doing this. (Note that FIG. 17 omits depiction of systolic registers 504 because they are not used (i.e., they are bypassed) when a DSP block 500 is performing a 27×27 multiplication.)

As shown in FIG. 17, multiplier 505 includes a 9×27 multiplier circuitry part 650a and a 9×18 multiplier circuit part 650b. Multiplier 506 has the unmodified 18×18 construction. Assume that it is desired to multiply the 27-bit multiplicand (x3, x2, x1) by the 27-bit multiplier (y3, y2, y1). (See also the first two lines of FIG. 18.) Each segment of each of these 27-bit data words (i.e., each of x3, x2, x1, y3, y2, and y1) has 9 bits. The most arithmetically significant 9-bit segment in each of these words is the x3 or y3 segment. The least arithmetically significant 9-bit segment in each of these words is the x1 or y1 segment.

Routing circuitry 503 routes segments x3 and x2 to one axis (e.g., the multiplicand axis or inputs) of multiplier 506. Routing circuitry 503 routes segments y3 and y2 to the other axis (e.g., the multiplier axis or inputs) of multiplier 506. Routing circuitry 503 routes segments x3, x2, and x1 to the multiplicand axis or inputs of multiplier 650a. Routing circuitry 503 routes segment y1 to the multiplier axis or inputs of multiplier 650a. Routing circuitry 503 routes segments y3 and y2 to the multiplicand axis or inputs of multiplier 650b. Routing circuitry 503 routes segment x1 to the multiplier axis or inputs of multiplier 650b. Each multiplier circuit 506, 650a, and 650b multiplies the data applied to its multiplicand axis by the data applied to its multiplier axis. (Of course, it will be understood that the multiplicand and multiplier in a multiplication are interchangeable, so it does not matter which data is supplied as, or referred to as, the multiplicand, or which data is supplied as, or referred to as, the multiplier. The terms multiplicand and multiplier are therefore used arbitrarily and interchangeably herein. Reference to some data as a multiplicand or as a multiplier is not intended to be limiting in any way, and in other embodiments the opposite terms could be employed without departing from the scope or spirit of this disclosure.) Each multiplier 506, 650a, and 650b produces a redundant form sum output vector and a redundant form carry output vector, which are collectively indicative of the multiplication product formed by that multiplier. (Again, this redundant form (i.e., sum vector and carry vector) product formation is as described earlier in this specification.)

At this point it may be helpful to interrupt the discussion of FIG. 17 in order to consider FIG. 18, which shows the 27×27 multiplication being performed by the FIG. 17 circuitry. The first two lines of FIG. 18 show the multiplication to be performed (i.e., 27-bit multiplicand x3, x2, x1 in line 1, and 27-bit multiplier y3, y2, y1 in line 2). Line 3 in FIG. 18 shows the result of the 9×27 multiplication performed by multiplier 650*a*. Line 4 of FIG. 18 shows the result of the 9×18 multiplication performed by multiplier 650*b*. Note that the partial product that results from the 650*b* multiplication must be shifted 9 bits to the left in order for the bits in this partial product to line up (vertically) with bits having the same arithmetic significance in the multiplier 650*a* partial product. This shift can be accomplished by how the output leads of multiplier 650*a* and 650*b* enter 4:2 compressor circuitry 652 relative to one another. 4:2 compressor 652 (which can be similar to such compressor circuitry described earlier in this specification) receives the sum and carry vectors output by multipliers 650*a* and 650*b*, and produces further redundant form sum and carry vectors indicative of a further partial product that is the sum of lines 3 and 4 in FIG. 18. These further sum and carry vectors are the final outputs of multiplier 505.

The last major partial product that is needed for the 27×27 multiplication being considered is the partial product that results from the 18×18 multiplication shown in line 5 of FIG. 18. This partial product is formed by multiplier 506 in FIG. 17. As FIG. 18 shows, this partial product needs to be shifted 18 bit positions to the left (increased in arithmetic significance) relative to the partial product shown in line 3 of FIG. 18. This shift is performed by controllable shifter circuits 507*s* (for the redundant form sum vector output by multiplier 506) and 507*c* (for the redundant form carry vector output by multiplier 506). CRAM bit(s) 654 control whether elements 507 change the arithmetic significance of the data passing through them. As for other similar circuit elements used throughout this disclosure, a shifter circuit like 507*s* or 507*c* can shift the arithmetic significance of a data bit applied to it by controllably routing that bit to a shifter output lead that has a different (greater or lesser) arithmetic significance (relative position in a bus having several parallel data leads) than the arithmetic significance of the input lead on which that data bit was supplied to the shifter circuit. If no change in arithmetic significance is needed, then the shifter circuit is controlled to route the input data bit to a shifter output lead having the same arithmetic significance as the shifter input lead supplying that data bit. In the case of performing a 27×27 multiplication, shifter circuits 507*s* and 507*c* are controlled to shift the outputs of multiplier 506 18 bits to the left (thereby increasing the arithmetic significance of each bit in these outputs by 18 bit positions).

The outputs of multipliers 505 and 506 are applied to 4:2 compressor circuitry 508. This circuitry can again be similar to other compressor circuitry described earlier in this specification. Thus circuitry 508 compresses the two sum vectors and the two carry vectors applied to it down to one further sum vector and one further carry vector. These further vectors are indicative of the final product of the 27×27 multiplication being performed. In particular, these further vectors (output by compressor 508) are indicative of the result shown in line 6 of FIG. 18. That actual final result can be produced and output from DSP block 500 by the further elements of the DSP block that are downstream from compressor 508 in FIG. 11 and that are further described later in this specification. This shows how one DSP block 500 can perform one complete 27×27 multiplication.

Note that for the operations shown in FIG. 18 to perform correctly on "signed" operands (i.e., values like x and/or y that can be either positive numbers or negative numbers), it may be necessary for there to be "sign-extension" from the actual data shown (e.g., in lines 3 and 4) up to the most significant position of the result (e.g., in line 6). This may mean including 18 more leading bits of all 0s (e.g., for any positive number) or all 1s (e.g., for any negative number) to the left of the data shown in lines 3 and 4 in FIG. 18. As a general matter, sign-extension is a conventional technique that is well known to those skilled in the art. Accordingly, any required sign-extension is generally assumed herein to be present and is not actually shown in FIG. 18 (or any other FIGS. herein of a generally similar nature) to avoid unnecessarily complicating the drawings and/or obscuring the present disclosure. Examples of other FIGS. where sign-extension may be employed without actually being shown herein are FIGS. 5, 7, 9, 22, and 31. Sign-extension may also be employed for a certain area in FIG. 20, but that aspect of FIG. 20 is more specifically discussed later in this specification.

Figure 19:
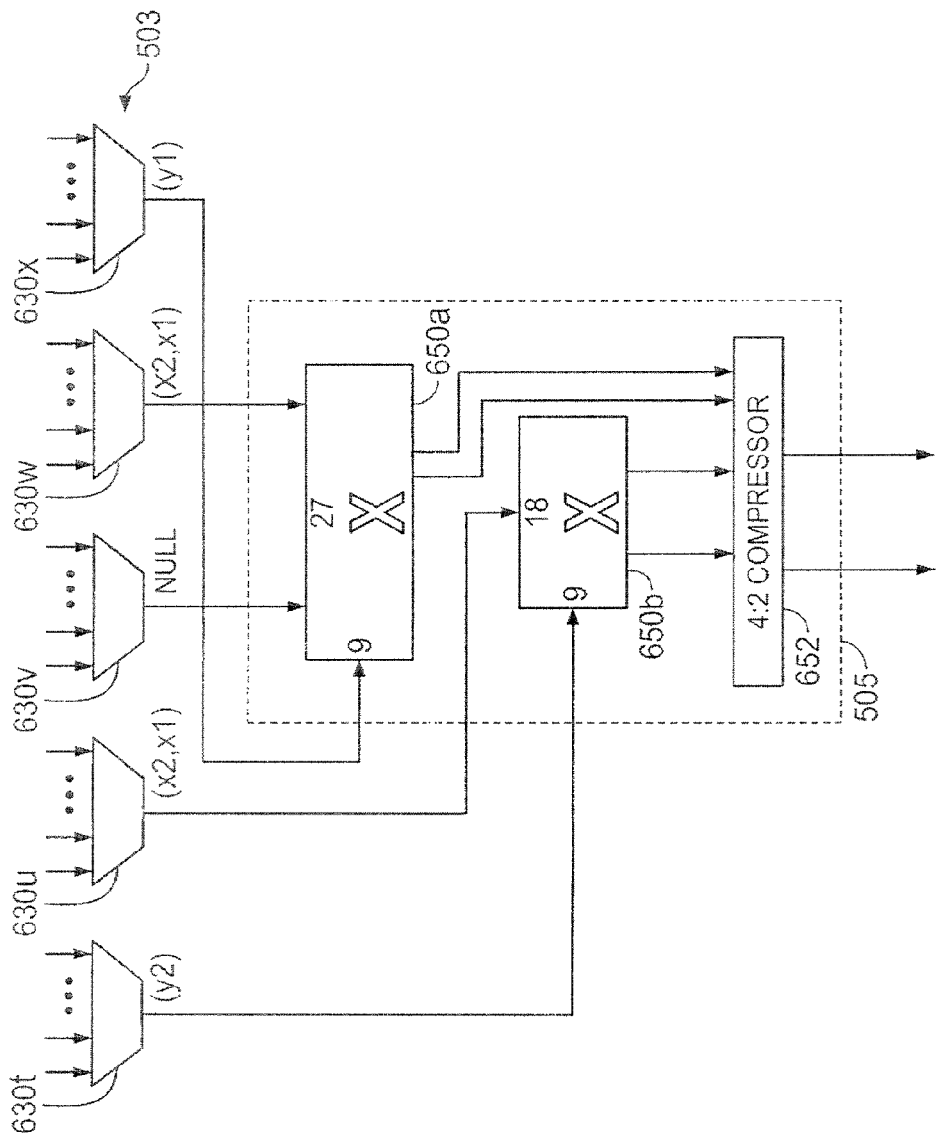
FIG. 19 shows another illustrative configuration of portions of the FIG. 17 circuitry in accordance with certain other possible aspects of the disclosure.

For completeness, FIG. 19 shows how the multiplier 505 portion of the FIG. 17 circuitry can be used when that multiplier 505 circuitry is only needed to perform an 18×18 multiplication (e.g., of x2 and x1 by y2 and y1). In this case, mux 630*u* in routing circuitry 503 selects 9-bit segments x2 and x1 for application to the 18-bit axis of multiplier 650*b*. Mux 630*w* also selects x2 and x1 for application to the 18 less significant inputs to the 27-bit axis of multiplier 650*a*. Mux 630*t* selects 9-bit segment y2 for application to the 9-bit axis of multiplier 650*b*. Mux 630*x* selects 9-bit segment y1 for application to the 9-bit axis of multiplier 650*a*. Null data is applied to the 9 more significant inputs to the 27-bit axis of multiplier 650*a*. (If the relevant operand (i.e., operand x) is an "unsigned" number, then the just-mentioned "null data" may be all binary 0s. For a "signed" operand, the most significant 9 bits of the 27-bit input should be the "sign-extension" from the lower-order (less significant) 18 bits. Thus (for a signed operand) the above-mentioned "null data" can be either all 1s (e.g., for a negative operand) or all 0s (e.g., for a positive operand). For convenience herein, the term "null," "null data," or the like is used for all of the various kinds of data referred to in this parenthetical, i.e., either (a) "sign-extension" data for a signed operand, or (b) leading 0s for an unsigned operand.)

FIG. 20 shows the operations that result from the data routing described in the preceding paragraph. In particular, the multiplication result shown in line 3 of FIG. 20 is produced by multiplier circuit 650*a*. (Note again that "null" in line 3 of FIG. 20 may refer to "sign-extension" data from the lower-order 27 bits in that line.) The multiplication result shown in line 4 of FIG. 20 is produced by multiplier circuit 650*b*. Compressor 652 produces the result (albeit in redundant form) shown in line 5 of FIG. 20. In this way multiplier circuit 505 can perform an 18×18 multiplication as an alternative to performing part of a 27×27 multiplication.

Figure 21:
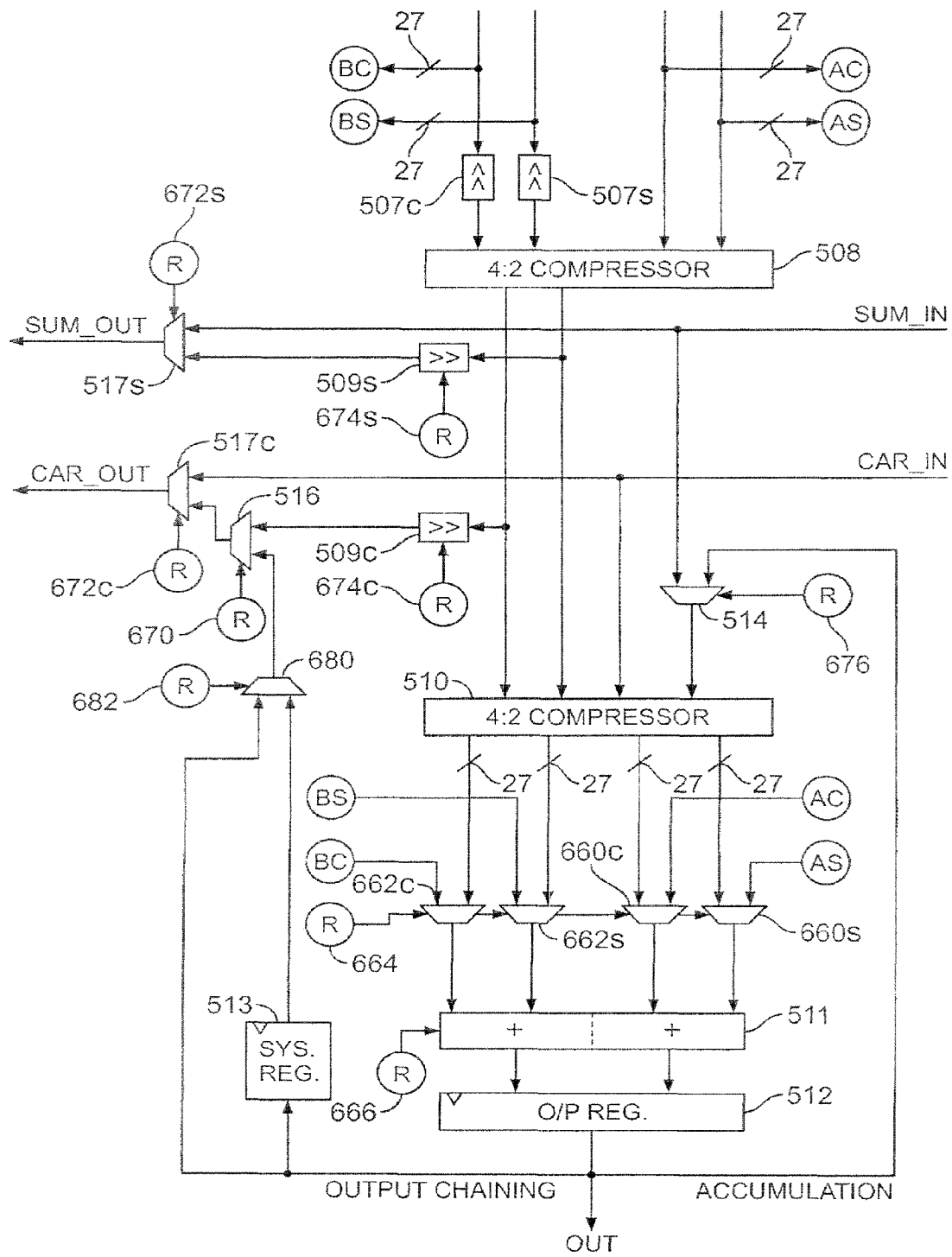
FIG. 21 is a simplified schematic block diagram of an illustrative embodiment of a still further portion of circuitry like that shown in FIG. 11 in accordance with certain possible aspects of the disclosure.

FIG. 21 shows the lower part of FIG. 11 in somewhat more detail. As has already been mentioned in connection with FIG. 17, circuitry 508 is a 4:2 compressor, which (like other similar 4:2 compressor circuitry throughout this disclosure) combines two applied redundant form sum vectors and two applied redundant form carry vectors to produce one redundant form output sum vector and one redundant form output carry vector. If the results of the multiplications performed by multipliers 505 and 506 are independent of each other, they can bypass blocks 508 and 510. For example, the 27 less-significant bits of the vectors from multiplier 505 can bypass blocks 508 and 510 via the AC and AS links shown in FIG. 21. (In FIG. 21 the upper circle AC is connected to the lower circle AC; the upper circle AS is connected to the lower circle AS; the upper circle BC is connected to the lower circle BC; and the upper circle BS is connected to the lower circle BS. These connections are shown in this way to reduce crowding in the drawing and also to reduce the amount of possibly confusing line cross-over in the drawing.) Similarly, the 27 less-significant bits of the vectors from multiplier 506 can bypass blocks 508 and 510 via the BC and BS links shown in FIG. 21. The outputs of the AC link are applied to one selectable set of the inputs to multiplexer circuitry ("mux") 660c. The 27 less-significant bits of the carry vector output by block 510 are applied to the other selectable set of inputs to mux 660c. The outputs of the AS link are applied to one selectable set of the inputs to mux 660s. The 27 less-significant bits of the sum vector output by block 510 are applied to the other selectable set of inputs to mux 660s. The outputs of the BC link are applied to one selectable set of inputs to mux 662c. The 27 more-significant bits of the carry vector output by block 510 are applied to the other selectable set of inputs to max 662c. The outputs of the BS link are applied to one selectable set of inputs to mux 662s. The 27 more-significant bits of the sum vector output by block 510 are applied to the other selectable set of inputs to mux 662s. CRAM 664 controls which selectable set of inputs each of muxes 660 and 662 selects as its outputs (i.e., muxes 660 and 662 output either their AC, AS, BC, and BS inputs, or they output their inputs from block 510). Adder 511 can be controlled to operate either as two separate (nominally) 27-bit adders (separated by the dotted line shown in FIG. 21), or as one (nominally) 54-bit adder (not separated at the dotted line). Such separation of adder 511 into two parts just means that arithmetic carry from right to left across the dotted line is disabled. If no such separation is desired, arithmetic carry across the dotted line is enabled. CRAM 666 controls whether carry across the dotted line is enabled or disabled, and therefore whether adder 511 operates as one large adder or as two, separate, smaller adders. This portion of the specification thus describes how multipliers 505 and 506 may be operated to produce two multiplication results that can be output separately (although in this embodiment each of those separate products is limited to 27 bits). The AC, AS, BC, and BS links are used to bypass blocks 508 and 510 in this mode of operation.

If rather than being kept separate, the results of the multiplications performed by multipliers 505 and 506 need to be added together, those results preferably go through compressor 508 before going to the final adder stage farther downstream. The result from multiplier 506 can be (optionally) left-shifted by 18 bit positions going through elements 507 before going into block 508. This controllably selectable left-shift option provides the flexibility of different multiplication configurations. The above-described 27×27 multiplication is one example in which compressor 508 is used to add together the results from multipliers 505 and 506, with the results from multiplier 506 first being shifted left 18 bit positions by operation of elements 507. Another example of use of compressor 508 (and elements 507) is 36×18 multiplication as will now be described beginning in the next paragraph.

Lines 1 and 2 of FIG. 22 show a 36×18 multiplication to be performed. This is multiplication two 18-bit data words x2 and x1 by 18-bit data word y1. The partial multiplication of x1 by y1 (line 3 in FIG. 22) is performed by multiplier 505 operating in the above-described 18×18 multiplication mode. The other partial multiplication of x2 by y1 (line 4 of FIG. 22) is performed in multiplier 506 in the same DSP block 500 as includes the just-mentioned multiplier 505. The left-shift by 18 bit positions shown in line 4 of FIG. 22 is performed by controllable shift elements 507 operating on the outputs of multiplier 506. Compressor 508 combines the outputs of multiplier 505 and elements 507 to produce redundant form sum and carry vectors indicative of the results shown in line 5 of FIG. 22. This result is, of course, the 54-product of the 36×18 multiplication of x2 and x1 by y1.

If no further operations need to be performed on the outputs of compressor 508, further 4:2 compressor circuitry 510 can be bypassed/disabled, and only final, carry-propagate adder ("CPA") circuitry 511 is enabled in order to send the final result to output register circuitry 512.

An advantage of the FIGS. 11-22 design is to efficiently combine multiple DSP blocks or modules 500 to perform more complex operations. The purpose of 4:2 compressor circuitry 510 is to take the two outputs from compressor 508, along with one or two vectors from another DSP module, and compress all of that data into two redundant form vectors, which become the inputs to final CPA 512. Two scenarios in which DSP modules 500 can be combined together by taking advantage of the inter-module connections sum_in/sum_out and car_in/car_out (where car is an abbreviation for carry) will now be described.

In the first scenario, multiplexer circuitry 516 (controlled by CRAM circuitry 670) is used to select the result "out" through the output chaining path. (This path extends from output registers 512, through mux 680 (controlled by CRAM 682), mux 516, and mux 517c (controlled by CRAM 672c).) In this way, two or more DSP modules 500 can be chained together through the car_in/car_out connections between adjacent ones of those modules 500. For example, the module 500 on the left as viewed in FIG. 23 can be used to add to its own internally generated results the results from the other adjacent module 500 on the right in that FIG.

A second scenario involving use of direct, dedicated, inter-DSP-block connections like sum_in/sum_out and car_in/car_out between adjacent DSP blocks 500 is as follows. In this scenario, sum and carry vectors from element 508 in one DSP block (instead of the final result from the output chaining including the output registers 512 in that block) are connected through the sum_in/sum_out and car_in/car_out tracks between adjacent blocks 500. This again allows a DSP block 500 (e.g., like the one on the left in FIG. 23) to combine (e.g., add together) its own internally generated results and results from another DSP block (e.g., the DSP block on the right in FIG. 23). However, this second scenario can result in better FMAX performance (maximum speed of operation) because the data do not have to go through the delay of blocks 510, 511, and 512 in one DSP block 500 (e.g., the one on the right in FIG. 23) before combining with the data in the next DSP block 500 (e.g., the one on the left in FIG. 23). However, this type of connection may be limited to chaining only a relatively small number (e.g., two) DSP blocks 500 together. Any applications that utilize only such a small number of DSP blocks 500 (e.g., two such blocks) may be able to achieve a better result with this approach. Controllable shift elements 509s and 509c (like other similar shift elements throughout this disclosure, and controlled by CRAM elements 674s and 674c, respectively) provide data shifting capability to steer (select) the correct data from the current DSP block 500 (e.g., on the right in FIG. 23) to the next DSP block 500 (e.g., on the left in FIG. 23).

Again, it will be remembered that muxes 517s and 517c (controlled by CRAM bits 672s and 672c, respectively (or possibly in tandem by one such CRAM bit)) are the so-called redundancy muxes. As just a brief reminder, these muxes allow data to flow via the sum_in/sum_out and car_in/car_out tracks from either (a) the DSP block 500 immediately adjacent a receiving DSP block 500, or (b) the DSP block 500 that is one block away from the receiving DSP block (e.g., in the event that the immediately adjacent DSP block is defective and therefore must be functionally replaced by the slightly more distant DSP block). In the representative configuration shown in FIG. 24, this redundancy capability means that "receiving" DSP block 500c can receive its sum_in and car_in signals from either the sum_out and car_out signals of immediately adjacent DSP block 500b, or from the sum_out and car_out signals of slightly more distant DSP block 500c.

To expressly state what should already be apparent, FIGS. 23 and 24 (like FIGS. 1, 6, 8, 10, 30 and 32) illustrate the point that an integrated circuit in accordance with this disclosure includes multiple instances (i.e., multiple identical or substantially identical repetitions) of DSP circuit blocks or modules (e.g., 100, 500, or the like). Thus terms like "DSP circuit block," "DSP block," "DSP module," etc., as used herein refer to an assembly of circuit elements that is suitable for identical or substantially identical repetition on an integrated circuit. At least some of the circuitry in such a DSP circuit block is preferably dedicated (i.e., hard-wired or at least partly hard-wired) to performing particular functions such as multiplication, redundant form sum and carry vector compression, addition, etc. Adjacent (or at least nearby) ones of these DSP circuit blocks may have "dedicated" connections between them. Examples of such dedicated inter-DSP-block connections are the sum_out/sum_in and car_out/car_in connections between adjacent blocks. Such dedicated inter-DSP connections are preferably usable only for conveying signals between DSP blocks.

Returning once again to FIG. 11 or FIG. 24, mux circuitry 514 (controlled by CRAM element 676) can be used to select the result from the previous operating (clock) cycle and combine it with (e.g., add it to) the result of the current operating (clock) cycle. (Each operating cycle typically takes place during one respective cycle of the clock signal that is used to clock the registers employed in the circuitry.) This accumulation path is optional in every DSP module 500.

Elements 504 and 513 are systolic delay registers. They can be used, for example, for 18-bit, systolic, finite-impulse-response ("FIR"), digital filtering applications. The principles of systolic FIR filters are described in the next several paragraphs.

FIR filters are widely used in DSP applications. The basic structure of a FIR filter is a plurality of parallel multiplications with addition of the resulting products. A FIR filter operation can be represented by the equation shown in FIG. 25. In the FIG. 25 equation $x[n-i-1]$ represents the sequence (succession) of input digital data samples (each sample being, e.g., an 18-bit binary word presented in parallel), $c[i]$ represents the filter coefficients (each coefficient being, e.g., an 18-bit binary word presented in parallel), and k−1 is the number of taps that the filter has.

Circuitry 800 for implementing (in so-called direct form) the FIR filter equation shown in FIG. 25 is shown in FIG. 26. In this FIG., elements 810 are multiplier circuitries, elements 820 are delay circuitries (each of which delays the data sample applied to it by the time duration of any one sample in the input sample stream $x[n]$), and elements 830 are adder circuitries. (The just-mentioned "time duration" is also typically the "period" of the clock signal that is used to clock registers used throughout the circuitry.)

Figure 27:
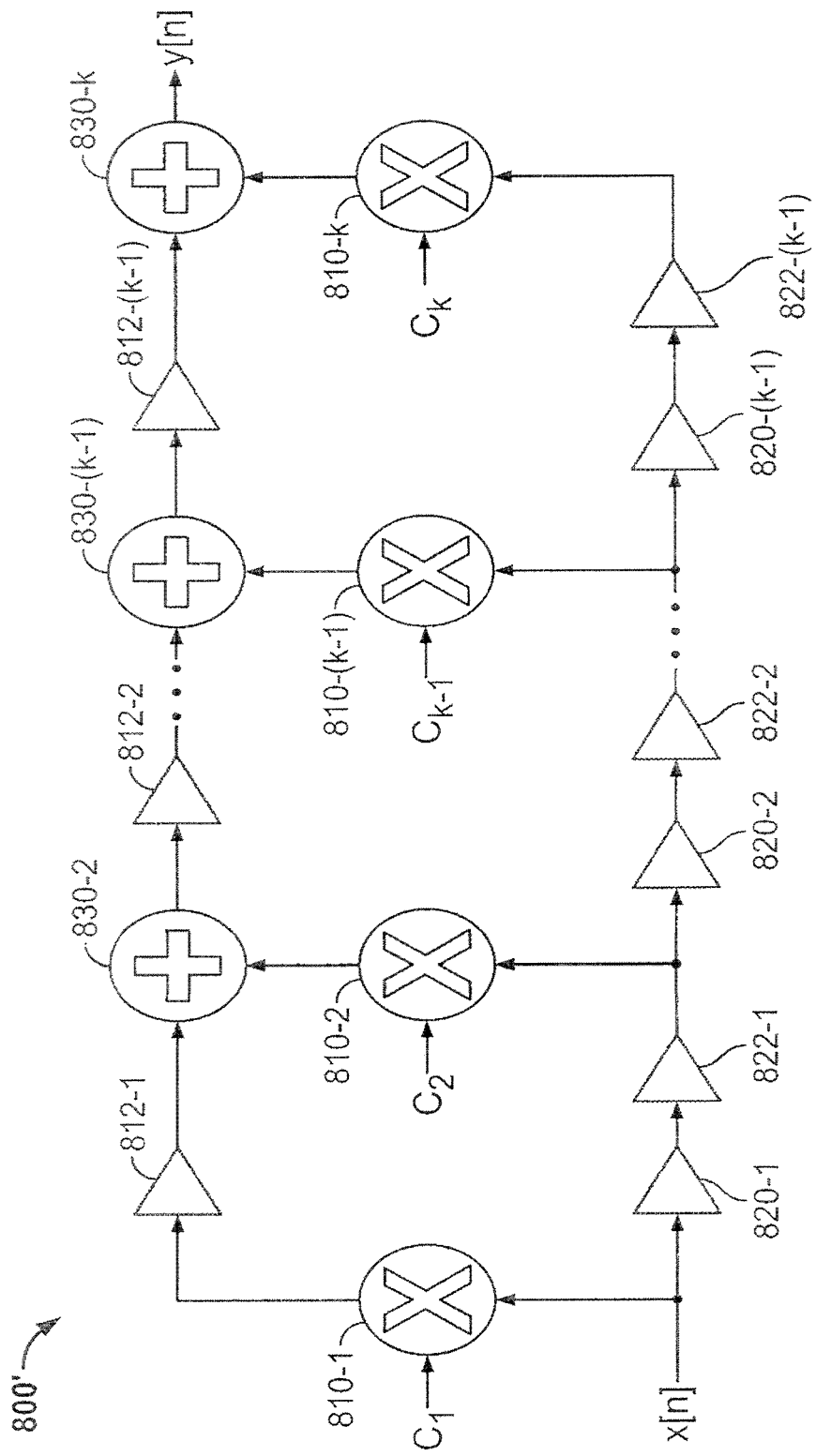
FIG. 27 shows alternative "systolic" circuitry for implementing the FIG. 25 filter function.

FIG. 26 shows that a FIR filter 800 in the direct form includes a large adder tree, which is formed by chaining adders 830. Depending on the number of taps (equal to the number of multipliers minus 1) and the input sample size (the number of bits in each input sample $x[n]$), the delay through adders 830 can become quite large. In order to overcome this possible performance issue, the systolic form 800' of the filter shown in FIG. 27 can be used. In particular, FIG. 27 shows that additional delay circuit elements 812 and 822 are placed per tap to increase the performance of the overall circuitry, albeit at the cost of increased latency (i.e., overall delay through the circuit from input $x[n]$ to output $y[n]$). More particularly, FIG. 27 shows an additional delay element 822 in the sample stream between each tap; and a matching, additional delay element 812 in the product-summing stream, also between each tap. In other words, additional delay element 812-1 "matches" or "corresponds to" additional delay element 822-1, additional delay element 812-2 matches or corresponds to additional delay element 822-2, and so on. All of delay elements 812, 820, and 822 preferably have the same delay (e.g., the period of one cycle in the clock signal that is used to clock registers throughout the circuitry, which "period" is also preferably equal to the duration of each successive sample in the input same stream $x[n]$).

Additional delay elements 812 and 822 may sometimes be referred to as systolic registers. Delay elements 812 break the otherwise long chain of adders 830 down into individual adders. Each adder 830 is therefore followed by a register 812 which registers the sum produced by that adder before passing that sum on to the next adder. This avoids having to operate the circuitry at the relatively slow speed that would otherwise be required for data to propagate all the way through a long adder chain in one operating (clock) cycle of the circuitry. Systolic filter 800' allows a faster clock to be used because each adder 830 can complete its addition operation relatively quickly, and the result of that addition is not needed or used by the next adder until the next clock cycle. Delay elements 822 are added to keep the propagation of data samples through the data sample path synchronized with the delayed propagation of product sums through the product-sum-accumulation path.

Although systolic filter 800' tends to have greater latency (overall delay through the filter from input $x[n]$ to availability of the corresponding output $y[n]$) than a direct form filter 800 with the same number of taps (due to the additional delays 812 and 822 in filter 800'), other circuitry (e.g., on an integrated circuit with the FIR filter) can benefit greatly (in terms of operating speed) from having a faster clock signal, which filter 800' permits the circuitry to have.

Figure 28:
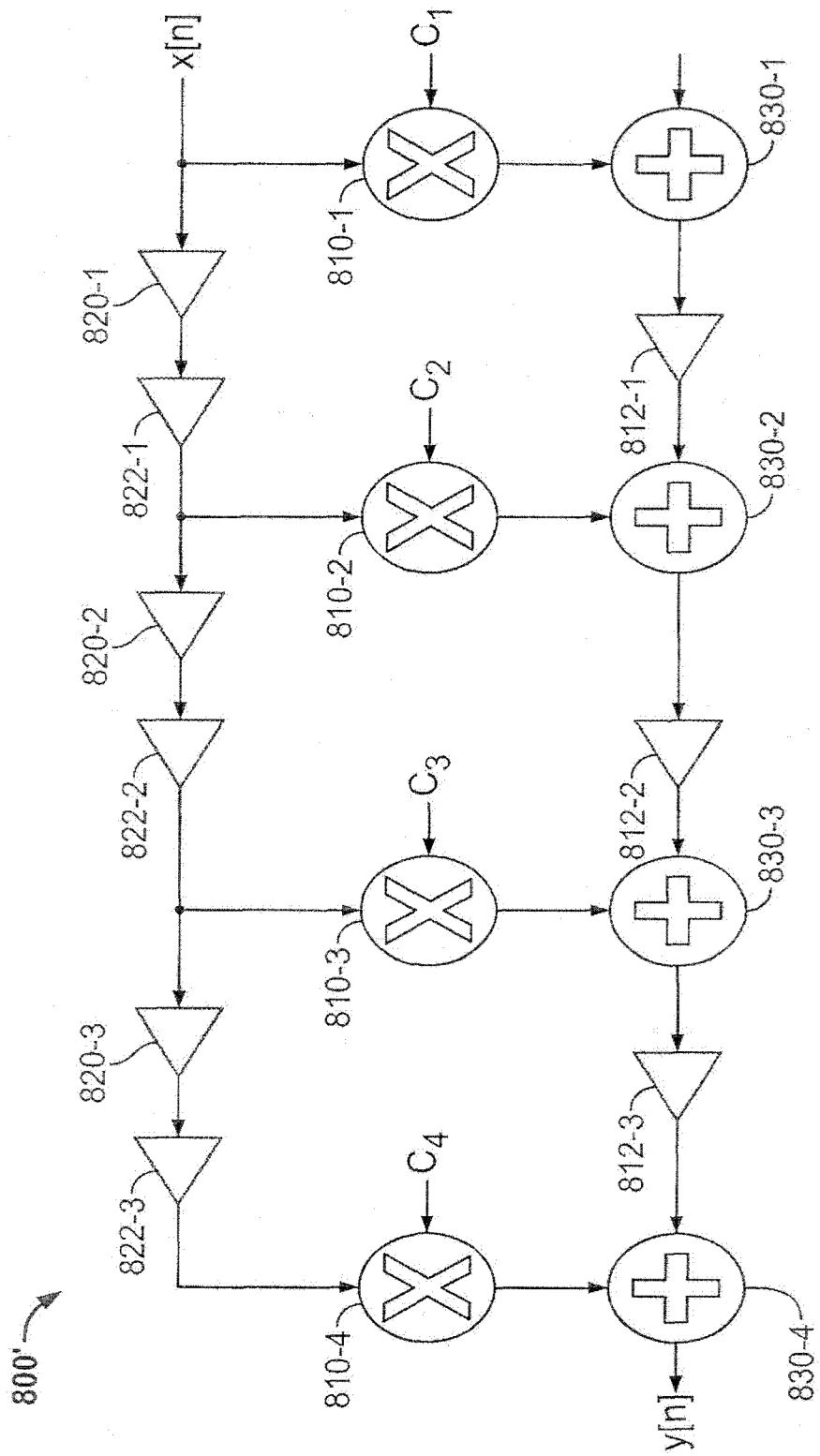
FIG. 28 is basically a redrawing of FIG. 27 to better correlate with other FIGS. herein.

To help better relate the immediately preceding discussion of systolic FIR filters like 800' in FIG. 27 to the earlier discussion of DSP blocks like 500, FIG. 27 is redrawn (with some small changes) in FIG. 28. The only differences between FIG. 28 and FIG. 27 are: (1) FIG. 28 is reoriented to better correlate with other FIGS. like FIG. 11; (2) FIG. 28 is made less general by omitting the FIG. 27 depiction of possible additional taps between multipliers 810-2 and 810-(k−1), and by showing only four immediately adjacent taps; and (3) FIG. 28 is made more general (or more modular) by showing another adder 830-1 in the lower right-hand corner.

Assume that each of multipliers 810 in FIG. 28 is an 18×18 multiplier (e.g., like a multiplier 505 or 506 in FIG. 11). It can then be efficient to perform the operations associated with each pair of two adjacent taps in FIG. 28 in one DSP block 500 constructed as shown, for example, in FIG. 11. The following discussion shows how this can be done.

Figure 29:
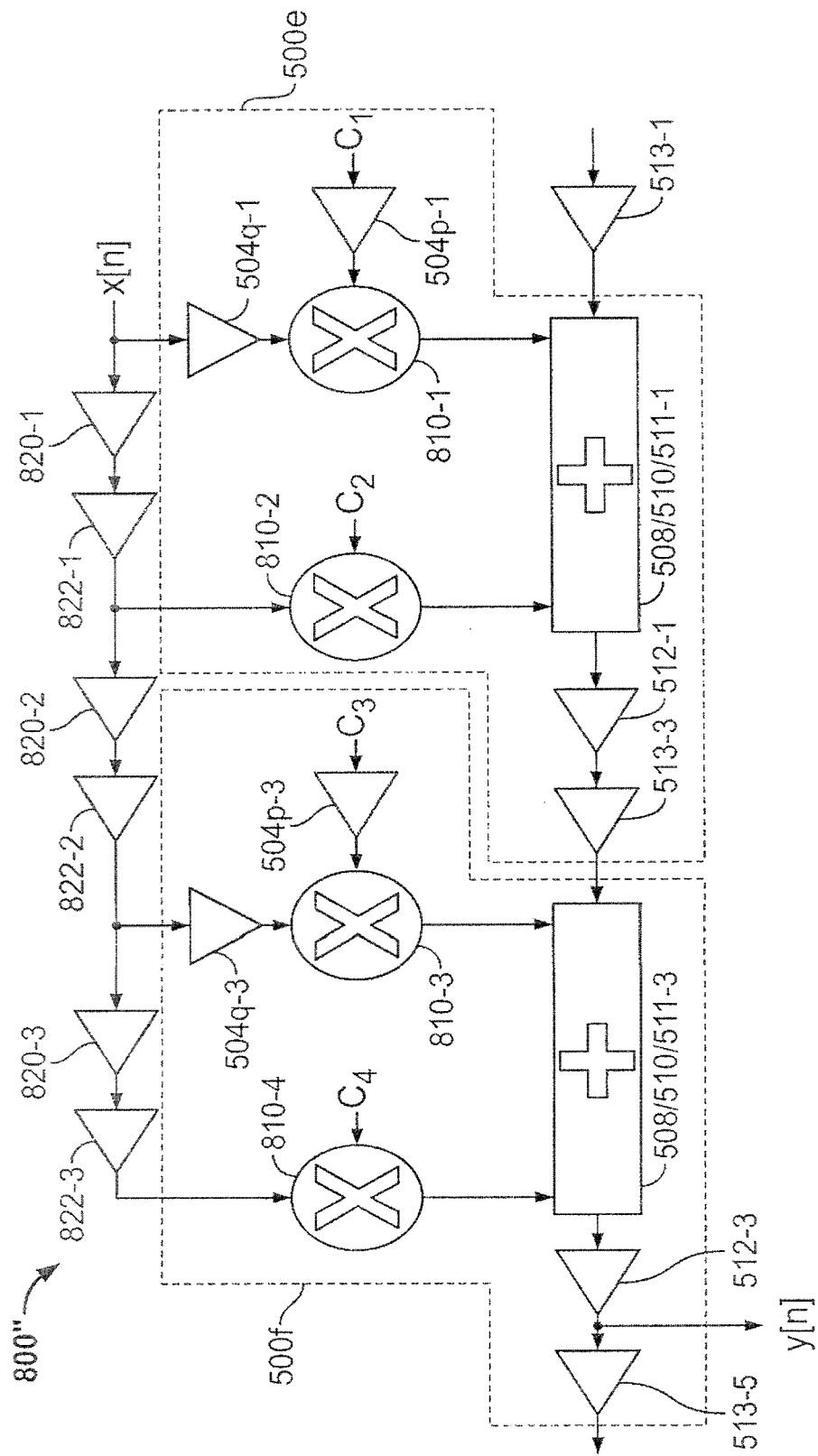
FIG. 29 shows another way that the functions shown in FIG. 28 can be implemented in accordance with certain possible aspects of the disclosure.

FIG. 29 shows circuitry 800" with the same capabilities as circuitry 800' in FIG. 28. In other words, FIG. 29 is an alternative implementation of the FIG. 28 circuitry that is functionally equivalent to the FIG. 28 circuitry. In FIG. 29, the function of systolic registers 812-1 (FIG. 28) is performed by systolic registers 504*p*-1, 504*q*-1, and 513-1 (although in the FIG. 29 example, systolic registers 513-1 are not used). Basically, the delay produced by systolic registers 812-1 between adders 830-1 and 830-2 in FIG. 28 is moved (in FIG. 29) upstream along all paths that feed the addition performed by adder 830-1. This enables the additions performed by adders 830-1 and 830-2 in FIG. 28 to be performed in one combined adder 508/510/511-1 in FIG. 29 (i.e., with no systolic delay like 812-1 being needed within composite adder 508/510/511-1). Similarly, the delay produced by systolic registers 812-3 in FIG. 28 is moved upstream to systolic registers 504*p*-3, 504*q*-3, and 513-3 in FIG. 29. Again, this enables the additions performed by adders 830-3 and 830-4 in FIG. 28 to be performed in one combined adder 508/510/511-3 in FIG. 29 (i.e., again with no systolic delay like 812-3 needed within composite adder 508/510/511-3).

With the foregoing as a starting point, the chain-dotted lines 500*e* and 500*f* in FIG. 29 can now be explained. Chain-dotted line 500*e* surrounds the elements in FIG. 29 that can be implemented by the circuitry of one DSP block 500 having the construction shown, for example, in FIG. 11. In particular, the following equalities of reference numbers show how the elements inside line 500*e* are implemented by the elements in a representative DSP block 500 as in FIGS. 11: 810-2=506; 504*p*-1=504*p*; 504*q*-1=504*q*; 810-1=505; 508/510/511-1=508, 510, and 511; 512-1=512; 513-3=513.

Chain-dotted line 500*f* surrounds the elements in FIG. 29 that can be implemented by the circuitry of another (one) DSP block 500, again having the construction shown, for example, in FIG. 11 and able to directly receive via its car_in inputs the outputs of the systolic registers 513 in DSP block 500*e*. Again, the following equalities of reference numbers show how the elements inside line 500*f* are implemented by the elements in this second ("another") instance of FIG. 11 DSP block circuitry 500: 810-4=506; 504*p*-3=504*p*; 504*q*-3=504*q*; 810-3=505; 508/510/511-3=508, 510, and 511; 512-3=512; 513-5=513.

The delay performed by elements 820 and 822 in FIG. 29 may be performed by register circuitry that is outside of DSP blocks like 500*e* and 500*f*, and that can appropriately delay the application of successive input data words x[n] to the various inputs to DSP blocks 500*e* and 500*f*. (Alternatively, some or all elements 820 and 822 may be implemented by registers that are included in DSP blocks that are otherwise like blocks 500*e* and 500*f*.)

The preceding paragraphs demonstrate how DSP blocks 500 constructed as shown, for example, in FIG. 11 can be used to efficiently implement systolic FIR filters if desired. Although FIG. 29 shows implementing a systolic FIR filter having four taps in two adjacent DSP blocks 500*e* and 500*f*, it will be understood that systolic FIR filters having any desired number of taps can be implemented in the same general way in the appropriate number of adjacent DSP blocks 500. For example, a 6-tap systolic FIR filter can be implemented in three adjacent DSP blocks 500; an 8-tap systolic FIR filter can be implemented in four adjacent DSP blocks 500; and so on. In each case, two adjacent taps of the systolic FIR filter ("a pair of adjacent taps" or "a pair of two adjacent taps") are implemented in one DSP block 500, and each DSP block 500 implements a respective one pair of such mutually exclusive pairs of taps. The DSP blocks are ordered in the same way that the taps in the pairs are ordered, all of which pairing and ordering of taps (from 1 to 4), and similar ordering of DSP blocks 500 (from e to f), are shown illustratively in FIG. 29.

We return now to consideration of the broader range of capabilities of DSP blocks 500. The following is a list of the major features that a single DSP block or module 500 can support:

1. Three 9×9 multiplications.
2. One 18×18 multiplication.
3. Two partial 18×18 multiplications.
4. One 27×27 multiplication.
5. One 27×27 multiplication with accumulation.
6. One 26×22 multiplication with one 25-bit pre-adder.
7. One 36×18 multiplication.
8. One sum of two 18×18 multiplications.
9. One sum of two 18×18 multiplications with accumulation.
10. One sum of two 18×18 multiplications with pre-adders.
11. One sum of square difference.
12. (a*b)+c, (a, b=18 bits each, c=36 bits).
13. One sum of two 18-bit systolic FIR filter taps.
14. One sum of two 18-bit systolic FIR filter taps with pre-adders.

In the case of three 9×9 multiplications (item 1 above), two 18×18 multipliers (blocks 505 and 506) can be configured as four 9×9 multipliers. However, the number of outputs (56) is only sufficient to support three 9×9 multiplication results (18 bits+18 bits+18 bits=54) bits). The same restriction applies to the case of two partial 18×18 multiplications (item 3) above, where only 28 bits (out of 36 bits) of the result of each 18 bit multiplication can be routed to the output (out) of the DSP module.

In the application of one 26×22 multiplication with one 25-bit pre-adder (item 6 above), the restriction comes from the number of inputs to DSP block 500. Even though DSP block 500 can support up to 27-bit multiplication, the number of dynamic inputs is only 72, which is only enough to support (25+25)*22.

One sum of square difference (item 11 above) can be implemented by enabling the pre-adders 502 and applying the results of the pre-adders to both inputs of the multipliers (505 and 506). Thus in this case the result of $(ax-ay)^2+(bx-by)^2$ can be obtained at the output.

The following is a list of features that can be supported when multiple DSP blocks or modules 500 are combined together:

a. Three 18×18 multiplications in two DSP modules.
b. Sum of four 18×18 multiplications.
c. Sum of two 27×27 multiplications.
d. Sum of two 36×18 multiplications.
e. Complex 18×18 multiplication (i.e., (a+bi)*(c+di), where a, b, c, and d are each 18 bits).
f. 36×36 multiplication.
g. 72×18 multiplication.
h. Complex 18×25 multiplication in three DSP modules (i.e., (a+bi)*(c+di), where a and b are each 18 bits, and c and d are each 25 bits).
i. Complex 27×27 multiplication (i.e., similar to item e above, except that a, b, c, and d are each 27 bits).
j. 54×54 multiplication.
k. Sum of two 18×18 multiplications with output chaining.
l. One 27×27 multiplication with output chaining.

One DSP module 500 is not sufficient to support the outputs of two 18×18 multiplications. However, two DSP modules 500 are sufficient to support the outputs of three 18×18 multiplications with one result distributed between the two modules.

For applications such as sum of two 36×18 multiplications (item d above), and 72×18 multiplication (item g above), two DSP blocks 500 are connected through the dedicated, direct, inter-module sum and carry tracks. The following discussion contains more information about how these connections work.

Figure 30:
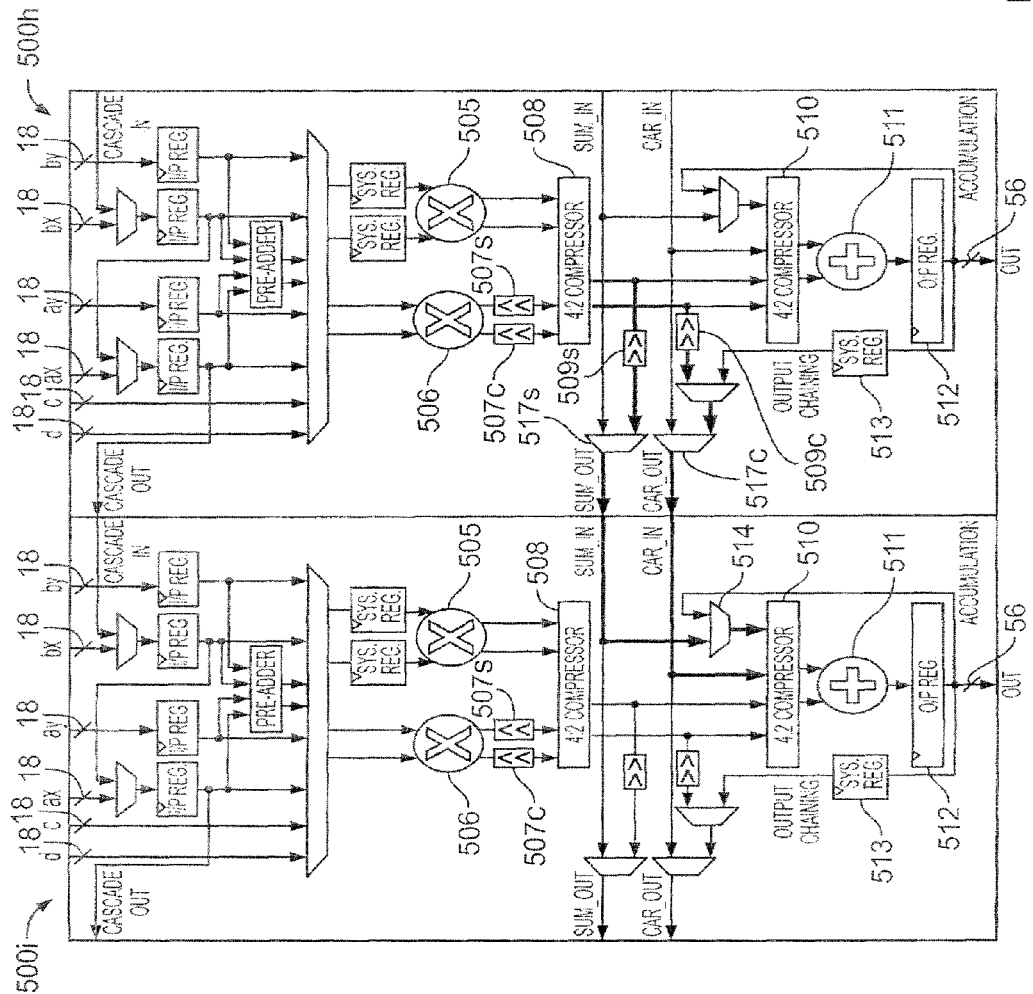
FIG. 30 shows two adjacent instances (on an integrated circuit) of circuitry like that shown in FIG. 21 in accordance with certain possible aspects of the disclosure.
Figure 31:
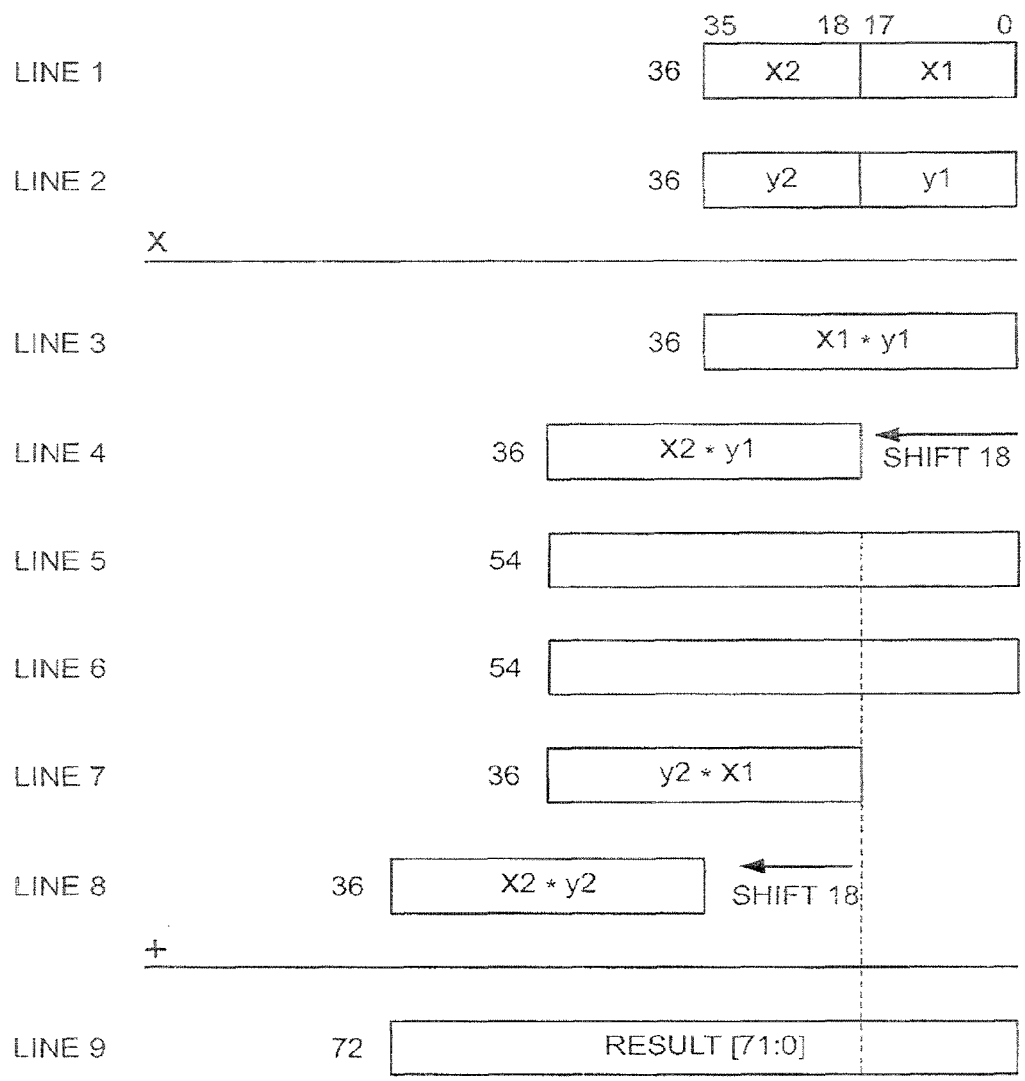
FIG. 31 shows an example of a DSP operation that can be performed in the FIG. 30 circuitry in accordance with certain possible aspects of the disclosure.

FIG. 30 shows two adjacent DSP blocks 500h and 500i. Each of these DSP blocks can be a respective instance of circuitry like that shown, for example, in FIG. 11. Some of the connections shown in FIG. 30 are emphasized by being drawn using heavier (thicker) lines. These include the direct, dedicated, inter-DSP-block connections that are used when the two depicted DSP blocks are being used together to perform certain functions that exceed the capacity of one DSP block 500 alone. An example is a 36×36 multiplication (item f) above. FIG. 31 shows how such a multiplication can be performed using the FIG. 30 circuitry. FIGS. 30 and 31 will now be further described for the example of the 36×36 multiplication shown in FIG. 31.

Line 1 of FIG. 31 shows the 36-bit multiplicand for the 36×36 multiplication to be performed. Line 2 of FIG. 31 shows the 36-bit multiplier for that multiplication. The less significant 18-bit sub-word x1 of the multiplicand and the less significant 18-bit sub-word y1 of the multiplier are applied to multiplier 505 in DSP block 500h for multiplication by that multiplier to produce the partial product shown in line 3 of FIG. 31. The more significant 18-bit sub-word x2 of the multiplicand and y1 are applied to multiplier 506 in DSP block 500h for multiplication by that multiplier to produce the partial product shown in line 4 of FIG. 31. Elements 507s and 507c in DSP block 500h are used to shift the redundant form sum and carry vectors output by multiplier 506 in DSP block 500h 18 bits to the left (to increase their arithmetic significance by 18 bit positions relative to the redundant form sum and carry vectors output by multiplier 505 in block 500h). This 18-bit left-shift of partial product x2*y1 is shown graphically in line 4 of FIG. 31. Compressor 508 in DSP block 500h compresses the four redundant form vectors it receives down to two redundant form vectors, i.e., the 54-bit sum vector shown in line 5 of FIG. 31, and the 54-bit carry vector shown in line 6 of FIG. 31.

The 18-bit portions of the data in lines 5 and 6 in FIG. 31 to the right of the dotted vertical line in that FIG. remain in DSP block 500h. In particular, these 18 least significant bits pass down through compressor 510 in block 500h to CPA 511 in that block. CPA 511 in block 500h converts this redundant form data to the least significant 18 bits of the non-redundant-form (or normal form) final result shown in line 9 of FIG. 31. DSP block 500h can output these 18 final result bits via its OUT leads.

The more significant 36-bit portions of the data in lines 5 and 6 in FIG. 31 (to the left of the dotted vertical line) are routed from the outputs of compressor 508 in DSP block 500h to DSP block 500i. In particular, the 36 more significant sum bits output by compressor 508 in block 500h are passed through controllable shifter element 509s in block 500h to shift that data 18 bit positions to the right to decrease the data's arithmetic significance by that amount as it enters DSP block 500i via the direct, dedicated, sum_out/sum_in connections (conductors or tracks) from block 500h to block 500i. (Mux circuitry 517s in block 500h is part of this routing.) Similarly, the 36 more significant carry bits output by compressor 508 in block 500h are passed through controllable shifter 509c in block 500h to shift that data 18 bit positions to the right to decrease its significance as it enters DSP block 500i via the car_out/car_in connections (conductors or tracks) from block 500h to block 500i. (Mux circuitry 517c in block 500h is part of this routing.) The redundant form data that DSP block 500i thus receives from DSP block 500h is routed to compressor circuitry 510 in block 500i. (Mux circuitry 514 in block 500i is part of this routing.)

The more significant 18-bit sub-word y2 of the multiplier and x1 are applied to multiplier 505 in DSP block 500i for multiplication by that multiplier to produce the partial product shown in line 7 of FIG. 31. Similarly, y2 and x2 are applied to multiplier 506 in DSP block 500i for multiplication by that multiplier to produce the partial product shown in line 8 of FIG. 31. Controllable shifter circuit elements 507s and 507c in DSP block 500i are used to shift the redundant form sum and carry vector signals output by multiplier circuitry 506 in DSP block 500i 18 bit positions to the left (to increase their arithmetic significance by 18 bit positions relative to the redundant form sum and carry vector signals output by multiplier 505 in block 500i). This 18-bit left-shift of partial product x2*y2 relative to partial product y2*x1 is shown graphically in line 8 of FIG. 31.

Compressor 508 in DSP block 500i reduces the four redundant form partial product vectors it receives from elements 505, 506, and 507 in block 500i to two redundant form vectors indicative of the sum of partial products y2*x1 and x2*y2. These two redundant form vectors from compressor 508 in DSP block 500i are applied to compressor 510 in block 500i. Compressor 510 in block 500i compresses the four redundant form vectors that it receives (two from compressor 508 in block 500i, and two from block 500h via the sum_out/sum_in and car_out/car_in tracks from block 500h to block 500i as described earlier) down to two redundant form vectors indicative of the sum of (1) partial product y2*x1, (2) partial product x2*y2, and (3) the 36 more significant bits of the sum of (a) partial product x1*y1 and (b) partial product x2*y1. The two redundant form vectors output by compressor 510 in DSP block 500i are applied to CPA 511 in block 500i, which combines those two vectors to the 54 more significant bits of the non-redundant-form (or normal form) final result shown to the left of the dotted line in line 9 of FIG. 31. These 54 more significant final result bits can be output by DSP block 500i via its OUT leads.

The foregoing demonstrates how two DSP blocks 500h and 500i can be used to perform a full 36×36 multiplication, with the 18 less significant bits of the final product being output by DSP block 500h, and with the 54 more significant bits of the final product being output by DSP block 500i.

Figure 32:
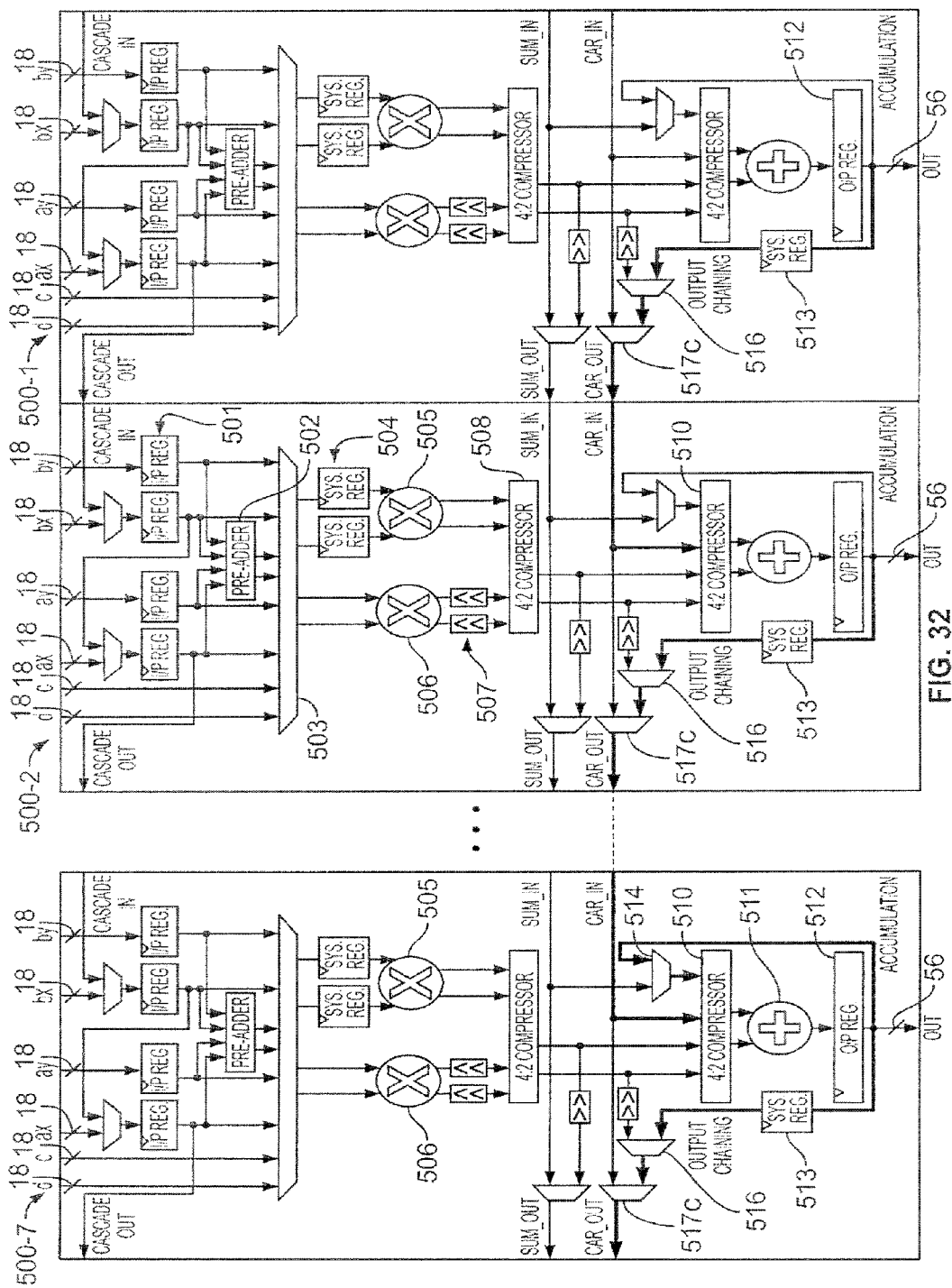
FIG. 32 shows multiple adjacent instances (on an integrated circuit) of circuitry like that shown in FIG. 11 in accordance with certain possible aspects of the disclosure.

For applications such as sum of four 18×18 multiplications (items b above) and sum of two 27×27 multiplications (item c above), the result can be achieved by combining two DSP modules 500 through either the sum and carry direct, dedicated, inter-DSP-module connections (i.e., sum_out/sum_in and car_out/car_in) as illustratively shown and described above in connection with FIGS. 30 and 31, or through output chaining connections as illustratively shown in FIG. 32 and described below.

FIG. 32 shows several DSP blocks 500-1 through 500-7 that are preferably adjacent to one another (e.g., in the relative positions to one another that are shown in FIG. 32) on an integrated circuit. Each of these DSP blocks can be a respective instance of circuitry like that shown, for example, in FIG. 11. Some of the connections shown in FIG. 32 are emphasized by being drawn using heavier (thicker) lines. These include connections between adjacent DSP blocks 500 that can be used when it is desired to chain the final output (OUT) of one DSP block 500 directly into intermediate circuitry of another adjacent DSP block for combination with signal processing that is in progress in the second ("another" or "receiving") DSP block. Like the earlier-described sum_out/sum_in and car_out/car_in connections, these output chaining connections are preferably direct, dedicated, inter-DSP-block connections. This means, for example, that these direct, dedicated connections do not make use of the more general-purpose signal routing circuitry on the integrated circuit that includes the DSP blocks. In other words, these connections are dedicated to only conveying signals between instances of DSP circuit blocks (e.g., DSP blocks 500). In the illustrative embodiments being described, the direct, dedicated output chaining connections are made (in part) via the previously described car_out/car_in connections from each DSP block 500 to the next adjacent DSP block 500.

In the illustrative embodiment shown in FIG. 32, the emphasized output chaining routing from DSP block 500-1 to DSP block 500-2 extends from the node in block 500-1 that can receive signals from the output registers 512 in block 500-1. (This may be referred to as the OUT node of block 500-1.) This routing extends through (optionally usable) systolic registers 513 in block 500-1, mux circuitries 516 and 517c in block 500-1, and onto the car_out leads of block 500-1 that connect to the car_in leads of block 500-2. As previously described, signals on the car_in leads of a DSP block 500 are applied (inter alia) to the compressor circuitry 510 in that DSP block. Thus the output chaining routing from DSP block 500-1 to DSP block 500-2 includes application of the car_in signals received by block 500-2 from block 500-1 to the compressor 510 in block 500-2. Compressor 510 in block 500-2 is thus the "intermediate circuitry" in block 500-2 that can receive outputs of block 500-1 chained into block 500-2 for combination with the results of other signal processing performed in block 500-2 by elements upstream from compressor 510 in block 500-2. Note that this output chaining does not convey outputs from source block 500-1 to the most upstream inputs (e.g., ax, ay, bx, by) of receiving block 500-2. On the contrary, the output chaining from source block 500-1 enters receiving block 500-2 at an intermediate point in the circuitry of receiving block 500-2. This leaves all the most-upstream inputs (ax, ay, bx, by) of receiving block 500-2 available for other (non-output-chained) inputs. It also leaves other upstream circuitry (e.g., elements 501, 502, 503, 504, 505, 506, 507, and 508) of receiving block 500-2 available for processing those other (non-output-chained) inputs. Then the results of that processing of other inputs by the upstream elements in receiving block 500-2 can be combined with the output-chained inputs (received from the OUT node of source block 500-1 via the car_out/car_in link from block 500-1 to block 500-2) in the more downstream elements in block 500-2 (i.e., starting with the intermediate circuit element compressor 510 in DSP block 500-2).

FIG. 32 shows (by additional emphasized (thicker) connection lines) that the output chaining can continue from DSP block 500-2 to the next adjacent DSP block 500-3 (not actually shown in FIG. 32). In block 500-2 this continued output chaining (nominally) starts at the OUT node of block 500-2 and passes through that block's elements 513, 516, and 517c to the car_out output leads of block 500-2 (which are directly connected to the car_in inputs to block 500-3).

FIG. 32 still further shows (using the illustrative example of DSP block 500-7) that output chaining may include accumulation of successive results (respectively produced in successive clock cycles of the circuitry). Thus in block 500-7 the OUT node signals are routed back (via mux circuitry 514) to compressor 510 in block 500-7. This allows the elements 510, 511, and 512 in block 500-7 to combine (e.g., add together) and accumulate from each clock cycle to the next clock cycle (1) outputs of the more upstream circuitry (e.g., 505 and 506) in block 500-7, (2) outputs chained in from another, adjacent, "source" DSP block 500-6 (not actually shown), and (3) the final outputs produced by DSP block 500-7 during the immediately preceding clock cycle. FIG. 32 also shows that the results of such accumulator operation by block 500-7 can be "output chained" on to the next adjacent DSP block 500-8 (not shown) via elements 513, 516, and 517c in block 500-7.

It is emphasized that although FIG. 32 shows the output chaining going through the systolic registers 513 in each DSP block 500, those registers can either be used to delay the chained signals or not, as desired by the user of the circuitry. In other words, actual use of registers 513 for added signal delay is optional (see, again, FIG. 16).

As an example of use of the circuit arrangements like those shown and emphasized in FIG. 32, a sum of four 18×18 multiplications (item b above) can be obtained at the output of DSP block 500-2, with each of DSP blocks 500-1 and 500-2 set to calculate a sum of two 18×18 multiplications.

In general (with continued reference to FIG. 32), any number of "adjacent" DSP modules 500 can be connected together via the output chaining path. ("Adjacent" is quoted in the preceding sentence because the redundancy muxes 517 in each DSP module 500 allow a module to be skipped or bypassed (e.g., if it is not functioning properly). This principle applies to all references to "adjacent" DSP blocks or modules throughout this disclosure.) The summation of all the results can be obtained at the last DSP module 500 at the end of the chain. Note again that the path between the OUT node and mux circuitry 514 in DSP block 500-7 (for example) can be enabled to incorporate the accumulation feature with the output chaining.

Still referring to FIG. 32, complex 18×18 multiplication (item e above) or complex 27×27 multiplication (item i above) can be implemented using two sets of sum of two 18×18 or 27×27 multiplications (item b or item c above), with one set doing the addition (i.e., of ad and be in the imaginary part adi+bci of the complex product), and with the other set doing the subtraction (i.e., of ac−bd in the real part of the complex product). Complex 18×25 multiplication (item h above) can be implemented by using four DSP modules 500 with the same setting as complex 27×27 multiplication. 54×54 multiplication (item j above) can be implemented with four DSP modules 500 utilizing both the sum and carry direct connections and the output chaining direct connections.

Figure 33:
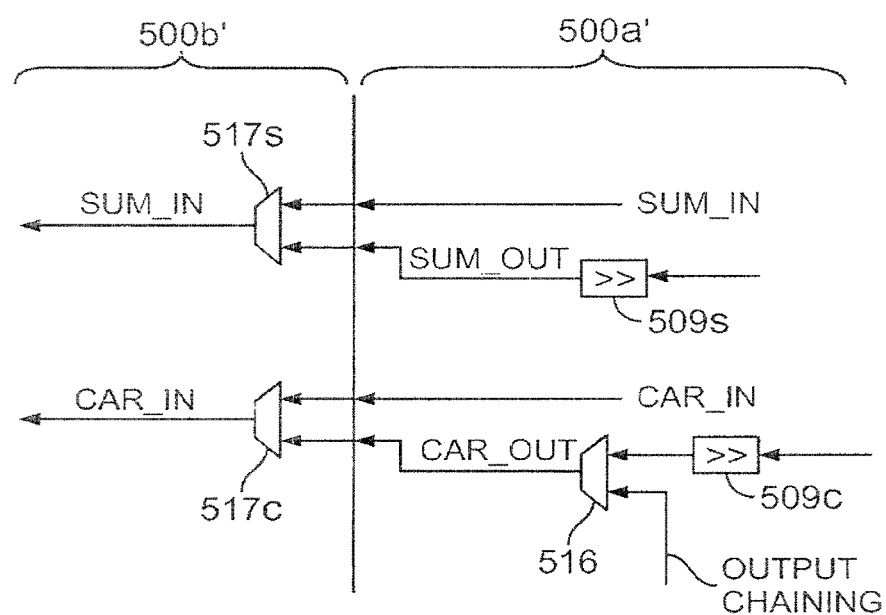
FIG. 33 is a simplified schematic block diagram of representative portions of illustrative circuitry in accordance with certain possible aspects of the disclosure.

Although FIGS. like FIG. 11 and FIG. 21 show redundancy multiplexers like 517s and 517c at or near outputs of DSP blocks 500, such redundancy muxes can instead be at or near inputs to such DSP blocks. For example, FIG. 33 shows portions of two adjacent DSP blocks 500a' and 500b' illustrating this possible modification. In particular, instead of redundancy muxes 517s and 517c being at or near outputs of DSP block 500a', those muxes have been moved to the input side of DSP block 500b'. In all other respects, DSP blocks like 500a' and 500b' can be like the DSP blocks 500 shown and described elsewhere in this specification.

As another illustration of how the locations and/or order of various elements can change without departing from the scope and spirit of this disclosure, systolic register circuitry 513 can be moved to any other suitable point along the output chaining path in (e.g.) FIG. 21. For example, systolic register circuitry 513 and the associated bypass elements 680 and 682 can be moved to a point along the output chaining path that is just prior to that path entering the next downstream DSP block.

Recapitulating some aspects of the foregoing, and also in some respects extending what has been said, a digital signal processing ("DSP") circuit block (e.g., 500 in FIG. 11; 500b in FIG. 24) may include a first multiplier circuit (e.g., 506) that can perform a first N-bit by N-bit ("N×N") multiplication (e.g., an 18×18 multiplication); a second multiplier circuit (e.g., 505) that can perform a second N×N multiplication; first shifter circuitry (e.g., 507c/507s) for shifting outputs of the first multiplier circuit by a selectable one of (1) zero bit positions and (2) N bit positions toward greater arithmetic significance; first compressor circuitry (e.g., 508) for additively combining outputs of the first shifter circuitry and the second multiplier circuit; circuitry (e.g., SUM_OUT/CAR_OUT leads) for routing outputs of the first compressor circuitry to a first other DSP circuit block (e.g., 500c in FIG. 24) that is adjacent to the DSP circuit block; and second compressor circuitry (e.g., 510) for additively combining outputs of the first compressor circuitry and outputs received from a second other DSP circuit block (e.g., 500a in FIG. 24) that is adjacent to the DSP circuit block.

A DSP circuit block as recapitulated above may further include adder circuitry (e.g., 511) for additively combining outputs of the second compressor circuitry. Such adder circuitry may comprise carry-propagate adder circuitry.

A DSP circuit block as recapitulated above may further include first register circuitry (e.g., 512) for registering outputs of the adder circuitry.

A DSP circuit block as recapitulated above may further include first, second, third, and fourth pluralities of data signal input leads (e.g., ax, ay, bx, by) for supplying inputs for processing by the multiplier circuits; and pre-adder circuitry (e.g., 502) for additively combining the inputs from at least two of the pluralities of data signal input leads.

A DSP circuit block as recapitulated above may further include circuitry (e.g., 503) for selecting outputs of the pre-adder circuitry as an alternative to inputs from at least one of the pluralities of data signal input leads for processing by at least one of the multiplier circuits.

A DSP circuit block as recapitulated above may further include selectively usable systolic register circuitry (e.g., 504p, 504q) in input data signal paths to one of the multiplier circuits.

A DSP circuit block as recapitulated above may further include selectively usable systolic register circuitry (e.g., 513) in output data signal paths for data output by the second compressor circuitry.

A DSP circuit block as recapitulated above may further include circuitry (e.g., 512) for registering signals indicative of outputs of the second compressor circuitry; and circuitry (e.g., 514) for selectively applying outputs of the circuitry for registering to inputs of the second compressor circuitry for additive combination by the second compressor circuitry with the outputs of the first compressor circuitry.

In a DSP circuit block as recapitulated above the circuitry for routing may include second shifter circuitry (e.g., 509s/509c) for shifting the outputs of the first compressor circuitry by a selectable one of (1) zero bit positions and (2) N bit positions toward lesser arithmetic significance.

In a DSP circuit block as recapitulated above the circuitry for routing may include alternative routing circuitry (e.g., SUM_IN/CAR_IN leads) for routing to the first other DSP circuit block signals output by circuitry for routing in the second other DSP circuit block.

In a DSP circuit block as recapitulated above the circuitry for routing may include alternative routing circuitry (e.g., output chaining leads) for routing to the first other DSP circuit block signals indicative of outputs of the second compressor circuitry.

In a DSP circuit block as recapitulated immediately above the alternative routing circuitry may include systolic register circuitry (e.g., 513) that is selectively usable for the signals indicative of outputs of the second compressor circuitry.

In a DSP circuit block as recapitulated above the second multiplier circuit may alternatively perform (1) a 0.5N-bit by M-bit ("0.5N×M") multiplication (e.g., a 9×27 multiplication), and (2) a 0.5N bit by N bit ("0.5N×N") multiplication (e.g., a 9×18 multiplication), where M is equal to 1.5N (e.g., M is 27 when N is 18).

A DSP circuit block as recapitulated immediately above may further include circuitry (e.g., 503) for selectively routing bits of an M-bit multiplicand data word and an M-bit multiplier data word to the first and second multiplier circuits so that the first multiplier circuit can multiply the N most significant bits of the multiplicand data word by the N most significant bits of the multiplier data word to produce a first partial product data word, and so that the second multiplier circuit can multiply (1) the M bits of the multiplicand data word by the 0.5N least significant bits of the multiplier data word to produce a second partial product data word, and (2) the N most significant bits of the multiplier data word by the 0.5N least significant bits of the multiplicand data word to produce a third partial product data word.

In a DSP circuit block as recapitulated immediately above the second multiplier circuit may include third compressor circuitry (e.g., 652) for additively combining the second and third partial product data words, with bits of the third partial product data word being increased in arithmetic significance by 0.5N bit positions relative to bits of the second partial product data word.

In a DSP circuit block as recapitulated above the circuitry for routing may be dedicated to only conveying signals between instances of the DSP circuit block.

In a DSP circuit block as recapitulated above the outputs received from a second other DSP block may be received via circuitry (e.g., SUM_IN/CAR_IN leads) that is dedicated to only conveying signals between instances of the DSP circuit block.

Recapitulating some other aspects of the foregoing, and also in some respects extending what has been said, circuitry (e.g., FIG. 17) that is usable to perform a selectable one of (1) one M-bit by M-bit ("M×M") multiplication (e.g., a 27×27 multiplication) and (2) two N-bit by N-bit ("N×N") multiplications (e.g., two 18×18 multiplications), where M is equal to 1.5N, may include N×N multiplier circuitry (e.g. 506); 0.5N×M multiplier circuitry (e.g., 650a); 0.5N×N multiplier circuitry (e.g., 650b); first circuitry (e.g., 652) for additively combining outputs of the 0.5N×M multiplier circuitry and outputs of the 0.5N×N multiplier circuitry; shifter circuitry (e.g., 507c/507s) for shifting outputs of the N×N multiplier circuitry by a selectable one of (1) zero bits positions and (2) N bit positions toward greater arithmetic significance; and second circuitry (e.g., 508) for additively combining outputs of the shifter circuitry and outputs of the first circuitry.

In circuitry as recapitulated above N may be equal to 18 and M may be equal to 27.

Circuitry as recapitulated above may further include first, second, third, and fourth pluralities of data signal input leads (e.g. any four of d, c, ax, ay, bx, by in FIG. 11); and routing circuitry (e.g., 503) for controllably routing signals from each of the pluralities to selectable ones of inputs to the multiplier circuitries. Each of the pluralities may consist of N data signal input leads.

In circuitry as recapitulated immediately above the routing circuitry may include first, second, third, and fourth N-bit multiplexers (e.g., 630r, 630s, 630u, 630w), each of which is controllable to route N bits from any one of the pluralities to a respective one of (1) multiplicand inputs to the N×N multiplier circuitry, (2) multiplier inputs to the N×N multiplier circuitry; (3) N less significant multiplicand inputs to the 0.5N×M multiplier circuitry, and (4) multiplicand inputs to the 0.5N×N multiplier circuitry; and first, second, and third 0.5N-bit multiplexers (e.g., 630t, 630v, 630x), each of which is controllable to route 0.5N bits from any of at least some of the pluralities to a respective one of (1) 0.5N more significant multiplicand inputs to the 0.5N×M multiplier circuitry, (2) multiplier inputs to the 0.5N×M multiplier circuitry, and (3) multiplier inputs to the 0.5N×N multiplier circuitry.

Recapitulating some still other aspects of the foregoing, and also in some respects extending what has been said, a digital signal processing ("DSP") circuit block (e.g., 500 in FIG. 11; 500b in FIG. 24) may include first means (e.g., 506) for performing a first N-bit by N-bit ("N×N") multiplication (e.g., an 18×18 multiplication); second means (e.g., 505 in FIG. 11; FIG. 17) for performing a selectable one of (1) a second N×N multiplication and (2) a 0.5N-bit by M-bit ("0.5N×M") multiplication and a 0.5N-bit by N-bit ("0.5N× N") multiplication, where M is equal to 1.5N (e.g., M is 27 when N is 18); third means (e.g., 507c/507s) for shifting outputs of the first means by a selectable one of (1) zero bit positions and (2) N bit positions toward greater arithmetic significance; fourth means (e.g., 508) for additively combining outputs of the second and third means; fifth means (e.g., SUM_OUT/CAR_OUT leads) for routing outputs of the fourth means to a first other DSP circuit block (e.g., 500c in FIG. 24); and sixth means (e.g., 510) for additively combining outputs of the fourth means and outputs received from a second other DSP circuit block (e.g., 500a in FIG. 24).

In such a DSP circuit block the second means may include seventh means (e.g., 650a) for performing the 0.5N×M multiplication; eighth means (e.g., 650b) for performing the 0.5N×N multiplication; and ninth means (e.g., 652) for additively combining outputs of the seventh and eighth means, with bits of the outputs of the eighth means being increased in arithmetic significance by 0.5N bit positions relative to bits of the outputs of the seventh means.

A DSP circuit block such as is here being recapitulated may further include tenth means (e.g., 630s) for selectively routing the N most significant bits of an M-bit multiplicand data word to multiplicand inputs to the first means; eleventh means (e.g., 630r) for selectively routing the N most significant bits of an M-bit multiplier data word to multiplier inputs to the first means; twelfth means (e.g., 630v and 630w) for selectively routing the M-bit multiplicand to the multiplicand inputs to the seventh means; thirteenth means (e.g., 630x) for selectively routing the 0.5N least significant bits of the multiplier data word to multiplier inputs to the seventh means; fourteenth means (e.g., 630u) for selectively routing the N most significant bits of the multiplier data word to multiplicand inputs to the eighth means; and fifteenth means (e.g., 630t) for selectively routing the 0.5N least significant bits of the multiplicand data word to the multiplier inputs to the eighth means.

A DSP circuit block such as is here being recapitulated may further include sixteenth means (e.g., ax, ay, bx, and by leads) for receiving multiple pluralities of data input signals for use as inputs to the first and second means; seventeenth means (e.g., 502) for selectively pre-adding at least some of the data input signals; and eighteenth means (e.g., 503) for selectively applying outputs of the seventeenth means to selected inputs to at least one of the first and second means.

A DSP circuit block such as is here being recapitulated may further include nineteenth means (e.g., 504p, 504q) for selectively giving inputs to the second means a systolic register delay.

In a DSP circuit block such as is here being recapitulated the fifth means may include twentieth means (e.g., 509s/509c) for shifting the outputs of the fourth means by a selectable one of (1) zero bit positions and (2) N bit positions toward lesser arithmetic significance.

In a DSP circuit block such as is here being recapitulated the fifth means may include twenty-first means (e.g., 516) for selectively alternatively routing output signals indicative of outputs of the sixth means to the first other DSP circuit block.

In a DSP circuit block such as is here being recapitulated the twenty-first means may include twenty-second means (e.g., 513) for selectively giving the output signals indicative of outputs of the sixth means a systolic register delay.

In a DSP circuit block such as is here being recapitulated the fifth means may include twenty-third means (e.g., SUM_IN/CAR_IN leads) for alternatively routing signals from the second other DSP circuit block to the first other DSP circuit block.

In a DSP circuit block such as is here being recapitulated the sixth means may include twenty-fourth means (e.g., 512) for registering output signals indicative of outputs of the sixth means; and twenty-fifth means (e.g., 514) for applying outputs of the twenty-fourth means to inputs to the sixth means.

It will be understood that the foregoing is only illustrative of the principles of the invention, and that various modifications can be made by those skilled in the art without departing from the scope and spirit of the invention. For example, the use of 18×18 multipliers 200 is only illustrative, and other sizes of multipliers can be used instead, if desired. It will also be understood that the FIGS. herein like FIGS. 1-4, 6, 8, and 10 show electronic circuitry in which most or all of the circuit elements (like 200, 202, 210, 220, 260, etc.) are separate elements (typically integrated together on an integrated circuit), each of which elements is dedicated (e.g., hard-wired to at least a significant extent) to performing the function(s) described for it herein by operating on electrical input signals to produce other electrical output signals. These electrical signals may sometimes be referred to as data, bits, vectors, "1", "0", values, multiplicand, multiplier, product, partial product, sum, or the like; but in all cases they are in fact actual electrical signals representing the specified information. Similarly, certain of the electrical circuit elements shown herein may sometimes be referred to by the operations they perform (e.g., "multiplier 200a"), but in all cases these elements are actual electrical circuitry (e.g., multiplier circuitry) performing those operations. The same is true for references to DSP circuitry, DSP operations, or the like. All such operations are performed by electrical circuitry operating on electrical signals as mentioned above.

In certain of the appended claims, words like first, second, third, fourth, etc., may be used. This is done only to provide unique identifiers for various claim elements and not for any other purpose. For example, these words are not intended to imply anything about how elements are ordered or used. Also, a reference to a higher numbered element (e.g., the "fourth" element) does not by itself imply that all lower numbered elements (e.g., the first through third elements) are also present in a particular claim.

What is claimed is:

1. A digital signal processing ("DSP") circuit block comprising:
   first multiplier circuitry that performs a first multiplication of two inputs each of a first size;
   second multiplier circuitry that performs a selectable one of (1) a second multiplication of two inputs each of the first size and (2) a multiplication of a first input of a second size smaller than the first size by a second input of a third size larger than the first size and a multiplication of a third input of the second size by a fourth input of the first size;

shifting circuitry that shifts outputs of the first multiplier circuitry by a selectable one of (1) zero bit positions and (2) a number of bit positions, equal to the first size, toward greater arithmetic significance;

first addition circuitry that additively combines outputs of the second multiplier circuitry and the shifting circuitry;

first routing circuitry that routes outputs of the first addition circuitry to a first other DSP circuit block; and second addition circuitry that additively combines outputs of the first addition circuitry and outputs received from a second other DSP circuit block.

2. The DSP circuit block defined in claim 1 wherein the second multiplier circuitry comprises:

third multiplier circuitry that performs the multiplication of the first input of the second size by the second input of the third size;

fourth multiplier circuitry that performs the multiplication of the third input of the second size by the fourth input of the first size; and third addition circuitry that additively combines outputs of the third multiplier circuitry and the fourth multiplier circuitry, with bits of the outputs of the fourth multiplier circuitry being increased in arithmetic significance by number of bit positions equal to the second size relative to bits of the outputs of the third multiplier circuitry.

3. The DSP circuit block defined in claim 2 further comprising:

second routing circuitry that selectively routes a number, equal to the first size, of the most significant bits of a multiplicand data word of the third size to multiplicand inputs to the first multiplier circuitry;

third routing circuitry that selectively routes a number, equal to the first size, of the most significant bits of a multiplier data word of the third size to multiplier inputs to the first multiplier circuitry;

fourth routing circuitry that selectively routes the multiplicand of the third size to the multiplicand inputs to the third multiplier circuitry;

fifth routing circuitry that selectively routes a number, equal to the second size, of the least significant bits of the multiplier data word to multiplier inputs to the third multiplier circuitry;

sixth routing circuitry that selectively routes a number, equal to the first size, of the most significant bits of the multiplier data word to multiplicand inputs to the fourth multiplier circuitry; and sixth routing circuitry that selectively routes a number, equal to the second size, of the least significant bits of the multiplicand data word to the multiplier inputs to the fourth multiplier circuitry.

4. The DSP circuit block defined in claim 1 further comprising:

respective groups of multiple conductors for respectively receiving respective multiple pluralities of data input signals for use as inputs to the first multiplier circuitry and the second multiplier circuitry;

pre-adder circuitry that selectively pre-adds at least some of the data input signals; and selection circuitry that selectively applies outputs of the pre-adder circuitry to selected inputs to at least one of the first multiplier circuitry and the second multiplier circuitry.

5. The DSP circuit block defined in claim 1 further comprising:

selectively usable systolic register circuitry in input data signal paths of the second multiplier circuitry for selectively giving inputs to the second multiplier circuitry a systolic register delay.

6. The DSP circuit block defined in claim 1 wherein the first routing circuitry comprises:

first shifting circuitry that shifts the outputs of the first addition circuitry by a selectable one of (1) zero bit positions and (2) a number, equal to the first size, of bit positions toward lesser arithmetic significance.

7. The DSP circuit block defined in claim 1 wherein the first routing circuitry comprises:

seventh routing circuitry that selectively alternatively routes output signals indicative of outputs of the second addition circuitry to the first other DSP circuit block.

8. The DSP circuit block defined in claim 7 wherein the seventh routing circuitry comprises:

selectively usable systolic register circuitry that selectively gives the output signals indicative of outputs of the second addition circuitry a systolic register delay.

9. The DSP circuit block defined in claim 1 wherein the first routing circuitry comprises:

eighth routing circuitry that alternatively routes signals from the second other DSP circuit block to the first other DSP circuit block.

10. The DSP circuit block defined in claim 1 wherein the second addition circuitry comprises:

registers for output signals indicative of outputs of the second addition circuitry; and ninth routing circuitry for applying outputs of the registers to inputs to the second addition circuitry.

* * * * *